(12) United States Patent
Rofougaran et al.

(10) Patent No.: US 8,325,865 B1
(45) Date of Patent: Dec. 4, 2012

(54) DISCRETE DIGITAL RECEIVER

(75) Inventors: Ahmadreza (Reza) Rofougaran, Newport Coast, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/240,639

(22) Filed: Sep. 22, 2011

Related U.S. Application Data

(60) Provisional application No. 61/513,627, filed on Jul. 31, 2011.

(51) Int. Cl.
*H04B 1/10* (2006.01)
*H04L 27/14* (2006.01)

(52) U.S. Cl. ........................................ 375/350; 375/316

(58) Field of Classification Search .................. 375/259, 375/260, 267, 295, 297, 299, 300, 316, 320, 375/326, 327, 340, 344, 346, 347, 350, 355; 455/39, 42, 43, 91, 107, 108, 112, 130, 132, 455/205, 208, 227, 230, 260–262
See application file for complete search history.

(56) References Cited

U.S. PATENT DOCUMENTS

| | | | |
|---|---|---|---|
| 6,456,950 B1 * | 9/2002 | El-Ghoroury et al. | 702/75 |
| 6,584,305 B1 * | 6/2003 | Ohta et al. | 455/307 |
| 6,748,025 B1 * | 6/2004 | Hickling | 375/316 |
| 6,987,953 B2 * | 1/2006 | Morris et al. | 455/102 |
| 2004/0228424 A1 * | 11/2004 | Baldwin et al. | 375/343 |
| 2008/0225182 A1 * | 9/2008 | Silver et al. | 348/726 |

* cited by examiner

*Primary Examiner* — Young T. Tse
(74) *Attorney, Agent, or Firm* — Garlick & Markison

(57) ABSTRACT

A receiver includes a bandpass filter module, a sample and hold module, a discrete time filter module, and a conversion module. The bandpass filter module is operable to filter an inbound wireless signal to produce a filtered inbound wireless signal having a bandwidth. The sample and hold module is operable to sample and hold, at a rate corresponding to a multiple of the bandwidth of the filtered inbound wireless signal, the filtered inbound wireless signal to produce a frequency domain sample pulse train. The discrete time filter module is operable to filter the frequency domain sample pulse train to produce a filtered sample pulse. The conversion module is operable to convert the filtered sample pulse into an inbound baseband signal.

18 Claims, 64 Drawing Sheets

MIMO transceiver 36 multiple frequency band transceiver 38

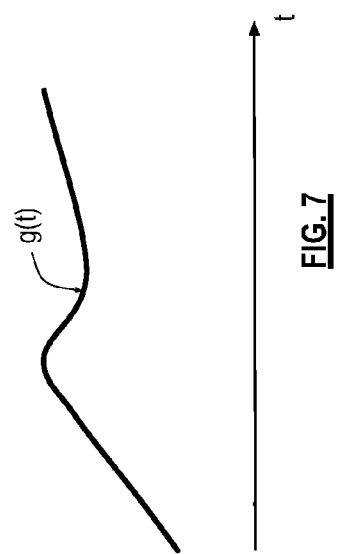
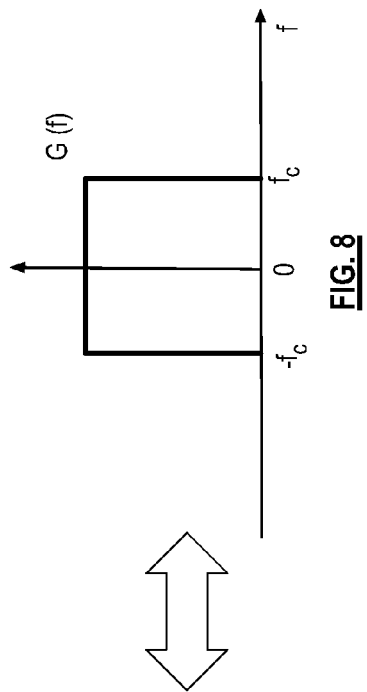
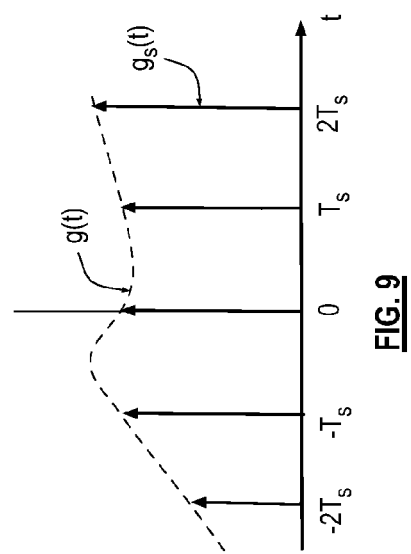
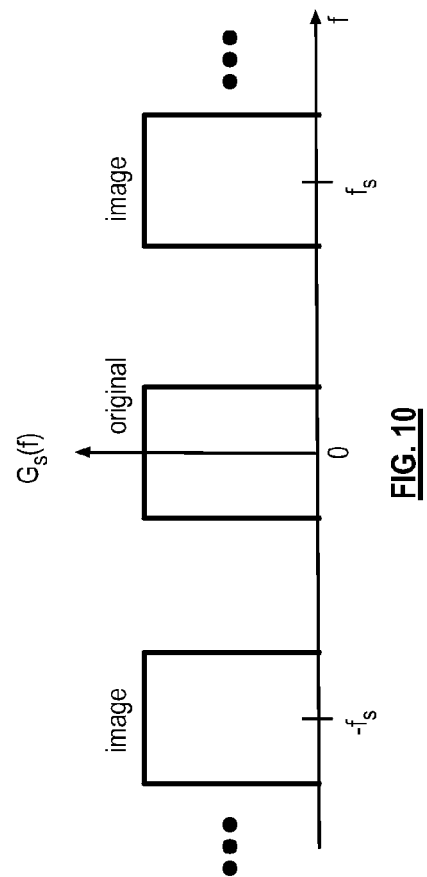

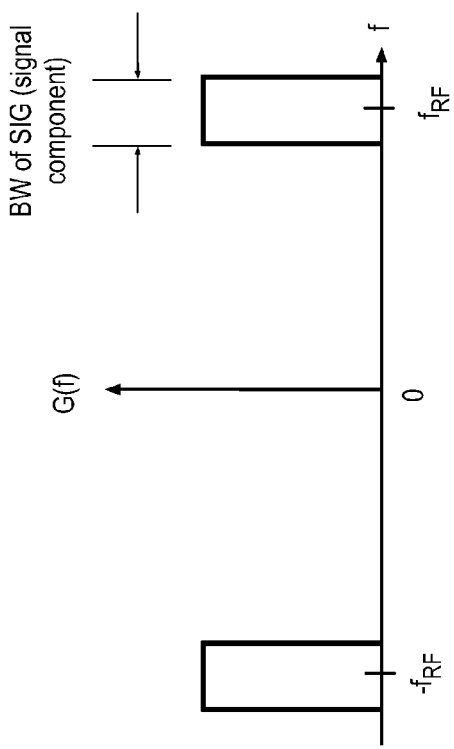
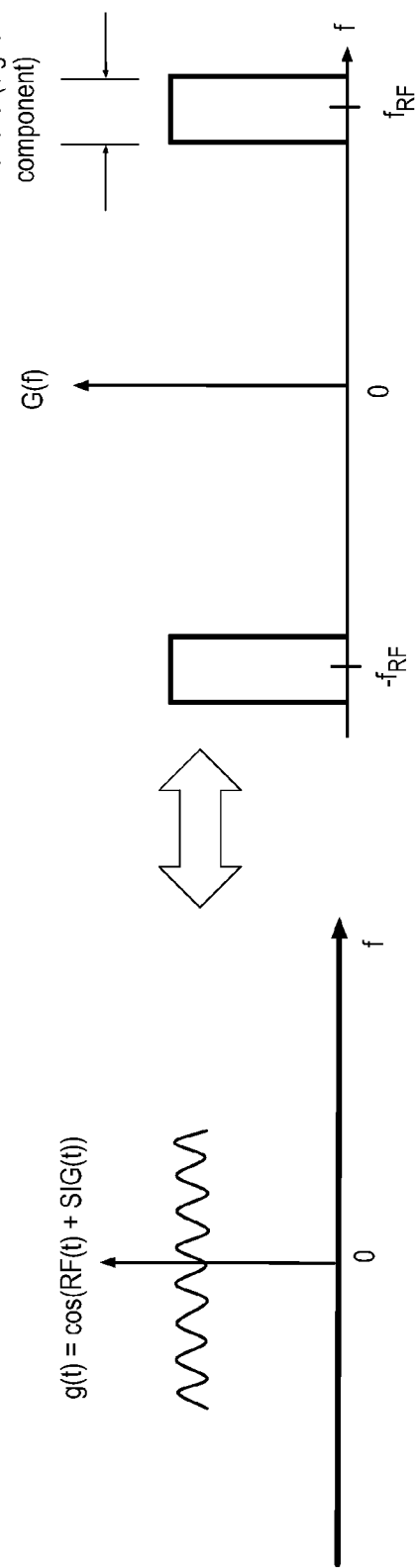
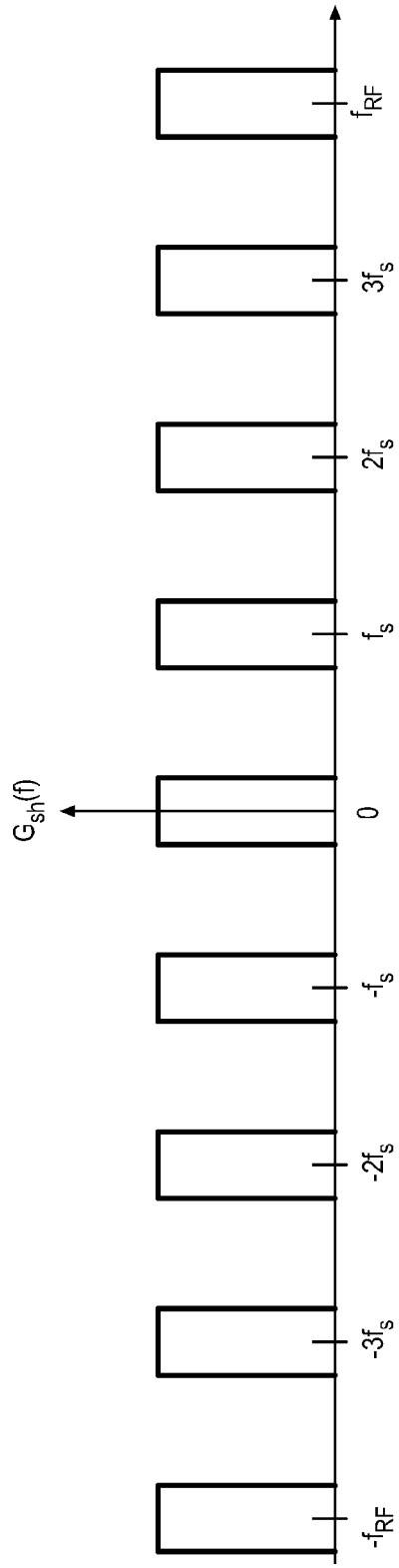

sample & hold circuit 44 sample & hold circuit 44 embodiment of Z 66 and 72 embodiment of Z 66 sample & hold circuit 44 sample & hold circuit 44

Z circuit 82 and 86

Z circuit 82

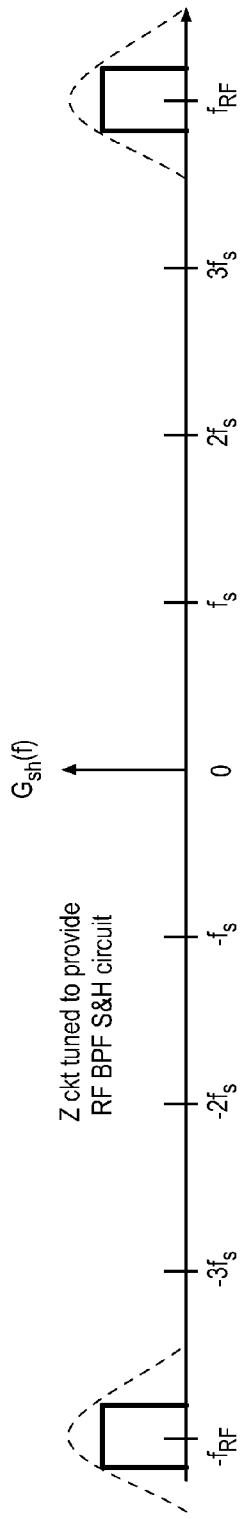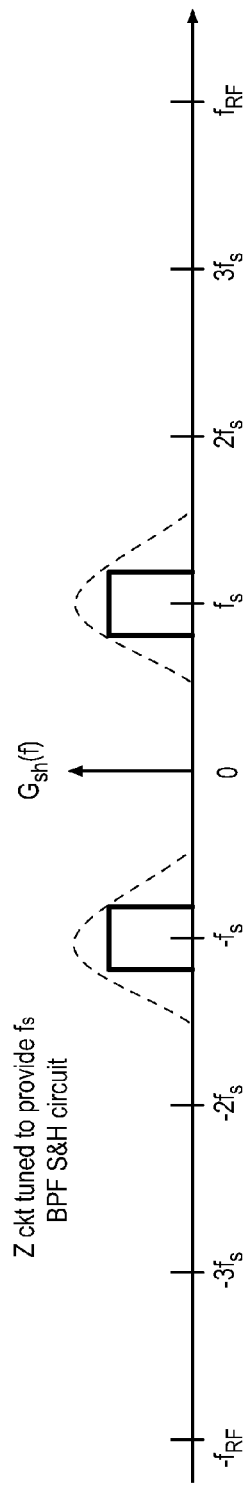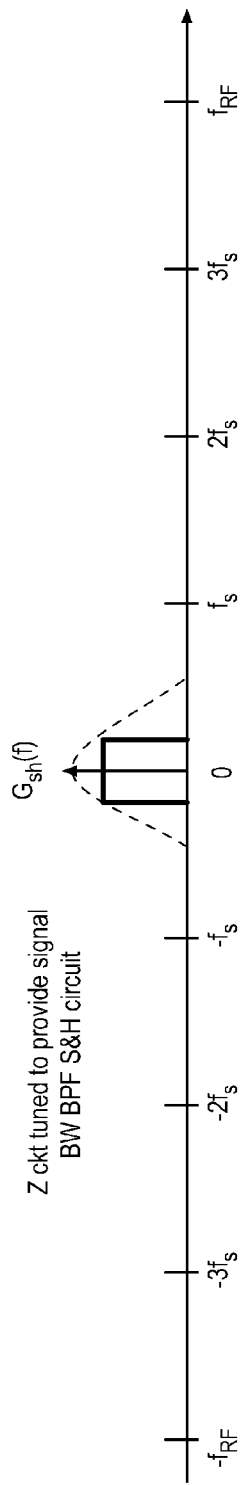

S&H clock generator 92

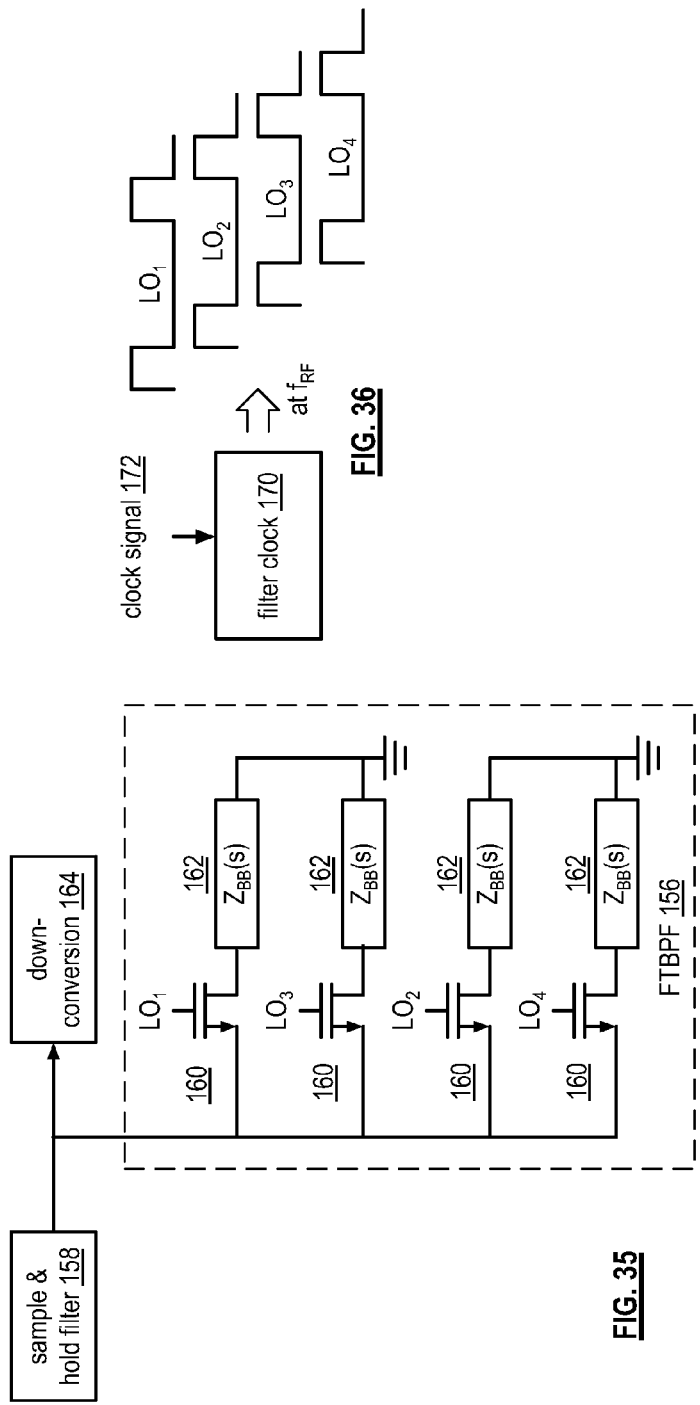
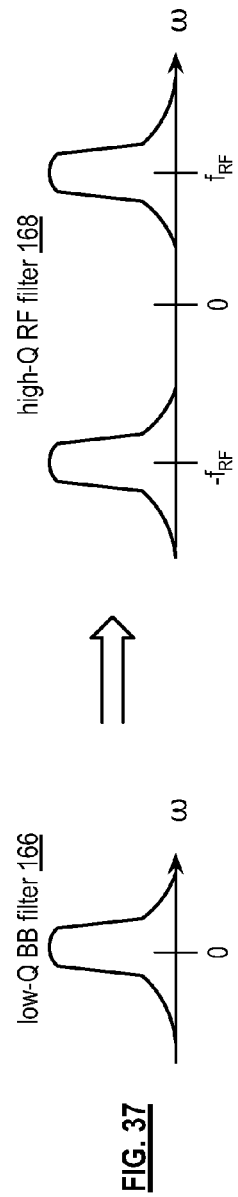
FIG. 35
FIG. 36
FIG. 37

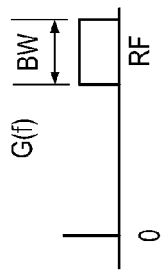
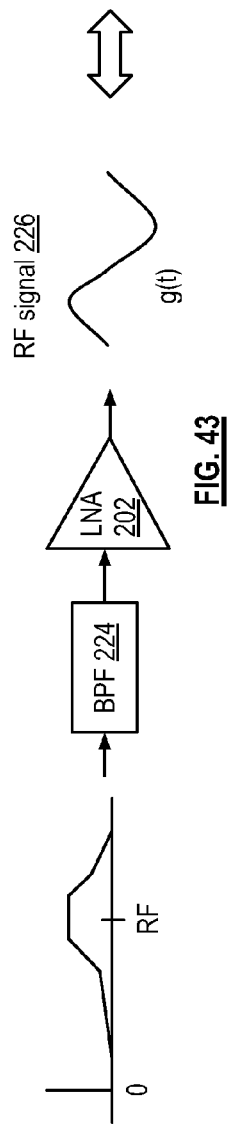
FIG. 43
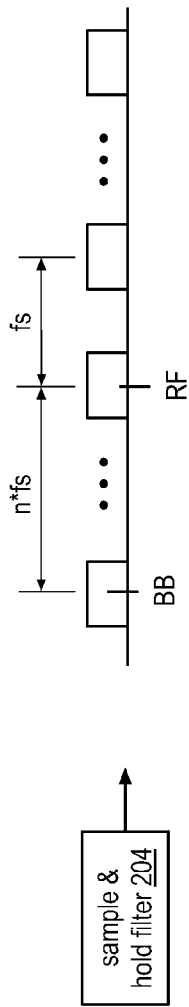
FIG. 44
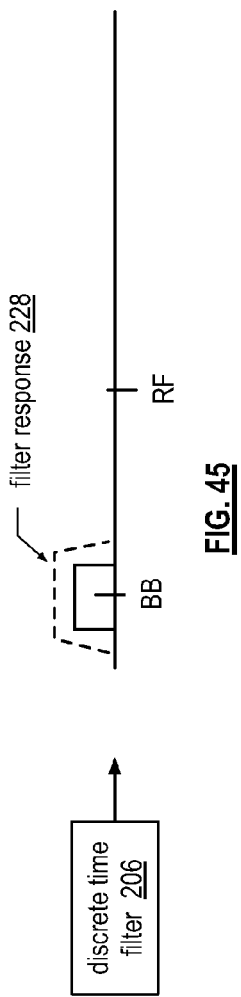
FIG. 45

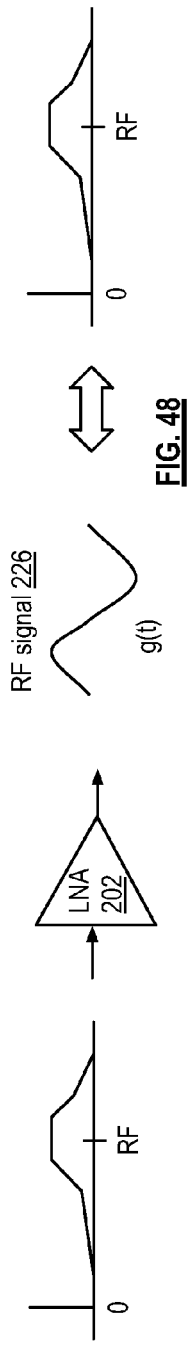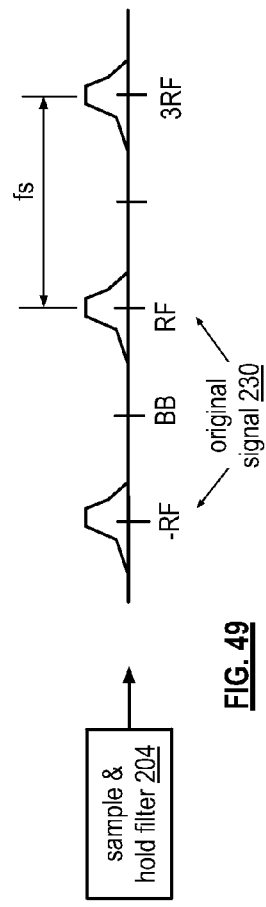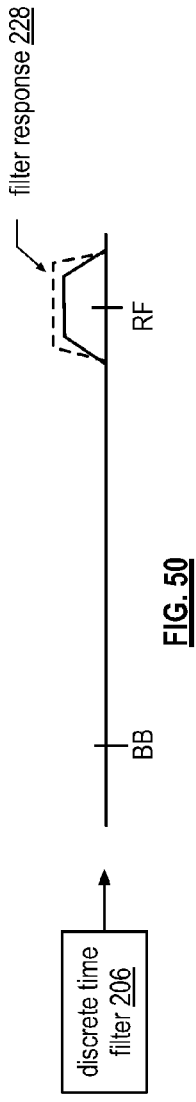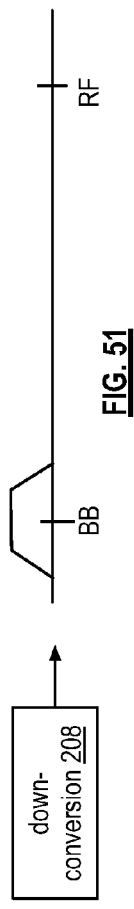

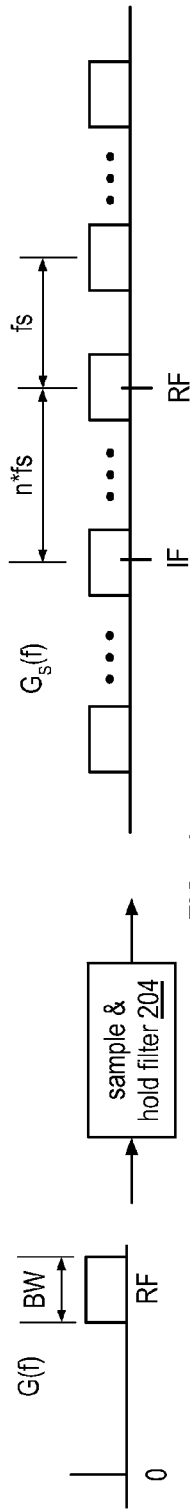
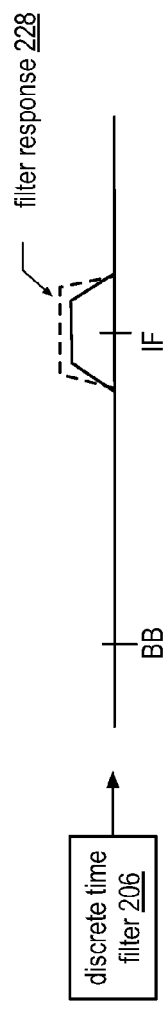
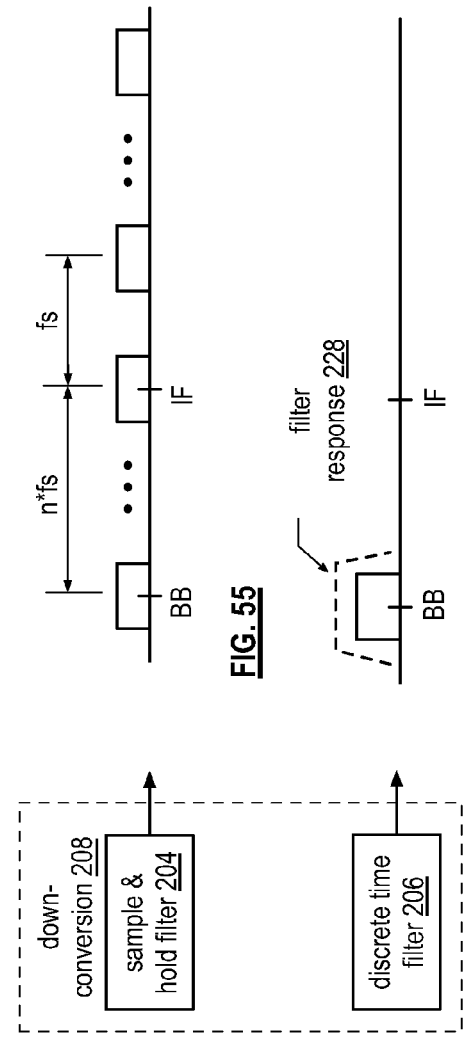
FIG. 53
FIG. 54
FIG. 55
FIG. 56

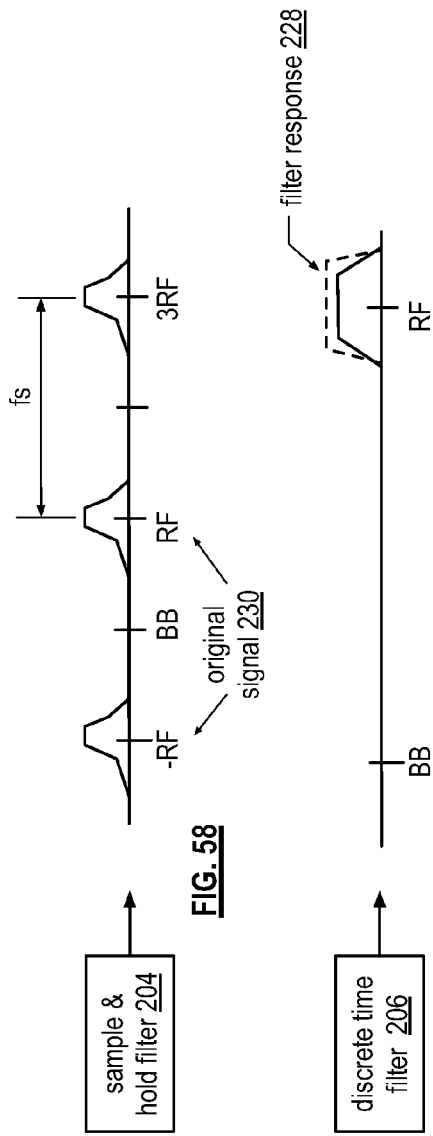
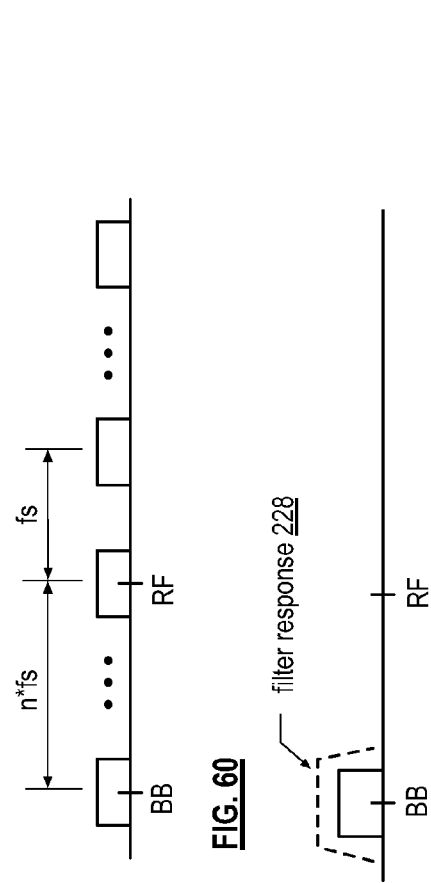
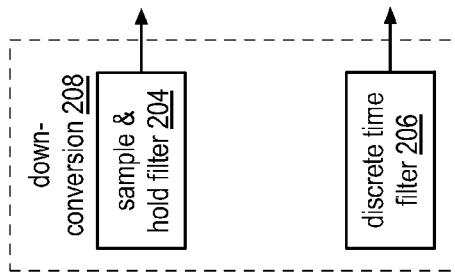

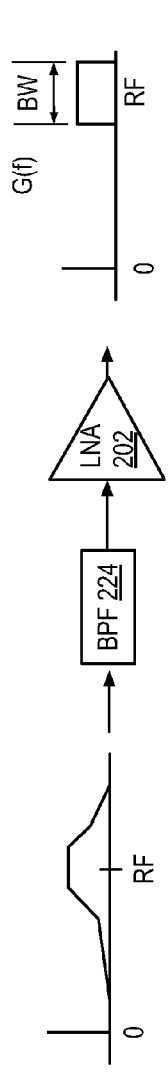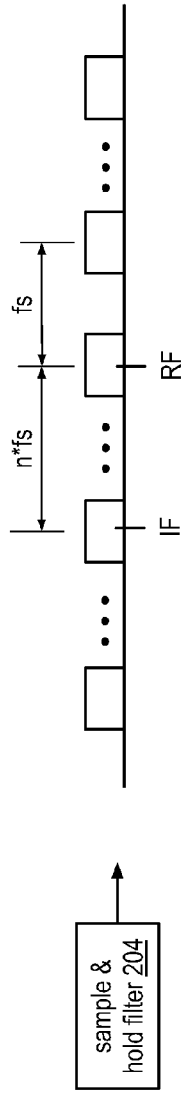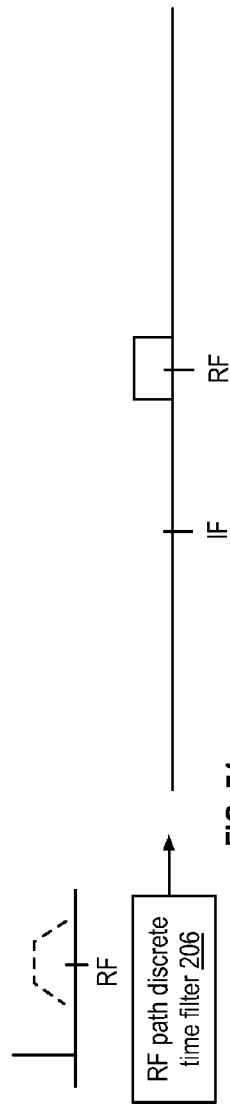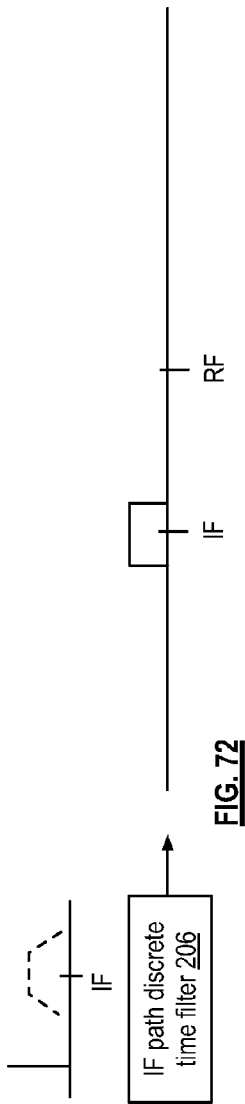

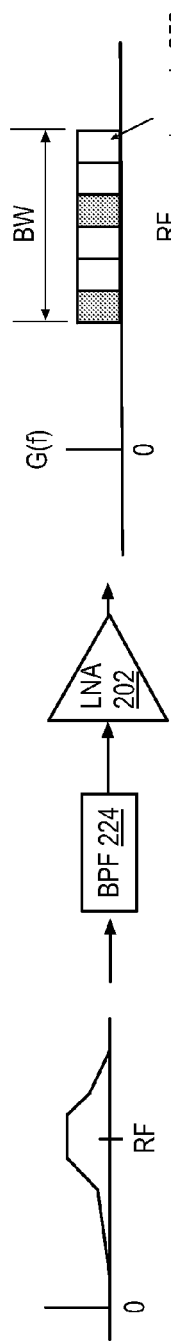
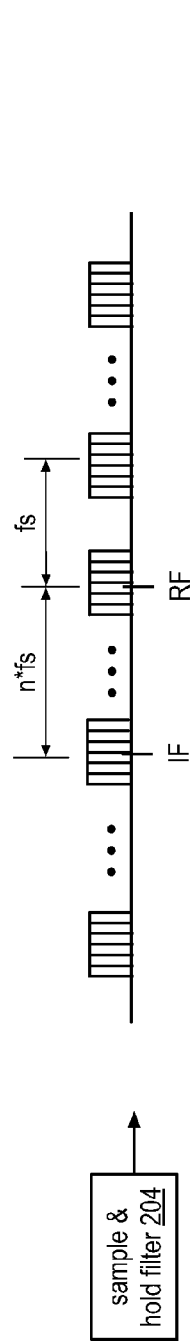
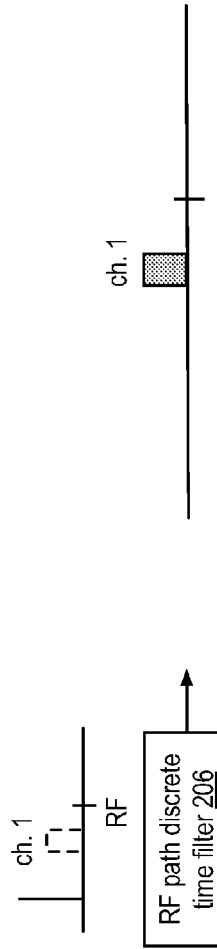
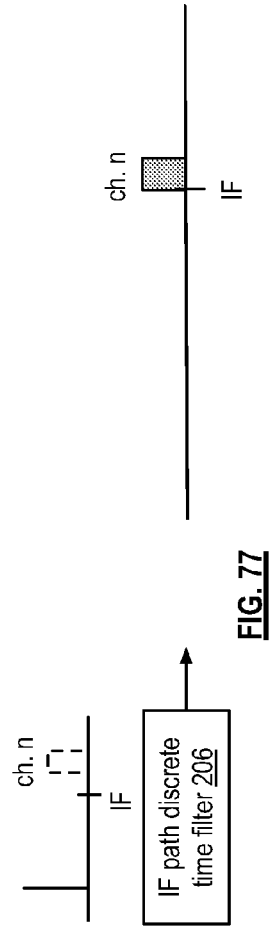
FIG. 74
FIG. 75
FIG. 76
FIG. 77 selectable front-end section 322

TX process 352

RX process 362

RX process with
sample buffering 366

RX process with
error processing 370 receiver 390

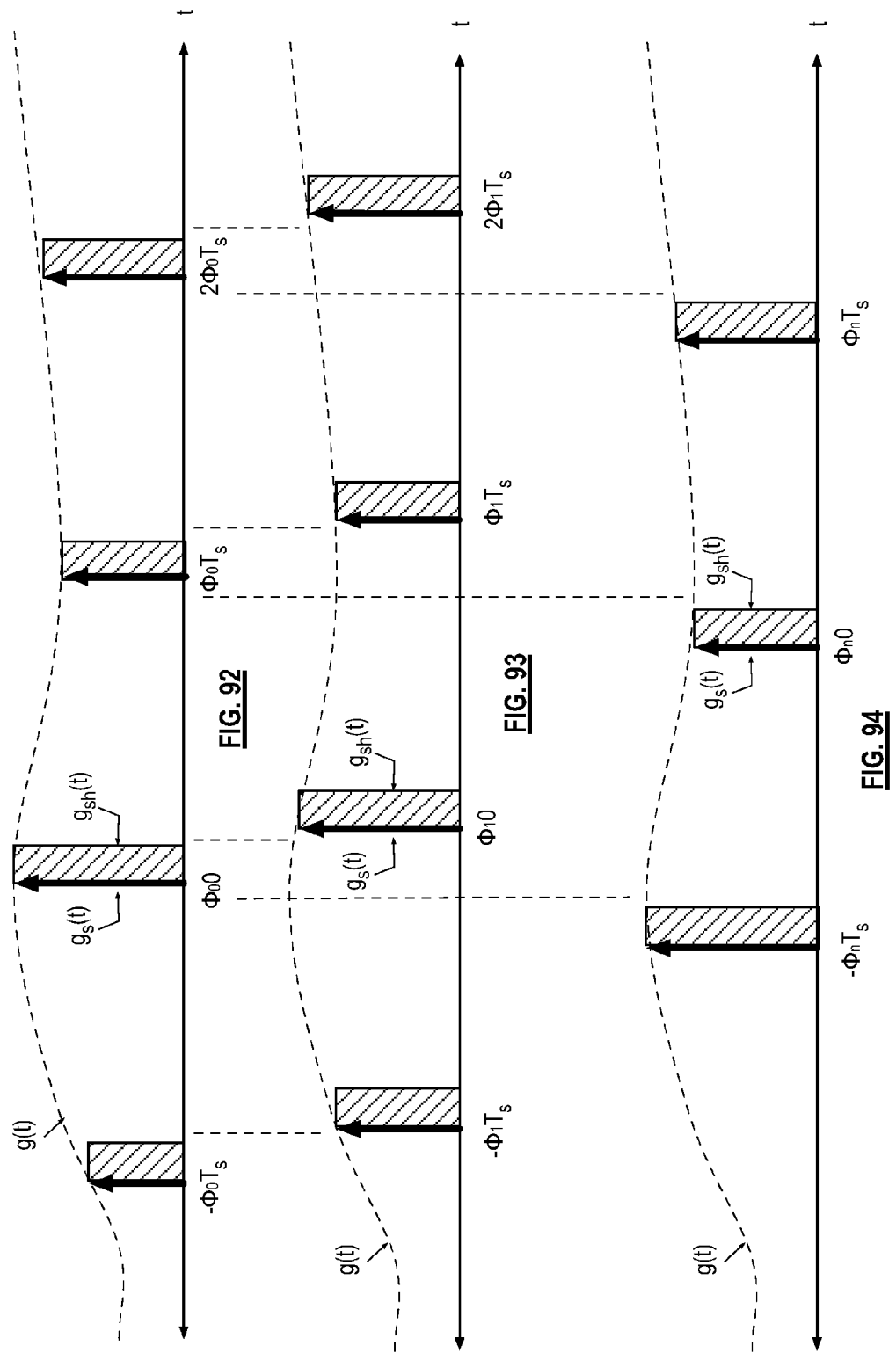

receiver 390 shared multi-standard receiver 398

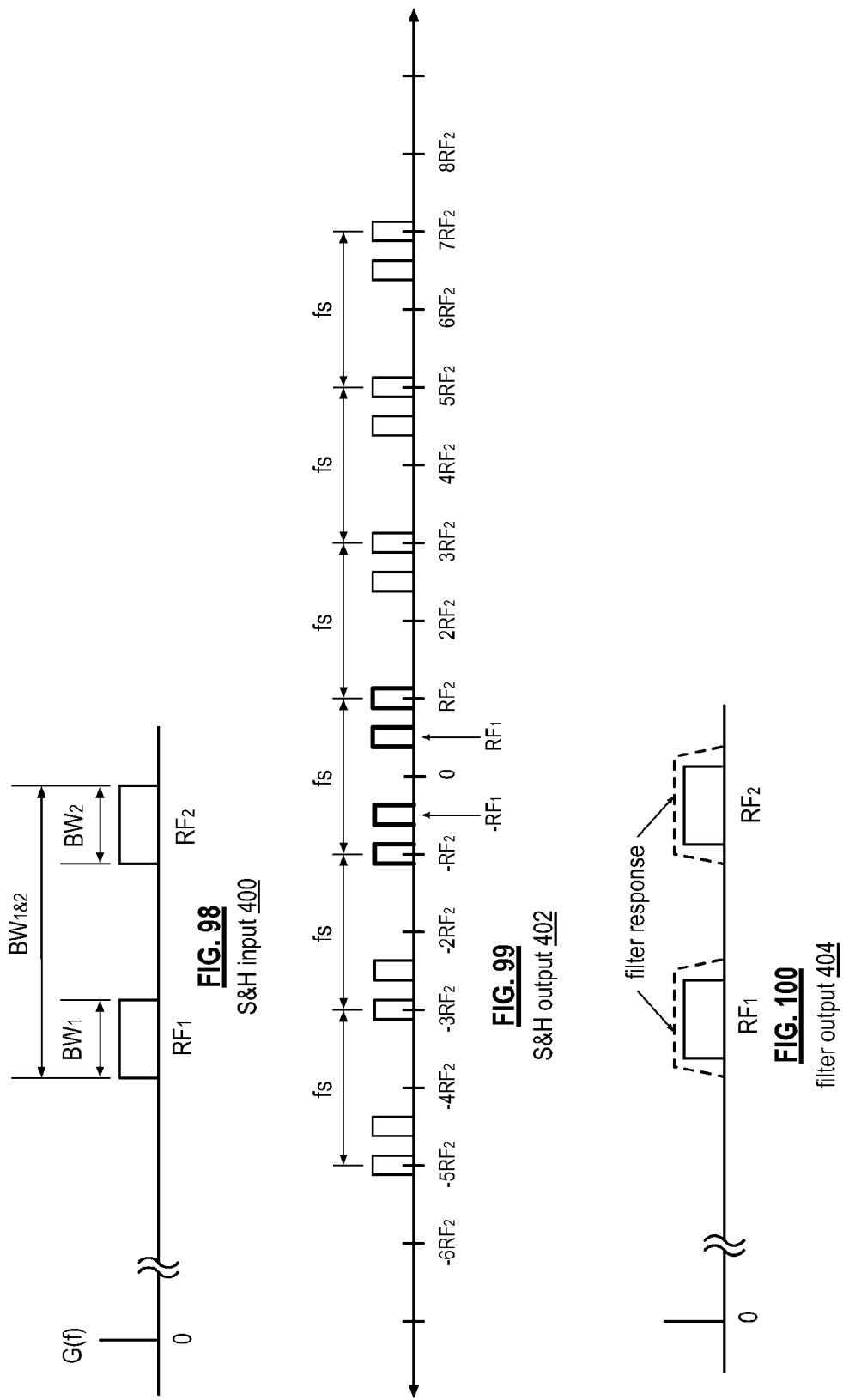

shared multi-standard receiver 398

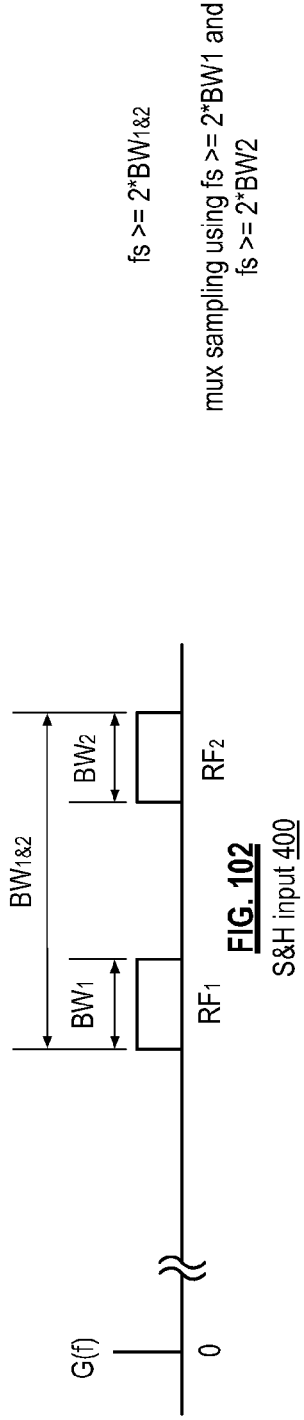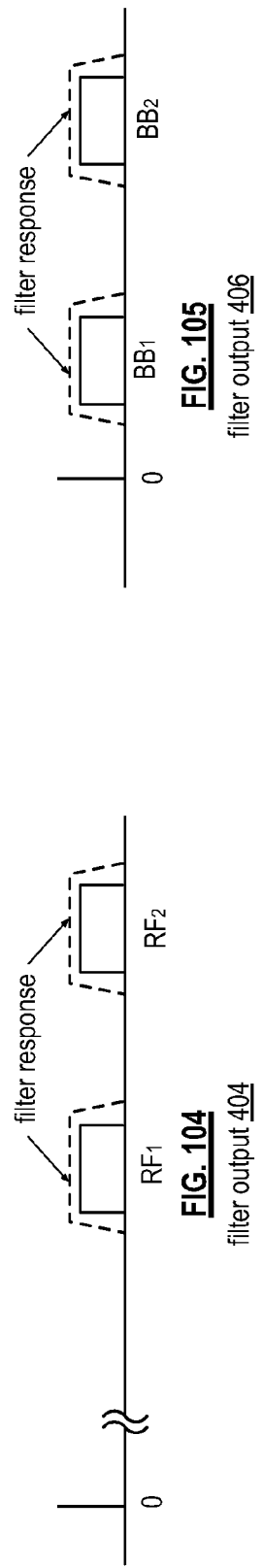

S&H input 408

S&H output 1 410

S&H output 2 412 sample & hold circuit 204 sample & hold circuit 204 sample & hold circuit 204

MIMO receiver 422

S&H input 424

S&H output 1 426

S&H output n 428 transmitter 430

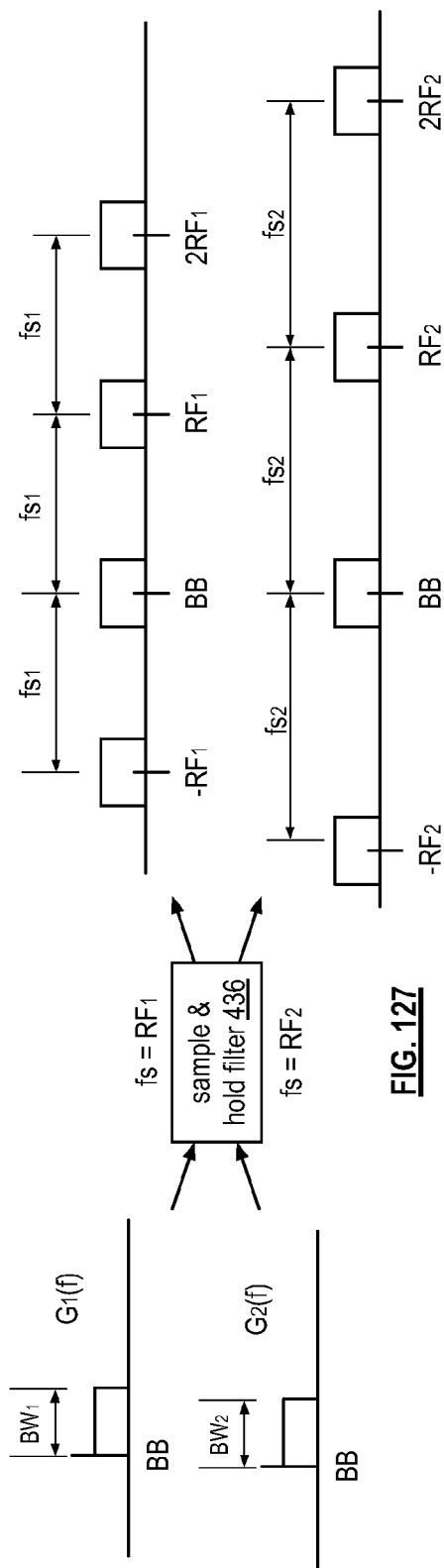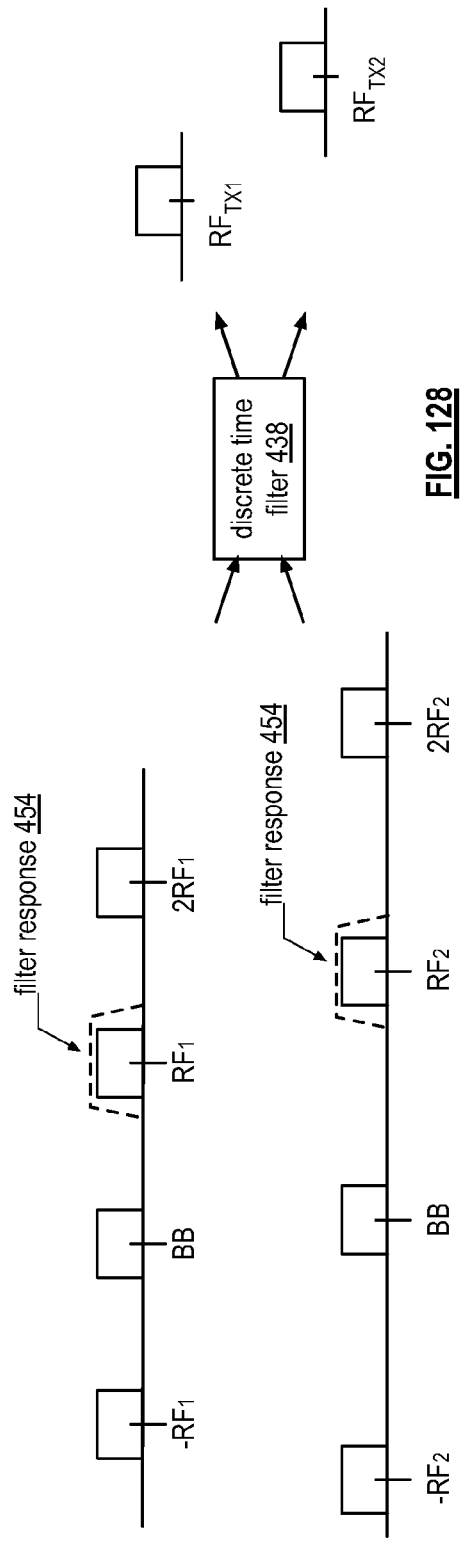

DISCRETE DIGITAL RECEIVER

CROSS REFERENCE TO RELATED PATENTS

This patent application is claiming priority under 35 USC §119(e) to a provisionally filed patent application entitled Discrete Digital RF Transceiver, having a provisional filing date of Jul. 31, 2011, and a provisional Ser. No. 61/513,627, which is incorporated by reference herein.

STATEMENT REGARDING FEDERALLY SPONSORED RESEARCH OR DEVELOPMENT

NOT APPLICABLE

INCORPORATION-BY-REFERENCE OF MATERIAL SUBMITTED ON A COMPACT DISC

NOT APPLICABLE

BACKGROUND OF THE INVENTION

1. Technical Field of the Invention

This invention relates generally to wireless communication systems and more particularly to wireless communication devices.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), Enhanced Data rates for GSM Evolution (EDGE), General Packet Radio Service (GPRS), WCDMA, LTE (Long Term Evolution), WiMAX (worldwide interoperability for microwave access), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to an antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers data from the filtered signals in accordance with the particular wireless communication standard.

As is also known, the transmitter includes a data modulation stage, one or more intermediate frequency stages, and a power amplifier. The data modulation stage converts data into baseband signals in accordance with a particular wireless communication standard. The one or more intermediate frequency stages mix the baseband signals with one or more local oscillations to produce RF signals. The power amplifier amplifies the RF signals prior to transmission via an antenna.

To implement a radio transceiver, a wireless communication device includes a plurality of integrated circuits (ICs) and a plurality of discrete components. For example, a wireless communication device that supports 2G and 3G cellular telephone protocols includes a baseband processing IC, a power management IC, a radio transceiver IC, a transmit/receive (T/R) switch, an antenna, and a plurality of discrete components. The discrete components include surface acoustic wave (SAW) filters, power amplifiers, duplexers, inductors, and capacitors. Such discrete components add several dollars (US) to the bill of material for the wireless communication device, but are necessary to achieve the strict performance requirements of the 2G and 3G protocols.

As integrated circuit fabrication technology evolves, wireless communication device manufacturers require that wireless transceiver IC manufacturers update their ICs in accordance with the advancements in IC fabrication. For example, as the fabrication process changes (e.g., uses smaller transistor sizes), the wireless transceiver ICs are redesigned for the newer fabrication process. Redesigning the digital portions of the ICs is a relatively straightforward process since most digital circuitry "shrinks" with the IC fabrication process. Redesigning the analog portions, however, is not a straightforward task since most analog circuitry (e.g., inductors, capacitors, etc.) does not "shrink" with the IC process. As such, wireless transceiver IC manufacturers invest significant effort to produce ICs of newer IC fabrication processes.

BRIEF DESCRIPTION OF THE SEVERAL VIEWS OF THE DRAWING(S)

FIG. 7 is a diagram of an example of an input signal, in the time domain, of a sample and hold filter circuit in accordance with the present invention;

FIG. 8 is a diagram of an example of the inbound signal, in the frequency domain, of the sample and hold filter circuit in accordance with the present invention;

FIG. 9 is a diagram of an example of sampling the inbound signal, in the time domain, at a given sampling period ($T_s$) in accordance with the present invention;

FIG. 10 is a diagram of an example of a sampled inbound signal, in the frequency domain, at a sampling frequency ($f_s$) in accordance with the present invention;

FIG. 13 is a diagram of an example of the inbound RF signal, in the frequency domain, of the receiver of FIG. 4 in accordance with the present invention;

FIG. 14 is a diagram of an example of the inbound RF signal, in the frequency domain, of the sample and hold filter circuit in accordance with the present invention;

FIG. 15 is a diagram of an example of a sampled inbound RF signal, in the frequency domain, at a sampling frequency ($f_s$) in accordance with the present invention;

FIG. 27 is a diagram of another example of bandpass filtering of the sampling and hold filter circuit with an RF tuned impedance circuit in accordance with the present invention;

FIG. 28 is a diagram of another example of bandpass filtering of the sampling and hold filter circuit with an $f_s$ tuned impedance circuit in accordance with the present invention;

FIG. 29 is a diagram of another example of bandpass filtering of the sampling and hold filter circuit with a baseband tuned impedance circuit in accordance with the present invention;

FIG. 35 is a schematic block diagram of an embodiment of a frequency translation band pass filter (FTBPF) in accordance with the present invention;

FIG. 36 is a schematic block diagram of an embodiment of a filter clock generating circuit in accordance with the present invention;

FIG. 37 is a diagram of an example of frequency translation of a band pass filter in accordance with the present invention;

FIG. 43 is a diagram of an example of a time domain and a frequency domain representation of an output of the LNA of the receiver of FIG. 42 in accordance with the present invention;

FIG. 44 is a diagram of an example of a frequency domain representation of an output of the sample and hold filter circuit of the receiver of FIG. 42 in accordance with the present invention;

FIG. 45 is a diagram of an example of a frequency domain representation of an output of the discrete time filter of the receiver of FIG. 42 in accordance with the present invention;

FIG. 48 is a diagram of an example of a time domain and a frequency domain representation of an output of the LNA of the receiver of FIG. 47 in accordance with the present invention;

FIG. 49 is a diagram of an example of a frequency domain representation of an output of the sample and hold filter circuit of the receiver of FIG. 47 in accordance with the present invention;

FIG. 50 is a diagram of an example of a frequency domain representation of an output of the discrete time filter of the receiver of FIG. 47 in accordance with the present invention;

FIG. 51 is a diagram of an example of a frequency domain representation of an output of the down conversion module of the receiver of FIG. 47 in accordance with the present invention;

FIG. 53 is a diagram of an example of a frequency domain representation of an output of the sample and hold filter circuit of the receiver of FIG. 52 in accordance with the present invention;

FIG. 54 is a diagram of an example of a frequency domain representation of an output of the discrete time filter of the receiver of FIG. 52 in accordance with the present invention;

FIG. 55 is a diagram of an example of a frequency domain representation of an output of a sample and hold circuit of a down conversion module of the receiver of FIG. 52 in accordance with the present invention;

FIG. 56 is a diagram of an example of a frequency domain representation of an output of a discrete time filter circuit of the down conversion module of the receiver of FIG. 52 in accordance with the present invention;

FIG. 58 is a diagram of an example of a frequency domain representation of an output of the sample and hold filter circuit of the receiver of FIG. 57 in accordance with the present invention;

FIG. 59 is a diagram of an example of a frequency domain representation of an output of the discrete time filter of the receiver of FIG. 57 in accordance with the present invention;

FIG. 60 is a diagram of an example of a frequency domain representation of an output of a sample and hold circuit of a down conversion module of the receiver of FIG. 57 in accordance with the present invention;

FIG. 61 is a diagram of an example of a frequency domain representation of an output of a discrete time filter circuit of the down conversion module of the receiver of FIG. 57 in accordance with the present invention;

FIG. 69 is a diagram of an example of a frequency domain representation of an output of the LNA of the receiver of FIG. 68 in accordance with the present invention;

FIG. 70 is a diagram of an example of a frequency domain representation of an output of the sample and hold filter circuit of the receiver of FIG. 68 in accordance with the present invention;

FIG. 71 is a diagram of an example of a frequency domain representation of an output of an RF path discrete time filter of the receiver of FIG. 68 in accordance with the present invention;

FIG. 72 is a diagram of an example of a frequency domain representation of an output of an IF path discrete time filter of the receiver of FIG. 68 in accordance with the present invention;

FIG. 74 is a diagram of an example of a frequency domain representation of an output of the LNA of the receiver of FIG. 68 in accordance with the present invention;

FIG. 75 is a diagram of an example of a frequency domain representation of an output of the sample and hold filter circuit of the receiver of FIG. 68 in accordance with the present invention;

FIG. 76 is a diagram of an example of a frequency domain representation of an output of an RF path discrete time filter of the receiver of FIG. 68 in accordance with the present invention;

FIG. 77 is a diagram of an example of a frequency domain representation of an output of an IF path discrete time filter of the receiver of FIG. 68 in accordance with the present invention;

FIG. 92 is a diagram of an example of sampling and holding an inbound signal, in the time domain, at a given sampling period ($T_s$), a holding period ($T_h$), and given phase of the clock signal in accordance with the present invention;

FIG. 93 is a diagram of another example of sampling and holding an inbound signal, in the time domain, at a given sampling period ($T_s$), a holding period ($T_h$), and another phase of the clock signal in accordance with the present invention;

FIG. 94 is a diagram of another example of sampling and holding an inbound signal, in the time domain, at a given sampling period ($T_s$), a holding period ($T_h$), and another phase of the clock signal in accordance with the present invention;

FIG. 98 is a diagram of an example of a frequency domain representation of an input of the sample and hold filter circuit of the receiver of FIG. 97 in accordance with the present invention;

FIG. 99 is a diagram of an example of a frequency domain representation of an output of the sample and hold filter circuit of the receiver of FIG. 97 in accordance with the present invention;

FIG. 100 is a diagram of an example of a frequency domain representation of an output of a discrete time filter of the receiver of FIG. 97 in accordance with the present invention;

FIG. 102 is a diagram of an example of a frequency domain representation of an input of the sample and hold filter circuit of the receiver of FIG. 101 in accordance with the present invention;

FIG. 103 is a diagram of an example of a frequency domain representation of an output of the sample and hold filter circuit of the receiver of FIG. 101 in accordance with the present invention;

FIG. 104 is a diagram of an example of a frequency domain representation of an output of a discrete time filter of the receiver of FIG. 101 in accordance with the present invention;

FIG. 105 is a diagram of an example of a frequency domain representation of another output of a discrete time filter of the receiver of FIG. 101 in accordance with the present invention;

FIG. 127 is a diagram of another example of a frequency domain representation of an input and an output of the sample and hold filter circuit of the transmitter of FIG. 124 in accordance with the present invention;

FIG. 128 is a diagram of another example of a frequency domain representation of an input and an output of a discrete time filter of the transmitter of FIG. 124 in accordance with the present invention.

DETAILED DESCRIPTION OF THE INVENTION

Figure 1:
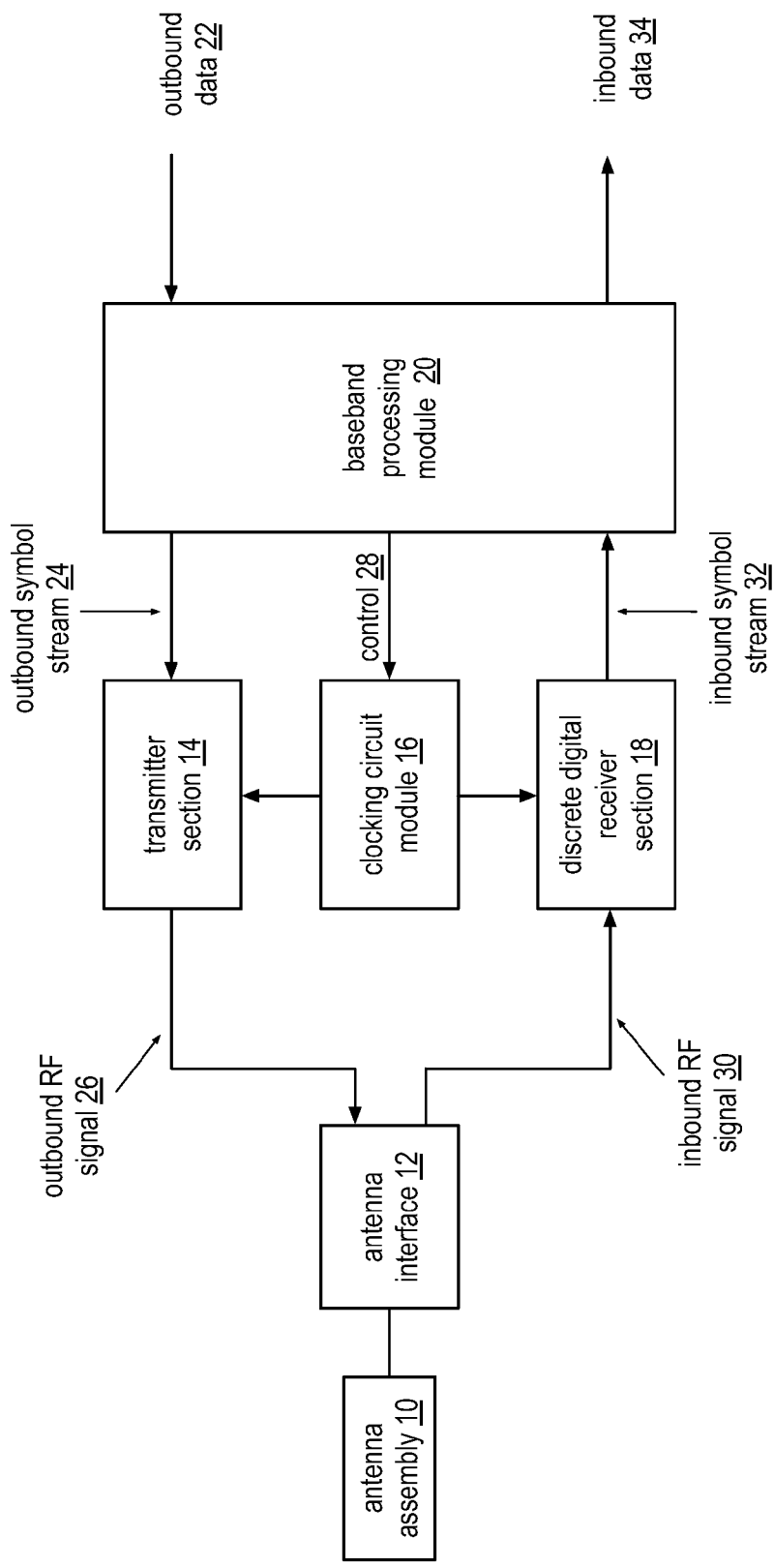
FIG. 1 is a schematic block diagram of an embodiment of a wireless transceiver in accordance with the present invention.

FIG. 1 is a schematic block diagram of an embodiment of a wireless transceiver that includes an antenna assembly 10, an antenna interface 12, a transmitter section 14, a clocking circuit module 16, a discrete digital receiver section 18, and a baseband processing module 20. The antenna assembly 10 may include one or more antennas, one or more antenna arrays, a diversity antenna structure, one or more separate transmit antennas, one or more separate receive antennas, and/or a combination thereof. The antenna interface 12 includes one or more antenna tuning units, one or more transmission lines, one or more impedance matching circuits, one or more transformer baluns, one or more transmit-receive switches, one or more transmit-receive isolation modules, etc. The wireless transceiver may further include a power management module (not shown).

The wireless transceiver may be included within a portable computing communication device, which may be any device that can be carried by a person, can be at least partially powered by a battery, and/or performs one or more software applications. For example, the portable computing communication device may be a cellular telephone, a laptop computer, a personal digital assistant, a video game console, a video game player, a personal entertainment unit, a tablet computer, etc. Note that the wireless radio transceiver may operate in the radio frequency (RF) frequency spectrum and/or the millimeter wave (MMW)) frequency spectrum.

In an example of operation, the baseband processing module 20 performs one or more functions of the portable computing communication device that require wireless transmission of data. In this instance, the baseband processing module 20 receives or generates outbound data 22 (e.g., voice, text, audio, video, graphics, etc.) and converts it into one or more outbound symbol streams 24 in accordance with one or more wireless communication standards (e.g., GSM, CDMA, WCDMA, HSUPA, HSDPA, WiMAX, EDGE, GPRS, IEEE 802.11, Bluetooth, ZigBee, universal mobile telecommunications system (UMTS), long term evolution (LTE), IEEE 802.16, evolution data optimized (EV-DO), etc.). Such a conversion includes one or more of: scrambling, puncturing, encoding, interleaving, constellation mapping, modulation, frequency spreading, frequency hopping, beamforming, space-time-block encoding, space-frequency-block encoding, frequency to time domain conversion, and/or digital baseband to intermediate frequency conversion. Note that the baseband processing module 20 converts the outbound data 22 into a single outbound symbol stream 24 for Single Input Single Output (SISO) communications and/or for Multiple Input Single Output (MISO) communications and converts the outbound data 22 into multiple outbound symbol streams 24 for Single Input Multiple Output (SIMO) and Multiple Input Multiple Output (MIMO) communications (which will be described further with reference to FIG. 2).

The baseband processing module 20 provides the one or more outbound symbol streams 22 to the transmitter section, which converts the outbound symbol stream(s) 24 into one or more outbound RF signals 26 (e.g., signals in one or more frequency bands 800 MHz, 1800 MHz, 1900 MHz, 2000 MHz, 2.4 GHz, 5 GHz, 60 GHz, etc.). The transmitter section 14 may be implemented using a discrete digital topology (as will be discussed in greater detail with reference to one or more of FIGS. 115-129) or implemented using analog circuitry (e.g., an up-conversion module, analog baseband and/or RF filtering, a power amplifier, etc.). Regardless of the specific implementation, the transmitter section 14 may have a direct conversion topology (e.g., direct conversion of baseband or near baseband symbol streams to RF signals) or a super heterodyne topology (e.g., convert baseband or near baseband symbol streams into intermediate frequency (IF) signals and then convert the IF signals into RF signals).

For a direction conversion, the transmitter section 14 may have a Cartesian-based topology, a polar-based topology, or a hybrid polar-Cartesian-based topology. In a Cartesian-based topology, the transmitter section 14 receives the outbound symbol stream 24 as in-phase (I) and quadrature (Q) components (e.g., $A_I(t)\cos(\omega_{BB}(t)+\phi_I(t))$ and $A_Q(t)\cos(\omega_{BB}(t)+(t))$, respectively) and converts the outbound symbol stream 24 into up-converted signals (e.g., $A(t)\cos(\omega_{BB}(t)+\phi(t))+\omega_{RF}(t))$). For example, the I and Q components of the outbound symbol stream 24 is mixed with in-phase and quadrature components (e.g., $\cos(\omega_{RF}(t))$ and $\sin(\omega_{RF}(t))$, respectively) of a transmit local oscillation (TX LO) to produce mixed signals. One or more filters filter the mixed signals to produce the up-converted signals. As another example, the I and Q components of the outbound symbol stream 24 are up-sampled and filtered to produce the up-converted signals. One or more power amplifiers amplify the outbound up-converted signal(s) to produce an outbound RF signal(s) 26.

In a phase polar-based topology, the transmitter section 14 receives the outbound symbol stream 24 in polar coordinates (e.g., $A(t)\cos(\omega_{BB}(t)+\phi(t))$ or $A(t)\cos(\omega_{BB}(t)+/-\Delta\phi))$. In an example, the transmitter section 14 includes an oscillator that produces an oscillation (e.g., $\cos(\omega_{RF}(t))$) that is adjusted based on the phase information (e.g., $+/-\Delta\phi$ [phase shift] and/or $\phi(t)$ [phase modulation]) of the outbound symbol stream(s) 24. The resulting adjusted oscillation (e.g., $\cos(\omega_{RF}$ (t)+/−Δϕ) or cos($\omega_{RF}$(t)+ϕ(t)) may be further adjusted by amplitude information (e.g., A(t) [amplitude modulation]) of the outbound symbol stream(s) 24 to produce one or more up-converted signals (e.g., A(t) cos($\omega_{RF}$(t)+ϕ(t)) or A(t)cos ($\omega_{RF}$(t)+/−Δϕ)). In another example, the polar coordinate based outbound symbol stream is up-sampled and discrete digitally filtered to produce the one or more up-converted signals. One or more power amplifiers amplify the outbound up-converted signal(s) to produce an outbound RF signal(s) 26.

In a frequency polar-based topology, the transmitter section 14 receives the outbound symbol stream 24 in frequency-polar coordinates (e.g., A(t)cos($\omega_{BB}$(t)+f(t)) or A(t)cos($\omega_{BB}$(t)+/−Δf)). In an example, the transmitter section 14 includes an oscillator that produces an oscillation (e.g., cos($\omega_{RF}$(t)) this is adjusted based on the frequency information (e.g., +/−Δf [frequency shift] and/or f(t)) [frequency modulation]) of the outbound symbol stream(s) 24. The resulting adjusted oscillation (e.g., cos($\omega_{RF}$(t)+/−Δf) or cos($\omega_{RF}$(t)+f(t)) may be further adjusted by amplitude information (e.g., A(t) [amplitude modulation]) of the outbound symbol stream(s) 24 to produce one or more up-converted signals (e.g., A(t)cos($\omega_{RF}$(t)+f(t)) or A(t)cos($\omega_{RF}$(t)+/−Δf)). In another example, the frequency-polar coordinate based outbound symbol stream 24 is up-sampled and discrete digitally filtered to produce the one or more up-converted signals. One or more power amplifiers amplify the outbound up-converted signal(s) to produce an outbound RF signal(s) 26.

In a hybrid polar-Cartesian-based topology, the transmitter section 14 receives the outbound symbol stream 24 as phase information (e.g., cos($\omega_{BB}$(t)+/−Δϕ) or cos ($\omega_{BB}$(t)+ϕ(t)) and amplitude information (e.g., A(t)). In an example, the transmitter section 14 mixes in-phase and quadrature components (e.g., cos($\omega_{BB}$(t)+ϕ_I(t)) and cos ($\omega_{BB}$(t)+ϕ_Q(t)), respectively) of the one or more outbound symbol streams 24 with in-phase and quadrature components (e.g., cos($\omega_{RF}$(t)) and sin($\omega_{RF}$(t)), respectively) of one or more transmit local oscillations (TX LO) to produce mixed signals. One or more filters filter the mixed signals to produce one or more outbound up-converted signals (e.g., A(t) cos($\omega_{BB}$(t)+ϕ(t))+$\omega_{RF}$(t))). In another example, the polar-Cartesian-based outbound symbol stream is up-sampled and discrete digitally filtered to produce the one or more up-converted signals. One or more power amplifiers amplify the outbound up-converted signal (s) to produce an outbound RF signal(s) 26.

For a super heterodyne topology, the transmitter section 14 includes a baseband (BB) to intermediate frequency (IF) section and an IF to a radio frequency (RF section). The BB to IF section may be of a polar-based topology, a Cartesian-based topology, a hybrid polar-Cartesian-based topology, or a mixing stage to up-convert the outbound symbol stream(s) 24. In the three former cases, the BB to IF section generates an IF signal(s) (e.g., A(t)cos($\omega_{IF}$(t)+ϕ(t))) and the IF to RF section includes a mixing stage, a filtering stage and the power amplifier driver (PAD) to produce the pre-PA outbound RF signal (s).

When the BB to IF section includes a mixing stage, the IF to RF section may have a polar-based topology, a Cartesian-based topology, or a hybrid polar-Cartesian-based topology. In this instance, the BB to IF section converts the outbound symbol stream(s) 24 (e.g., A(t)cos(($\omega_{BB}$(t)+ϕ(t))) into intermediate frequency symbol stream(s) (e.g., A(t) ($\omega_{IF}$(t)+ϕ(t)). The IF to RF section converts the IF symbol stream(s) into the outbound RF signal(s) 26.

The power amplifier, which includes one or more power amplifiers coupled in series and/or in parallel, outputs the amplified outbound RF signal(s) 26 to the antenna interface 12. In an example, a RX-TX isolation module of the antenna interface 12 (which may be a duplexer, a circulator, or transformer balun, or other device that provides isolation between a TX signal and an RX signal using a common antenna) attenuates the outbound RF signal(s) 26. The RX-TX isolation module may adjusts it attenuation of the outbound RF signal(s) 26 (i.e., the TX signal) based on control signals 28 received from the baseband processing module 20. For example, when the transmission power is relatively low, the RX-TX isolation module may be adjusted to reduce its attenuation of the TX signal.

Continuing with the preceding example, an antenna tuning unit (ATU) of the antenna interface 12 is tuned to provide a desired impedance that substantially matches that of the antenna assembly 10. As tuned, the ATU provides the attenuated TX signal from the RX-TX isolation module to the antenna assembly 10 for transmission. Note that the ATU may be continually or periodically adjusted to track impedance changes of the antenna assembly 10. For example, the baseband processing module 20 may detect a change in the impedance of the antenna assembly 10 and, based on the detected change, provide control signals 28 to the ATU such that it changes it impedance accordingly.

The antenna assembly 10 also receives one or more inbound RF signals, which are provided to one of the ATUs of the antenna interface 12 via the frequency band (FB) switch of the antenna interface 12. The ATU provides the inbound RF signal(s) 30 to the RX-TX isolation module, which routes the signal(s) to the receiver (RX) section 18. The discrete digital RX section 18 converts (e.g., directly or in a super heterodyne manner) the inbound RF signal(s) 30 (e.g., A(t)cos($\omega_{RF}$(t)+ϕ(t))) into one or more inbound symbol streams 32 (e.g., A(t) cos($\omega_{BB}$(t)+ϕ(t))). Various embodiments of the discrete digital receiver section 18 are discussed in one or more of FIGS. 4-114.

The baseband processing module 20 converts the inbound symbol stream(s) 32 into inbound data 34 (e.g., voice, text, audio, video, graphics, etc.) in accordance with one or more wireless communication standards (e.g., GSM, CDMA, WCDMA, HSUPA, HSDPA, WiMAX, EDGE, GPRS, IEEE 802.11, Bluetooth, ZigBee, universal mobile telecommunications system (UMTS), long term evolution (LTE), IEEE 802.16, evolution data optimized (EV-DO), etc.). Such a conversion may include one or more of: digital intermediate frequency to baseband conversion, time to frequency domain conversion, space-time-block decoding, space-frequency-block decoding, demodulation, frequency spread decoding, frequency hopping decoding, beamforming decoding, constellation demapping, deinterleaving, decoding, depuncturing, and/or descrambling. Note that the processing module 20 converts a single inbound symbol stream 32 into the inbound data 34 for Single Input Single Output (SISO) communications and/or for Multiple Input Single Output (MISO) communications and converts the multiple inbound symbol streams 32 into the inbound data 34 for Single Input Multiple Output (SIMO) and Multiple Input Multiple Output (MIMO) communications.

The power management unit, if included, performs a variety of functions. Such functions include monitoring power connections and battery charges, charging a battery when necessary, controlling power to the other components of the wireless transceiver and/or the portable computing communication device, generating supply voltages, shutting down unnecessary modules, controlling sleep modes of the modules, and/or providing a real-time clock. To facilitate the generation of power supply voltages, the power management unit may include one or more switch-mode power supplies and/or one or more linear regulators.

Figure 2:
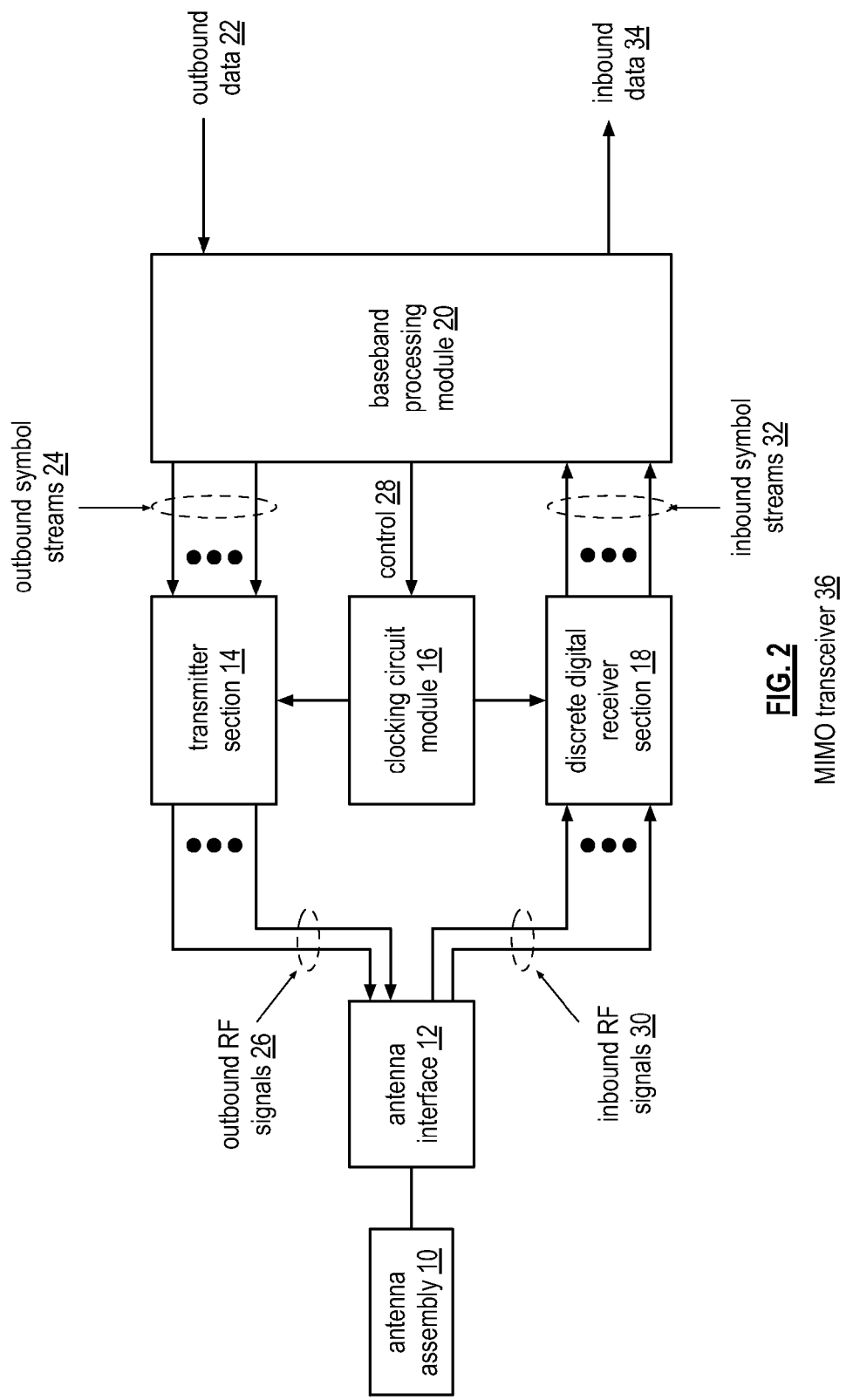
FIG. 2 is a schematic block diagram of an embodiment of a multiple input multiple output (MIMO) wireless transceiver in accordance with the present invention.

FIG. 2 is a schematic block diagram of an embodiment of a multiple input multiple output (MIMO) wireless transceiver 36 that includes an antenna assembly 10, an antenna interface 12, a transmitter section 14, a clocking circuit module 16, a discrete digital receiver section 18, and a baseband processing module 20. The antenna assembly 10 may include one or more antennas, one or more antenna arrays, a diversity antenna structure, one or more separate transmit antennas, one or more separate receive antennas, and/or a combination thereof. The antenna interface 12 includes one or more antenna tuning units, one or more transmission lines, one or more impedance matching circuits, one or more transformer baluns, one or more transmit-receive switches, one or more transmit-receive isolation modules, etc. The wireless transceiver 36 may further include a power management module (not shown).

The wireless transceiver 36 may be included within a portable computing communication device, which may be any device that can be carried by a person, can be at least partially powered by a battery, and/or performs one or more software applications. For example, the portable computing communication device may be a cellular telephone, a laptop computer, a personal digital assistant, a video game console, a video game player, a personal entertainment unit, a tablet computer, etc. Note that the wireless radio transceiver 36 may operate in the radio frequency (RF) frequency spectrum and/or the millimeter wave (MMW)) frequency spectrum.

In an example of operation, the baseband processing module 20 performs one or more functions of the portable computing communication device that require wireless transmission of data. In this instance, the baseband processing module 20 receives outbound data 22 (e.g., voice, text, audio, video, graphics, etc.) and converts it into multiple outbound symbol streams 24 in accordance with one or more wireless communication standards that supports MIMO communications (e.g., GSM, CDMA, WCDMA, HSUPA, HSDPA, WiMAX, EDGE, GPRS, IEEE 802.11, Bluetooth, ZigBee, universal mobile telecommunications system (UMTS), long term evolution (LTE), IEEE 802.16, evolution data optimized (EV-DO), etc.). Such a conversion may include one or more of: digital intermediate frequency to baseband conversion, time to frequency domain conversion, space-time-block decoding, space-frequency-block decoding, demodulation, frequency spread decoding, frequency hopping decoding, beamforming decoding, constellation demapping, deinterleaving, decoding, depuncturing, and/or descrambling.

The transmitter section 14, which includes one or more are transmitters as described with reference to FIG. 1 or as may be subsequently described with reference to FIGS. 115-129, receives the multiple output symbol streams 24 and converts them into multiple outbound RF signals 26. The transmitter section 14 provides the outbound RF signals 26 to the antenna interface 12, which in turn provides the outbound RF signals 26 to the antenna assembly 10 for transmission. Note that the antenna interface 12 may include one or more antenna tuning units, one or more transmission lines, one or more impedance matching circuits, one or more transformer baluns, one or more transmit-receive switches, one or more transmit-receive isolation modules, etc. for each of the outbound RF signals.

The antenna assembly 10 also receives inbound RF signals that it provides to the discrete digital receiver section 18 via the antenna interface 12. The discrete digital receiver section 18 includes one or more discrete digital receivers to convert the inbound RF signals 30 into inbound symbol streams 32. The baseband processing module 20 converts the inbound symbol streams 32 into inbound data 34 in accordance with one or more wireless communication standards that supports MIMO communications (e.g., GSM, CDMA, WCDMA, HSUPA, HSDPA, WiMAX, EDGE, GPRS, IEEE 802.11, Bluetooth, ZigBee, universal mobile telecommunications system (UMTS), long term evolution (LTE), IEEE 802.16, evolution data optimized (EV-DO), etc.). Such a conversion may include one or more of: digital intermediate frequency to baseband conversion, time to frequency domain conversion, space-time-block decoding, space-frequency-block decoding, demodulation, frequency spread decoding, frequency hopping decoding, beamforming decoding, constellation demapping, deinterleaving, decoding, depuncturing, and/or descrambling.

The power management unit, if included, performs a variety of functions. Such functions include monitoring power connections and battery charges, charging a battery when necessary, controlling power to the other components of the wireless transceiver 36 and/or the portable computing communication device, generating supply voltages, shutting down unnecessary modules, controlling sleep modes of the modules, and/or providing a real-time clock. To facilitate the generation of power supply voltages, the power management unit may includes one or more switch-mode power supplies and/or one or more linear regulators.

Figure 3:
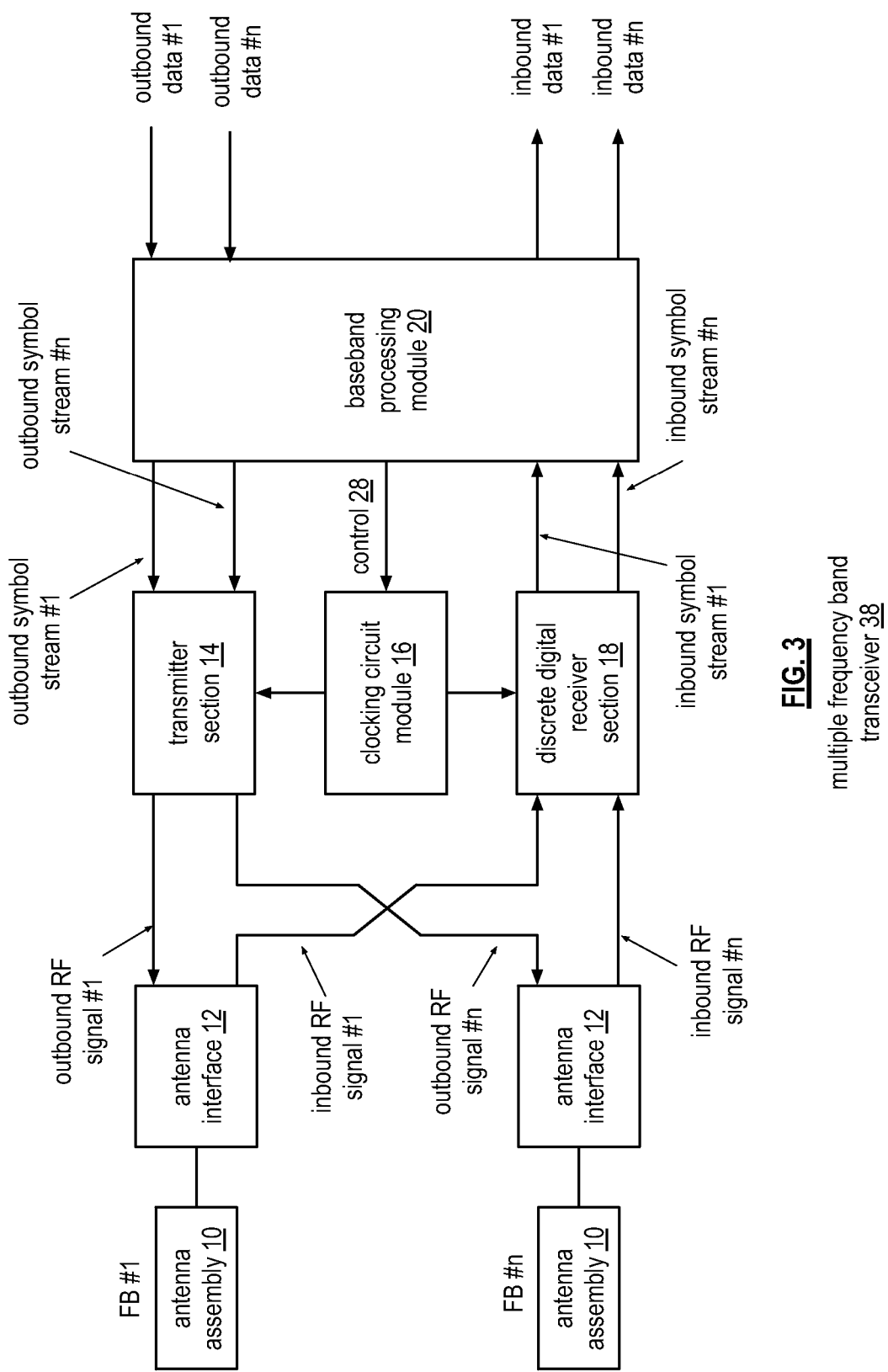
FIG. 3 is a schematic block diagram of an embodiment of a multiple frequency band wireless transceiver in accordance with the present invention.

FIG. 3 is a schematic block diagram of an embodiment of a multiple frequency band wireless transceiver 38 that includes a plurality of antenna assemblies 10, a plurality of antenna interfaces 12, a transmitter section 14, a clocking circuit module 16, a discrete digital receiver section 18, and a baseband processing module 20. Each of the antenna assemblies 10 may include one or more antennas, one or more antenna arrays, a diversity antenna structure, one or more separate transmit antennas, one or more separate receive antennas, and/or a combination thereof. Each of the antenna interfaces 12 includes one or more antenna tuning units, one or more transmission lines, one or more impedance matching circuits, one or more transformer baluns, one or more transmit-receive switches, one or more transmit-receive isolation modules, etc. The wireless transceiver 38 may further include a power management module (not shown).

The wireless transceiver 38 may be included within a portable computing communication device, which may be any device that can be carried by a person, can be at least partially powered by a battery, and/or performs one or more software applications. For example, the portable computing communication device may be a cellular telephone, a laptop computer, a personal digital assistant, a video game console, a video game player, a personal entertainment unit, a tablet computer, etc. Note that the wireless radio transceiver 38 may operate in the radio frequency (RF) frequency spectrum and/or the millimeter wave (MMW)) frequency spectrum.

In an example of operation, the baseband processing module 20 performs one or more functions of the portable computing communication device that require wireless transmission of data (e.g., a single concurrent communication) and/or transmission of multiple data (e.g., multiple concurrent communications). In this instance, the baseband processing module 20 receives or generates multiple outbound data (e.g., one for each communication) and converts the into multiple outbound symbol streams (e.g., one for each communication where the standards may be GSM, CDMA, WCDMA, HSUPA, HSDPA, WiMAX, EDGE, GPRS, IEEE 802.11, Bluetooth, ZigBee, universal mobile telecommunications system (UMTS), long term evolution (LTE), IEEE 802.16, evolution data optimized (EV-DO), etc.). Each conversion of outbound data into outbound symbol streams may include one or more of: digital intermediate frequency to baseband conversion, time to frequency domain conversion, space-time-block decoding, space-frequency-block decoding, demodulation, frequency spread decoding, frequency hopping decoding, beamforming decoding, constellation demapping, deinterleaving, decoding, depuncturing, and/or descrambling.

The transmitter section 14, which includes a plurality of transmitters as described with reference to FIG. 1 or as may be subsequently described with reference to FIGS. 115-129, receives the multiple outbound symbol streams and converts each of them into an outbound RF signal in accordance with the corresponding standard. The transmitter section 14 provides each of the outbound RF signals to a corresponding one of the antenna interfaces, which in turn provides the outbound RF signals to a corresponding one of the antenna assemblies 10 for transmission.

Each of the antenna assemblies 10 also receives inbound RF signals that it provides to the discrete digital receiver section 18 via a corresponding one of the antenna interfaces 12. The discrete digital receiver section 18 includes one or more discrete digital receivers to convert each of the inbound RF signals into multiple inbound symbol streams. The baseband processing module 20 converts each of the inbound symbol streams into separate inbound data in accordance with one or more wireless communication standards (e.g., GSM, CDMA, WCDMA, HSUPA, HSDPA, WiMAX, EDGE, GPRS, IEEE 802.11, Bluetooth, ZigBee, universal mobile telecommunications system (UMTS), long term evolution (LTE), IEEE 802.16, evolution data optimized (EV-DO), etc.). Such a conversion may include one or more of: digital intermediate frequency to baseband conversion, time to frequency domain conversion, space-time-block decoding, space-frequency-block decoding, demodulation, frequency spread decoding, frequency hopping decoding, beamforming decoding, constellation demapping, deinterleaving, decoding, depuncturing, and/or descrambling.

The power management unit, if included, performs a variety of functions. Such functions include monitoring power connections and battery charges, charging a battery when necessary, controlling power to the other components of the wireless transceiver and/or the portable computing communication device, generating supply voltages, shutting down unnecessary modules, controlling sleep modes of the modules, and/or providing a real-time clock. To facilitate the generation of power supply voltages, the power management unit may includes one or more switch-mode power supplies and/or one or more linear regulators.

Figure 4:
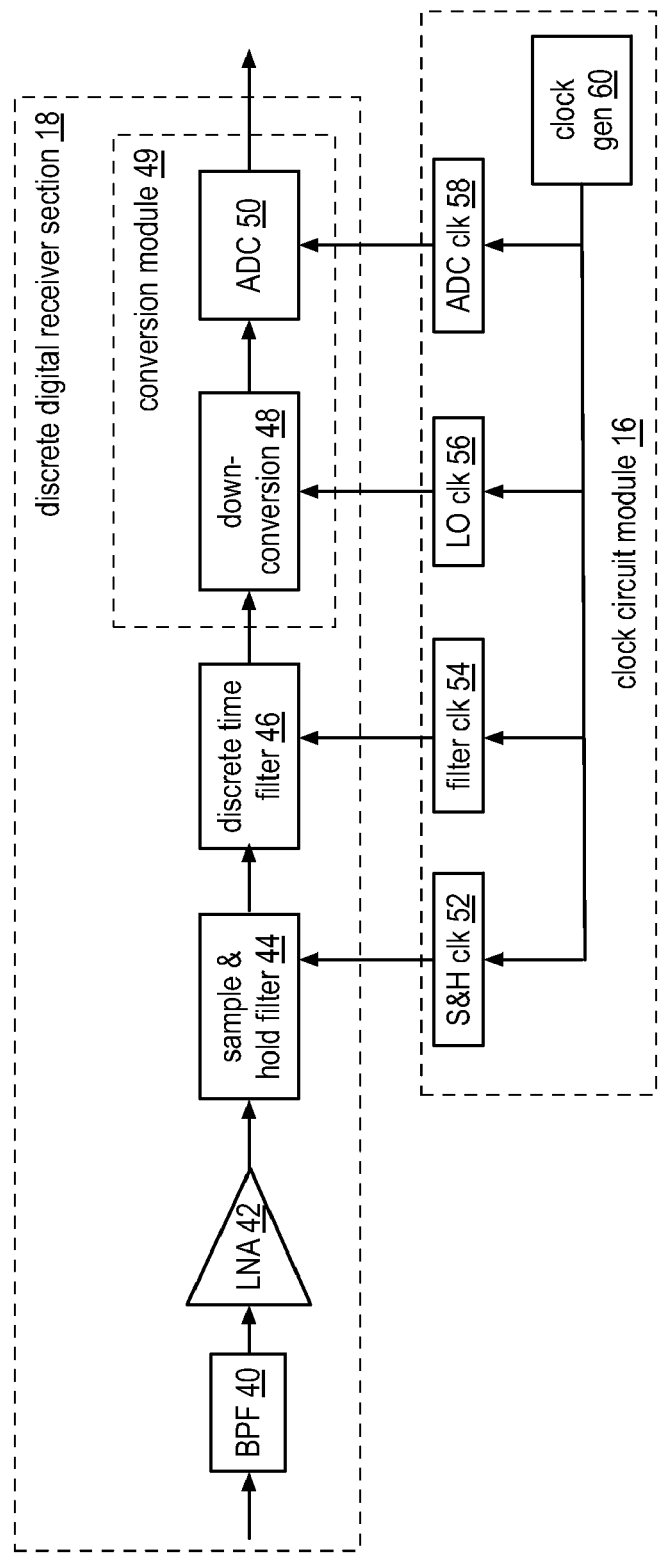
FIG. 4 is a schematic block diagram of an embodiment of a receiver of one or more of the transceivers of FIGS. 1-3 in accordance with the present invention.

FIG. 4 is a schematic block diagram of an embodiment of a receiver of one or more of the transceivers of FIGS. 1-3 that includes a band pass filter (BPF) 40, a sample and hold filter circuit 44, a discrete time filter 46, and a conversion module 49, which may include a down conversion module 48 and/or an analog to digital converter (ADC) 50. The receiver 18 may further include a low noise amplifier (LNA) module 42 (e.g. one or more low noise amplifiers coupled in series and/or in parallel) and a clock circuit module 16. The clock circuit module 16 includes a clock generator 60, a sample and hold (S&H) clock circuit 52, a filter clock circuit 54, a local oscillation (LO) clock circuit 56, and an analog to digital converter (ADC) clock circuit 58.

Figure 5:
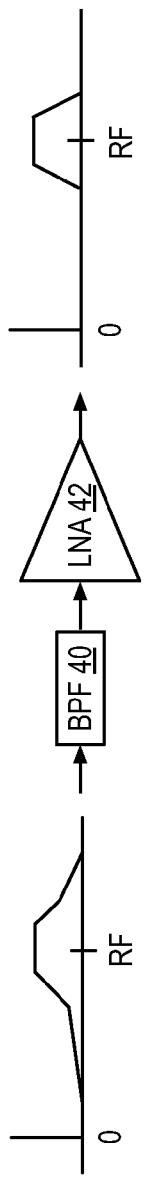
FIG. 5 is a diagram of an example of operation of an RF bandpass filter and low noise amplifier of the receiver of FIG. 4 in accordance with the present invention.

In an example of operation, the band pass filter 40 receives an inbound wireless (e.g., RF or MMW) signal from the antenna interface. The band pass filter 40 attenuates out of band signal components and passes, substantially unattenuated, in-band signal components of the inbound RF signal (e.g., a filtered inbound wireless signal). The low noise amplifier 42 amplifies the filtered inbound RF signal to produce an amplified inbound RF signal. With reference to FIG. 5, an inbound RF signal is shown in the frequency domain to have in-band signal components centered about an RF or MMW (millimeter wave) carrier frequency and out of band signal components at the edges of the signal. The output of the low noise amplifier 42 is shown in the frequency domain to substantially attenuate the out of band signal components and to pass, substantially unattenuated, the inbound signal components of the inbound RF signal.

Figure 6:
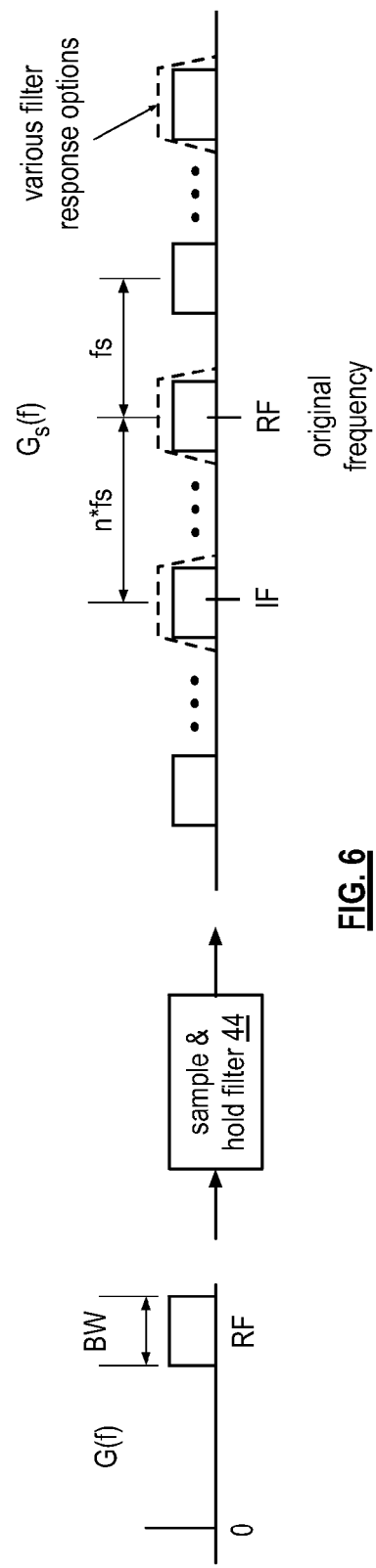
FIG. 6 is a diagram of an example of operation of a sample and hold filter circuit of the receiver of FIG. 4 in accordance with the present invention.

Returning to the discussion of FIG. 4, the sample and hold filter 44 receives the amplified inbound RF signal and samples it in accordance with a sample clock signal and a hold clock signal, wherein the sample and hold clock signals have at a rate corresponding to a multiple of the bandwidth of the filtered inbound wireless signal (e.g., =>2*bandwidth of the inbound wireless signal). With reference to FIG. 6, the sample and hold circuit 44 receives the amplified inbound RF signal (shown in the frequency domain) and samples it at a sampling frequency (fs). In this example, the sampling frequency is greater than or equal to two times the bandwidth of the amplified inbound RF signal. In general, the bandwidth of the amplified inbound RF signal corresponds to the bandwidth of the baseband signal component of the inbound RF signal. For instance, the bandwidth of the baseband inbound signal may be a few hundred kilohertz to tens of megahertz. The sample and hold filter 44 outputs, in the frequency domain, a plurality of pulses spaced in frequency by the sampling frequency (i.e., a frequency domain pulse train). The sample and hold output includes a pulse at RF, which corresponds to the original inbound RF signal. The functionality of the sample and hold circuit 44 will describe in greater detail with reference to FIGS. 7 through 32.

Returning to the discussion of FIG. 4, the discrete time filter 46 (which may be a finite impulse response filter, an infinite impulse response filter, a frequency translation bandpass filter, and/or other type of discrete filter) receives the output of the sample and hold filter circuit and filters it. Depending on the filtering response of the discrete time filter, the discrete time filter will output, in the frequency domain, a single pulse of the sample and hold output at a particular frequency (i.e., a filtered sample pulse). For example, if the filtering response of the discrete time filter corresponds to a bandpass filter 40 centered at RF, the discrete time filter 46 will output the pulse at RF and attenuate the pulses at the other frequencies. As another example, if the filter response of discrete time filter corresponds to a bandpass filter 40 centered at an intermediate frequency, the discrete time filter 46 will output the pulse at the intermediate frequency and attenuate the pulses at the other frequencies. Various embodiments of a discrete time filter 46 will be described in greater detail with reference to FIGS. 33-37.

The conversion module 49 is operable to convert the filtered sample pulse into an inbound baseband signal. In one example, the discrete time filter module 46 outputs the filtered sample pulse at baseband. In this example, the conversion module includes the analog to digital converter 50, which converts the filtered sample pulse into the inbound baseband signal.

In another example, the conversion module 49 includes the down conversion module 48 and the ADC 50. In this example, the down conversion module 48 may be implemented using analog circuitry (e.g., a mixer, a local oscillation, and one or more pass filters) or it may be implemented as discrete time digital circuitry (e.g., a sample and hold circuit 44 and a discrete time filter 46). Regardless of the implementation, the down conversion module 48 converts the output of the discrete time filter 46 to a baseband signal (e.g., an analog symbol stream). The analog to digital converter 50 converts the baseband signal into a digital signal (e.g., an inbound symbol stream), which may be process as previously described with reference to FIGS. 1-3.

The clock circuit module 16 (or clock generation circuit) includes a clock generation module 60, a sample and hold (S&H) clock module 52, a discrete time filter clock module 54, and a conversion module clock (e.g., the ADC clock module 58, which may further include the down conversion (LO) clock module 56). The clock generation module 60 (e.g., a phase locked loop, a crystal oscillator, a digit frequency synthesizer, etc.) is operable to generate a system clock signal at a desired frequency (e.g., 1 GHz to hundreds of GHz).

The S&H clock module 52 (e.g., a phase locked loop, a clock rate divider, a clock rate multiplier, etc.) generates a sample and hold clock signal from the system clock signal to have a rate that corresponds to the multiple of the bandwidth of the filtered inbound wireless signal (e.g., 2*BW of inbound signal). The S&H clock signal may include a sample clock signal having a duty cycle and a hold clock signal having a duty cycle. The duty cycles of the sample clock signal and the hold clock signal may be the same or different and may affect the frequency response of the sample and hold module as is further discussed with reference to one or more of FIGS. 7-18.

The discrete time filter clock module 54 (e.g., a phase locked loop, a clock rate divider, a clock rate multiplier, etc.) generates a filter clock from the system clock signal. The conversion clock module (e.g., one or more of a phase locked loop, a clock rate divider, a clock rate multiplier, etc.) generates a conversion clock signal (e.g., an ADC clock signal and may further include a down conversion clock signal) from the system clock signal.

FIGS. 7-18 illustrate one or more examples of the operation of the sample and hold filter circuit within a receiver of FIG. 4 and/or of any of the other figures. FIGS. 19-29 illustrates one or more embodiments of the sample and hold circuit that may be used within a receiver as discussed herein.

FIG. 7 is a diagram of an example of an input signal g(t) in the time domain. The signal may be representative of a baseband communication signal having one or more channels and or subcarriers. For example, in an OFDM (orthogonal frequency division multiplexing) scheme, the baseband is divided into a plurality of subcarriers, where some of the subcarriers carry encoded data. As another example, the input signal g(t) may represent a sinusoidal signal, a complex sinusoidal signal, or other type of signal. Generally, the input signal g(t) may be expressed as a sum of sinusoidal signals (e.g., $g(t)=A_1 \cos(\omega_1(t))+A_2 \cos(\omega_2(t))+A_3 \cos(\omega_3(t))+\ldots$.

FIG. 8 is a diagram of an example of the sample and hold input signal G(f) in the frequency domain. In this example, the frequency domain representation of the signal is centered at 0 Hz with a bandwidth that spans from −fc to +fc, where fc corresponds to the highest frequency component of the time domain input signal g(t). As another example, if the input signal corresponds to a baseband communications signal having a bandwidth of 2 MHz, then fc is 2 MHz.

FIG. 9 is a diagram of an example of sample and hold input signal g(t) being sampled at a given sampling period ($T_s$) to produce a plurality of sample pulses $g_s(t)$. Each sample pulse has a magnitude corresponding to the magnitude of the input signal g(t) at the corresponding sampling point. Note that the sampling period (Ts) corresponds to the inverse of the sampling frequency (fs) and the sampling frequency (fs) is equal to or greater than twice the highest frequency components of the input signal g(t) (i.e., fs>=2*fc).

FIG. 10 is a diagram of an example of the sampled inbound signal (e.g., $g_s(t)$) in the frequency domain, which is expressed as $G_s(f)$. In this example, the frequency domain representation of the sampled signal $G_s(f)$ includes the frequency domain representation of the original signal (e.g., the one shown in FIG. 8) and images of the original signal at frequencies corresponding to the sampling frequency and multiples of the sampling frequency. Note that while the sampling frequency should be at least twice the highest frequency components of the input signal (e.g., fs>=2*fc), the present example has the sampling frequency at approximately 4 times the highest frequency component of the input signal (e.g., fs≅4*fc).

Figure 11:
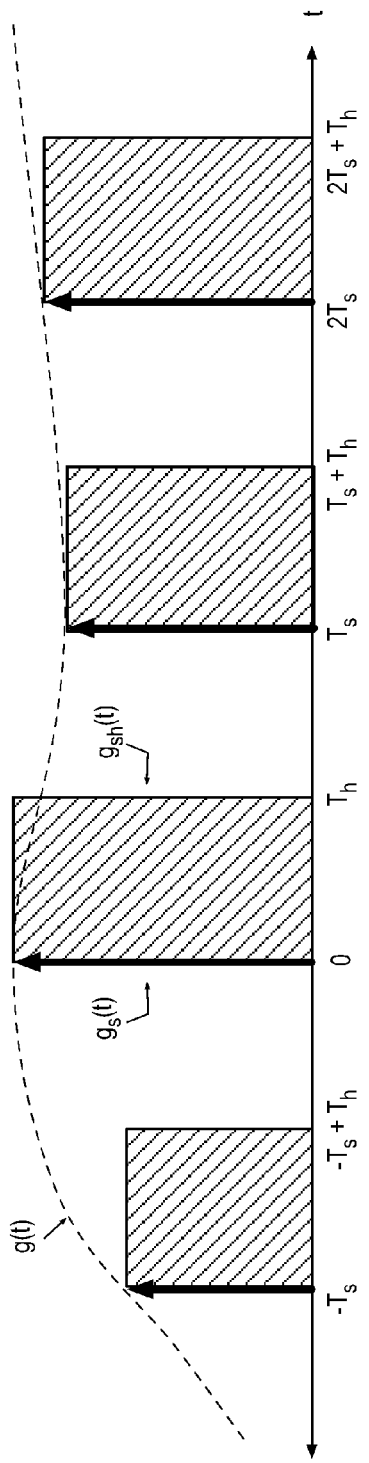
FIG. 11 is a diagram of an example of sampling and holding the inbound signal, in the time domain, at a given sampling period ($T_s$) and holding period ($T_h$) in accordance with the present invention.

FIG. 11 is a diagram of an example of sampling and holding the input signal g(t) in the time domain. As shown in FIG. 9, the sampling of the input signal produces a plurality of sample pulses at an interval corresponding to the sampling period (Ts). For each sampled pulse, it is held for a holding period (Th), which is less than or equal to the sampling period (Ts), to produce a plurality of sampled and held pulses (e.g., $g_{sh}(t)$). In the present example, the holding period is approximately ½ of the sampling period.

Figure 12:
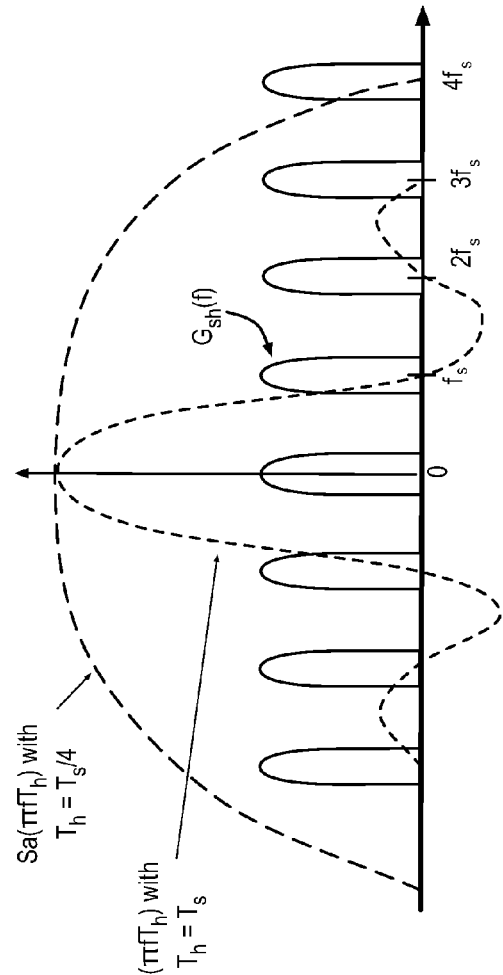
FIG. 12 is a diagram of an example of a sampled and held inbound signal, in the frequency domain, with various ratios of $T_s$-to-$T_h$ in accordance with the present invention.

FIG. 12 is a diagram of an example of the sampled and held signal (e.g., $g_{sh}(0)$ in the frequency domain, which is expressed as $G_{sh}(f)$. The example further illustrates various sample and hold filtering responses for different ratios of $T_s$-to-$T_h$. In this example, $G_{sh}(f)$ includes a plurality of sampled and held pulses at frequency intervals corresponding to the sampling frequency and multiples thereof. In addition, the example includes various filter responses for the sample and hold filter circuit based on ratios of the sampling period (Ts) to the holding period (Th). For instance, as the ratio of the holding period to the sampling period approaches one, the filter response of the sample and hold filter circuit more closely approximates a sin X/X waveform. Accordingly, by varying the ratio of the holding period to the sampling period, the filter response of the sample and hold filter circuit may be varied.

FIG. 13 is a diagram of an example of an input RF signal g(t) in the time domain. The signal may be representative of an RF modulated communication signal having one or more channels and or subcarriers. For example, in an OFDM (orthogonal frequency division multiplexing) scheme, the baseband is divided into a plurality of subcarriers, which are up converted to RF signals. As another example, the input signal g(t) may represent a communication signal that is transmitted in the RF and/or MMW frequency bands in accordance with one or more wireless communication standards. Generally, the inbound RF signal g(t) may be expressed g(t)=A(t)*cos ($\omega_{RF}(t)+\omega_{SIG}(t)+\phi(t)$), A(t) represents amplitude information of the baseband signal, $\omega_{RF}(t)$ represents the RF carrier frequency, $\omega_{SIG}(t)$ represents the frequency of the baseband signal, and $\phi(t)$ represents phase information of the baseband signal.

FIG. 14 is a diagram of an example of the inbound RF signal (e.g., g(t)) in the frequency domain, which is expressed as G(f). as shown, the frequency domain representation of the inbound RF signal includes a frequency domain pulse at the RF frequency and the corresponding negative RF frequency. The bandwidth of the frequency domain pulse corresponds to the largest signal component of the baseband signal (e.g., SIG(t)=A(t)cos($\omega_{SIG}(t)+\phi(t)$)).

FIG. 15 is a diagram of an example of the inbound RF signal, in the frequency domain, being sampled at a sampling frequency ($f_s$), which may be expressed as $G_{sh}(f)$. In this example, a frequency domain pulse is positioned in frequency based on the sampling frequency and multiples thereof. The plurality of frequency domain pulses includes the original frequency domain pulses of FIG. 14. In this example, the sampling frequency is approximately equal to ¼ the RF frequency and frequency pulse train is shown without sample and hold filtering.

Figure 16:
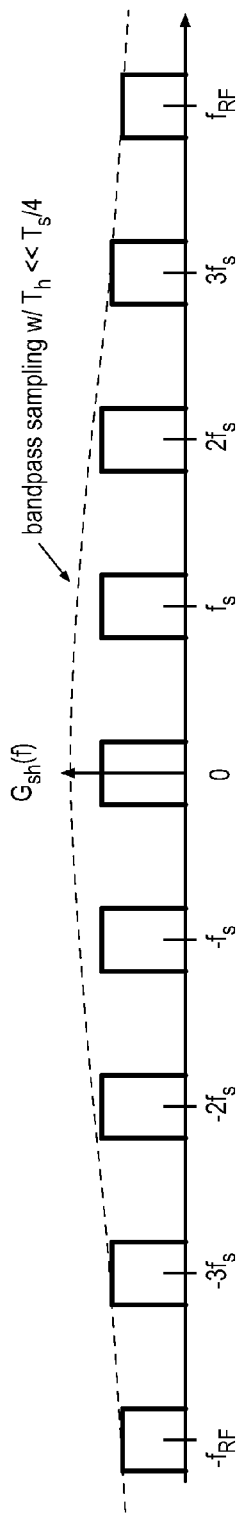
FIG. 16 is a diagram of an example of bandpass filtering of the sampling and hold filter circuit of the sampled inbound RF signal, in the frequency domain, at a sampling frequency ($f_s$) in accordance with the present invention.

FIG. 16 is a diagram of an example of the frequency domain representation of the sampled and held inbound RF signal $G_{sh}(f)$ being filtered by the sample and hold filtering circuit. In this example, the holding period (Th) is much less than ¼ of the sampling period (Ts), which yields a relatively flat sin X/X filtering response between −RF and RF. In general, the frequency pulse at 0 Hz will have less distortion than frequency pulses at other frequencies, however, with this type of sample and hold filtering, the distortion in the range illustrated may be negligible.

Figure 17:
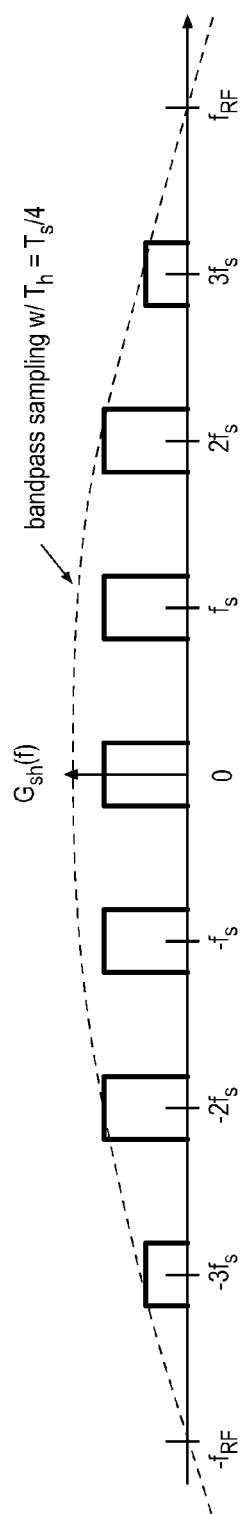
FIG. 17 is a diagram of another example of bandpass filtering of the sampling and hold filter circuit of the sampled inbound RF signal, in the frequency domain, at a sampling frequency ($f_s$) in accordance with the present invention.

FIG. 17 is a diagram of another example of the frequency domain representation of the sampled and held inbound RF signal $G_{sh}(f)$ being filtered by the sample and hold filtering circuit. In this example, the holding period (Th) is approximately ¼ of the sampling period (Ts), which yields a bandpass filter response between −RF and RF.

Figure 18:
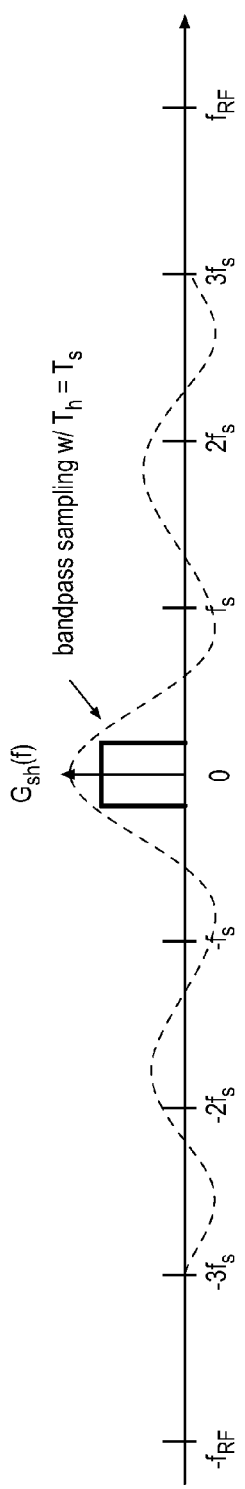
FIG. 18 is a diagram of another example of bandpass filtering of the sampling and hold filter circuit of the sampled inbound RF signal, in the frequency domain, at a sampling frequency ($f_s$) in accordance with the present invention.

FIG. 18 is a diagram of another example of the frequency domain representation of the sampled and held inbound RF signal $G_{sh}(f)$ being filtered by the sample and hold filtering circuit. In this example, the holding period (Th) is approximately equal to the sampling period (Ts), which yields a sin X/X response between −RF and RF.

FIGS. 19-32 illustrate one or more embodiments and/or one or more components a sample and hold module that may be used in a receiver or in a transmitter and will be discussed in greater detail below. In general, a sample and hold module includes a sample switching module, an impedance module (e.g., a capacitor, a capacitor-inductor circuit, and an active element capacitor-inductor circuit), and a hold switching module. The sample switching module (e.g., one or more transistors, switches, etc.) outputs samples of an inbound wireless signal in accordance with a sampling clock signal. The impedance module temporarily stores the samples of the inbound wireless signal. The hold switching module (e.g., one or more transistors, switches, etc.) outputs a filtered representation of the samples in accordance with a hold clock signal to produce a frequency domain sample pulse train.

The sample and hold clock module generates the sampling clock signal and the hold clock signal in accordance with a sample and hold clock control signal, which is generated by a processing module. In an example, the processing module generates the sample and hold clock control signal to facilitate establishing the filter response of the sample and hold module, wherein the filter response of the sample and hold module is in accordance with a ratio between the sampling clock signal and the hold clock signal.

Figure 19:
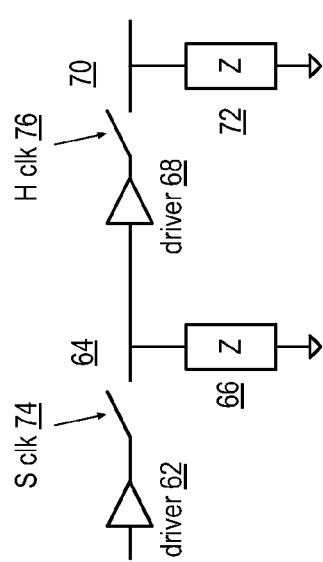
FIG. 19 is a schematic block diagram of an embodiment of a sample and hold filter circuit in accordance with the present invention.
Figure 21:
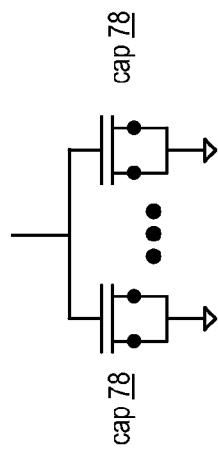
FIG. 21 is a schematic block diagram of an embodiment of an impedance element of a sample and hold filter circuit in accordance with the present invention.
Figure 22:
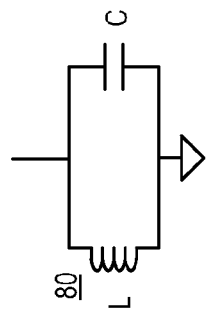
FIG. 22 is a schematic block diagram of another embodiment of an impedance element of a sample and hold filter circuit in accordance with the present invention.

FIG. 19 is a schematic block diagram of an embodiment of a sample and hold filter circuit 44 that includes a sample driver 62, a sample switch 64, a sample impedance 66, a hold driver 68, a hold switch 70, and a hold impedance 72. Each of the impedances (Z) 66 and 72 may be one or more capacitors (which may be implemented as shown in FIG. 21), a resistor-capacitor circuit, an active impedance, or a tank circuit (which may be implemented as shown in FIG. 22).

In an example of operation, an input signal is provided to the input of the sample driver. When activated by the sample clock 74 (which is active for a sampling period at the sampling frequency), the sample driver 62 drives the input signal on to the impedance 66, which imposes the magnitude of the input signal on the impedance 66. While the sample switch 64 is closed, the voltage imposed on the impedance substantially matches the voltage of the input signal. When the sample switch 64 opens, the sample impedance 66 has the most recent voltage of the input signal imposed thereon.

After the sample switch 64 opens and before it closes again for the next sample, the hold switch 70 is closed (which is toggled for a holding period at the sampling frequency) in accordance with the hold clock 76. With the hold switch 70 closed, the hold driver 68 imposes the voltage imposed on the sample impedance 66 on to the hold impedance 72. The voltage on the hold impedance 66 may be read at any time after the hold switch 64 is closed and the voltage on the hold impedance 72 is substantially stable. The process repeats for the next sample and hold interval. Note that there are a variety of ways to implement the drivers 62 and 68, the switches 64 and 70, and/or the impedances 66 and 72.

Figure 20:
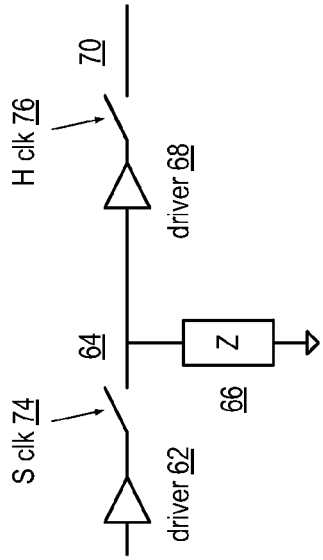
FIG. 20 is a schematic block diagram of another embodiment of a sample and hold filter circuit in accordance with the present invention.

FIG. 20 is a schematic block diagram of another embodiment of a sample and hold filter circuit 44 that includes a sample driver 62, a sample switch 64, a sample impedance 66, a hold driver 68, and a hold switch 70. Each of the impedances (Z) 66 may be one or more capacitors 78 (which may be implemented as shown in FIG. 21), a resistor-capacitor circuit 80, an active impedance, or a tank circuit (which may be implemented as shown in FIG. 22).

In an example of operation, an input signal is provided to the input of the sample driver. When activated by the sample clock 74 (which is toggled for a sampling period at the sampling frequency), the sample driver 62 drives the input signal on to the impedance 66, which imposes the magnitude of the input signal on the impedance 66. While the sample switch 64 is closed, the voltage imposed on the impedance substantially matches the voltage of the input signal. When the sample switch 64 opens, the sample impedance 66 has the most recent voltage of the input signal imposed thereon.

After the sample switch 64 opens and before it closes again for the next sample, the hold switch 70 is closed (which is toggled for a holding period at the sampling frequency). With the hold switch 70 closed, the hold driver 68 outputs the voltage imposed on the sample impedance 66. The process repeats for the next sample and hold interval.

Figure 23:
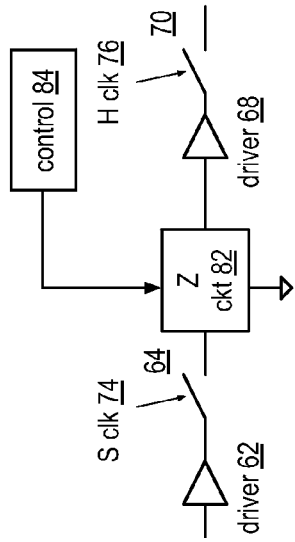
FIG. 23 is a schematic block diagram of another embodiment of a sample and hold filter circuit in accordance with the present invention.
Figure 25:
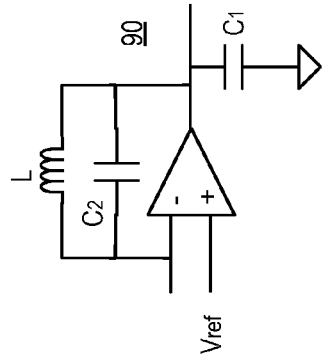
FIG. 25 is a schematic block diagram of an embodiment of an impedance circuit of a sample and hold filter circuit in accordance with the present invention.

FIG. 23 is a schematic block diagram of another embodiment of a sample and hold filter circuit 44 that includes a sample driver 62, a sample switch 64, a sample impedance circuit (Z ckt) 82, a hold driver 68, a hold switch 70, a control module 84 (e.g., a module of the baseband processing module), and a hold impedance circuit 86. Each of the impedance circuits (Z ckt) 82 and 86 includes a circuit that has a frequency response in a frequency range of interest of the sample and hold process. For example, the impedance circuits 82 and 86 may be a capacitor-inductor-capacitor filter 88 (as shown in FIG. 25) that is tuned to the frequency of the input signal (e.g., RF), is tuned to the sampling frequency (fs), is tuned to a multiple of the sampling frequency, or is tuned to baseband. As a more specific example, the capacitor C2 and the inductor L may be tuned to RF, such that RF signals pass substantially unattenuated to capacitor C1, which stores the voltage of the input signal during the sampling period.

Another example of the impedance circuits 82 and 86 includes one or more active components (e.g., an operational amplifier, transistor, etc.) that is configured to produce a desired frequency response at RF, at fs, at n*fs, or at baseband. The impedance circuits 82 and 86 further include a storage element (e.g., a capacitor). The desired frequency response may be a notch filter response, a bandpass filter response, a high pass filter response, a low pass filter response, etc. For example, the impedance circuit 90 of FIG. 26 may be implemented to provide a band pass filter at RF such that RF signals pass substantially unattenuated to capacitor C1, which stores the voltage of the input signal during the sampling period.

In an example of operation, an input signal is provided to the input of the sample driver 62. When activated by the sample clock 74 (which is toggled for a sampling period at the sampling frequency), the sample driver 62 drives the input signal to the impedance circuit 82. The impedance circuit 82 filters the input signal in accordance with its frequency response and stores a filtered representation of the input signal on a storage element (e.g., a capacitor). While the sample switch 64 is closed, the voltage stored by the sample impedance circuit 82 substantially matches the voltage of the input signal provided that the input signal is within the unattenuated region of the filter response of the sample impedance circuit 82. When the sample switch 64 opens, the sample impedance circuit 82 is storing the most recent voltage of the input signal.

After the sample switch 64 opens and before it closes again for the next sample, the hold switch 70 is closed (which is toggled for a holding period at the sampling frequency). With the hold switch 70 closed, the hold driver 68 provides the voltage stored in the sample impedance circuit 82 to the hold impedance circuit 86, which stores a filtered representation of the inputted sample on a storage element (e.g., a capacitor). While the hold switch 70 is closed, the voltage being stored by the hold impedance circuit 86 substantially matches the voltage stored by the sample impedance circuit 82, provided that the input signal is within the unattenuated region of the filter response of the hold impedance circuit 86. The voltage stored by the hold impedance circuit 86 may be read at any time after the hold switch 70 is closed and the voltage stored by the hold impedance circuit 86 is substantially stable. The process repeats for the next sample and hold interval.

Figure 24:
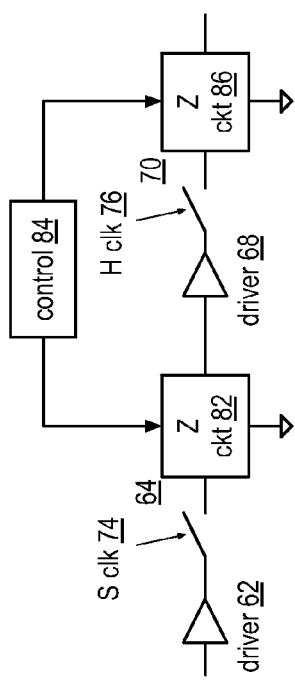
FIG. 24 is a schematic block diagram of another embodiment of a sample and hold filter circuit in accordance with the present invention.
Figure 26:
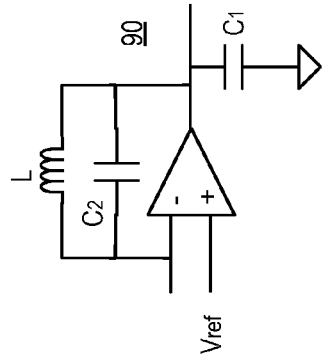
FIG. 26 is a schematic block diagram of another embodiment of an impedance circuit of a sample and hold filter circuit in accordance with the present invention.

FIG. 24 is a schematic block diagram of another embodiment of a sample and hold filter circuit 44 that includes a sample driver 62, a sample switch 64, a sample impedance circuit (Z ckt) 82, a hold driver 68, and a hold switch 70. Each of the impedance circuits (Z ckt) 82 includes a circuit that has a frequency response in a frequency range of interest of the sample and hold process. For example, the impedance circuit 82 may be a capacitor-inductor-capacitor filter 88 (as shown in FIG. 25) that is tuned to the frequency of the input signal (e.g., RF), is tuned to the sampling frequency (fs), is tuned to a multiple of the sampling frequency, or is tuned to baseband. Another example of the impedance circuit 82 may be implemented as shown in FIG. 26.

In an example of operation, an input signal is provided to the input of the sample driver 62. When activated by the sample clock 74, the sample driver 62 drives the input signal to the impedance circuit 82. The impedance circuit 82 filters the input signal in accordance with its frequency response and stores a filtered representation of the input signal on a storage element (e.g., a capacitor). While the sample switch 64 is closed, the voltage stored by the sample impedance circuit 82 substantially matches the voltage of the input signal provided that the input signal is within the unattenuated region of the filter response of the sample impedance circuit 82. When the sample switch 64 opens, the sample impedance circuit 82 stores the most recent voltage of the input signal.

After the sample switch 64 opens and before it closes again for the next sample, the hold switch 70 is closed. With the hold switch 70 closed, the hold driver 68 outputs the voltage stored in the sample impedance circuit 82. At the next sample period, the process repeats.

FIG. 27 is a diagram of an example of the frequency domain representation of the sampled and held inbound RF signal $G_{sh}(f)$ (of FIG. 15) being filtered by the sample and hold filtering circuit of FIG. 23 or 24. In this example, the holding period (Th) is much less than ¼ of the sampling period (Ts), which yields a relatively flat sin X/X filtering response between −RF and RF. The impedance circuits of the sample and hold circuit filter are tuned, via the processing module, to provide a bandpass filter centered at RF. As such, the filtering provided by the impedance circuits pass, substantially unattenuated, the original RF frequency pulses and attenuate the other frequency pulses.

FIG. 28 is a diagram of another example of the frequency domain representation of the sampled and held inbound RF signal $G_{sh}(f)$ (of FIG. 15) being filtered by the sample and hold filtering circuit of FIG. 23 or 24. In this example, the holding period (Th) is much less than ¼ of the sampling period (Ts), which yields a relatively flat sin X/X filtering response between −RF and RF. The impedance circuits of the sample and hold circuit filter are tuned, via the processing module, to provide a bandpass filter centered at fs (i.e., the sample frequency). As such, the filtering provided by the impedance circuits pass, substantially unattenuated, the frequency pulses at the sample frequency (−fs and fs) and attenuate the other frequency pulses.

FIG. 29 is a diagram of another example of the frequency domain representation of the sampled and held inbound RF signal $G_{sh}(f)$ (of FIG. 15) being filtered by the sample and hold filtering circuit of FIG. 23 or 24. In this example, the holding period (Th) is much less than ¼ of the sampling period (Ts), which yields a relatively flat sin X/X filtering response between −RF and RF. The impedance circuits of the sample and hold circuit filter are tuned, via the processing module, to provide a bandpass filter baseband. As such, the filtering provided by the impedance circuits pass, substantially unattenuated, the frequency pulses at the baseband and attenuate the other frequency pulses.

Figure 30:
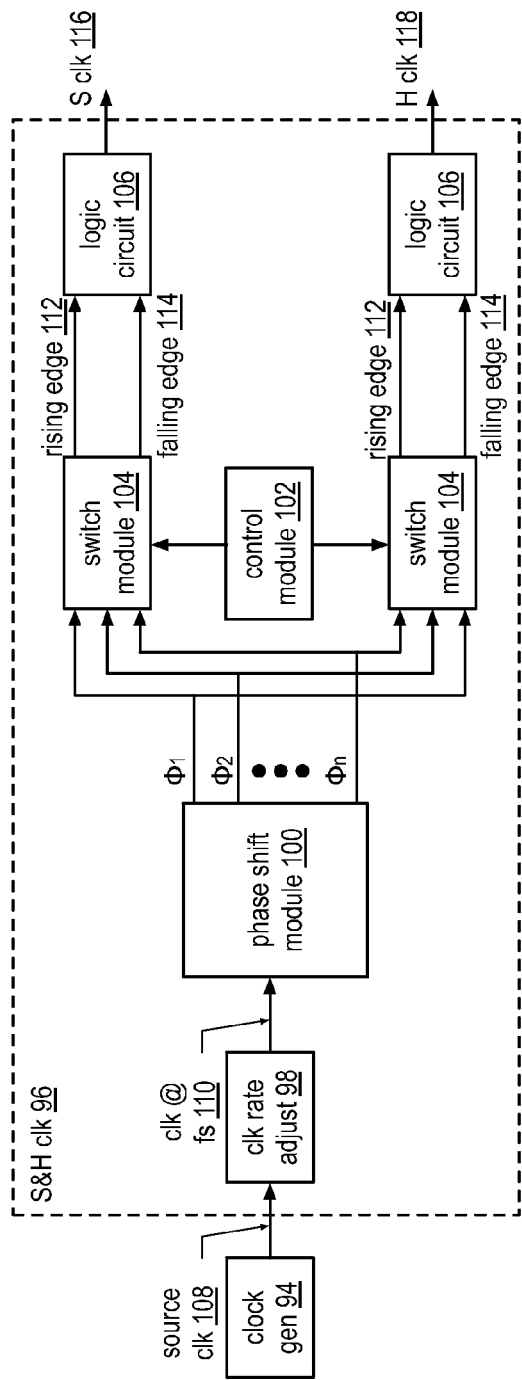
FIG. 30 is a schematic block diagram of an embodiment of a sample and hold clock generator circuit in accordance with the present invention.

FIG. 30 is a schematic block diagram of an embodiment of a sample and hold clock generator circuit 92 coupled to the clock generator 94. The S&H clock circuit 96 includes a clock rate adjust module 98, a phase shift module 100, a control module 102, a plurality of switch modules 104, and a plurality of logic circuits 106.

In an example of operation, the clock rate adjust module 98 receives a source clock 108 from the clock generator 94 and adjusts the rate of the source clock 108 up, down, or null to produce a clock signal at the desired sampling frequency 110. The clock rate adjust module 98 may be implemented as a programmable clock divider, programmable clock multiplier, a digital frequency synthesizer, a phase locked loop, and/or a combination thereof.

Figure 31:
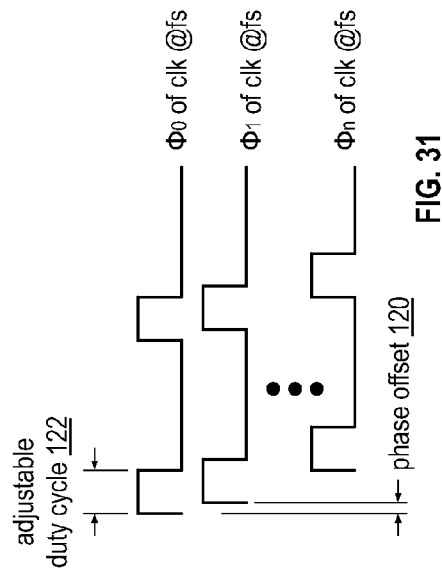
FIG. 31 is a diagram of an example of phase offset clock signals produced by the sample and hold clock generator circuit in accordance with the present invention.

The phase shift module 100, which may be implemented by an adjustable delay line, produces a plurality of phase shift representations of the clock signals at the desired sampling frequency. With reference to FIG. 31, the phase shift module 100 may output a plurality of phased shifted clock signals wherein the first phase shifted clock signal corresponds to the original clock signal and the remaining phase shifted clock signals are successively offset from the first phase shifted clock signal by a phase offset 120 (e.g., a few degrees to 10's of degrees).

Returning to the discussion of FIG. 30, each of the switch modules 104 receives the plurality of phase shifted clock signals. Based on one or more control signals from the control module 102, a switching module 104 selects one of the phase shifted clock signals to represent the rising edge of the clock signal 112 (e.g., the sample (S) clock 116 or the hold (H) clock 118) and selects another one of the phase shifted clock signals to represent the falling edge of the clock 114 (e.g., the sample (S) clock 116 or the hold (H) clock 118). The logic circuit 106 utilizes the selected signals to generate the corresponding clock signal (e.g., the sample (S) clock 116 or the hold (H) clock 118).

Figure 32:
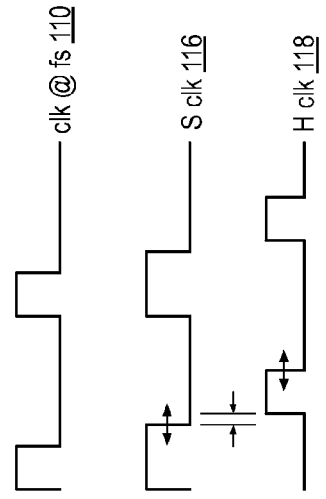
FIG. 32 is a diagram of an example of a sample clock signal and a hold clock signal produced by the sample and hold clock generator circuit in accordance with the present invention.

For example and with reference to FIG. 32, the clock signal at the sampling frequency 110 may be selected to provide the rising edge 112 of the sample clock (S clk) 116 and a subsequent phase shifted clock signal is selected to provide the falling edge 114 of the sample clock 116. The logic circuit 106 combines the clock signals (e.g., a flip flop is set by the rising edge 112 of the first selected clock and reset by the falling edge 114 of the other clock or some other combination of logic circuits 106 to generate a rising edge 112 and falling edge 112 of the desired clock signal from one or more of the selected clock signals) to the desired clock signal. For example, the logic circuit 106 may generate the sample clock signal 116 to have a duty cycle that is greater than, equal to, or less than the duty cycle of the clock signal at the sample frequency (e.g., clk @ fs). Note that the duty cycle of the clock signal at the sampling frequency may be adjustable 122 via the clock rate adjust module 98.

After a delay from the falling edge 114 of the sample clock (which may correspond to one or more phase offsets), a phase shifted clock is selected to provide the rising edge 112 of the hold clock (H clk) 118 and a subsequent phase shifted clock is selected to provide the falling edge 114 of the hold clock 118. The duty cycle of the hold clock 118 is selected to be a desired ratio to the duty cycle of the sample clock to provide the desired bandpass sample and hold filtering. Note that more or less phase shifted clock signals may be selected to generate the desired sample clock or the desired hold clock 118.

In another example of a receiver, the receiver may include a sample and hold module, a programmable discrete time filter module and a conversion module, which converts filtered sample pulse into an inbound baseband signal. The sample and hold module is operable to sample and hold, at a rate corresponding to a multiple of a frequency-dependent component of an inbound wireless signal, the inbound wireless signal to produce a frequency domain sample pulse train. Note that the frequency-dependent component may be the bandwidth (BW) of the inbound wireless signal, an RF or MMW carrier frequency of the inbound wireless signal, the BW plus nearby interference signals of the inbound wireless signal, and/or the RF or MMW carrier frequency plus nearby interference signals of the inbound wireless signal.

The programmable discrete time filter module (which may be a programmable FIR filter, a programmable IIR filter, and/or a programmable FTBPF) is operable to generate control information (e.g., controls and/or settings) in accordance with a desired bandpass filter response. The programmable discrete time filter module is then operable to establish one or more of bandpass region, gain, center frequency, roll-off, and quality factor in accordance with the control information to produce a bandpass filter response. The programmable discrete time filter module is then operable to filter, in accordance with the bandpass filter response, the frequency domain sample pulse train to produce a filtered sample pulse.

Figure 33:
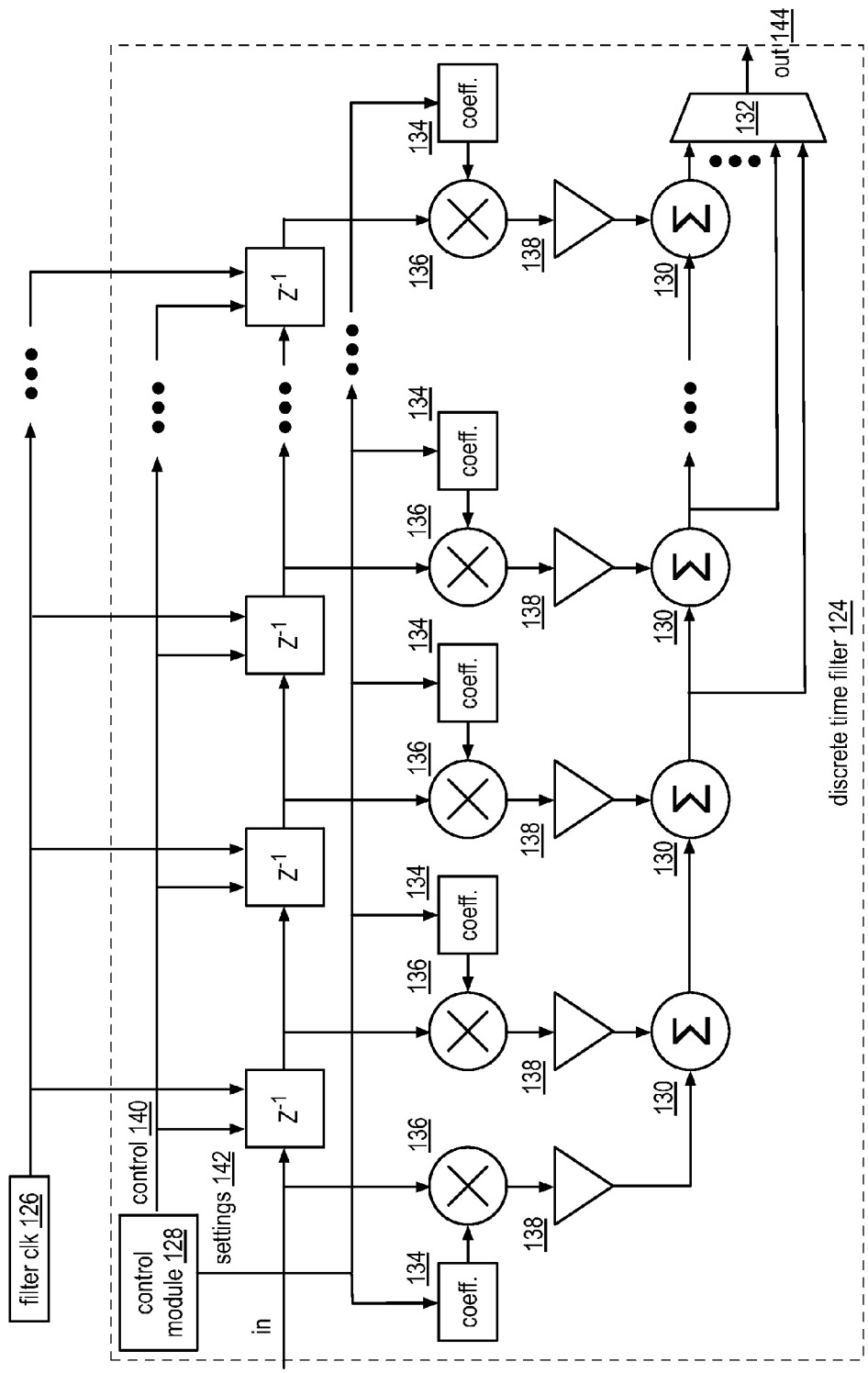
FIG. 33 is a schematic block diagram of an embodiment of a programmable discrete time filter in accordance with the present invention.

FIG. 33 is a schematic block diagram of an embodiment of a programmable discrete time filter 124 that includes a finite impulse response (FIR) topology coupled to the filter clock circuit 126. The programmable FIR filter 124 includes a control module 128, a programmable delay line (e.g., a plurality of delay elements (e.g., $Z_{-1}$)), a plurality of stages, a plurality of summing modules 130 (e.g., analog or digital adders), and an output module 132 (e.g., a multiplexer, a switch module, etc.). Each stage includes a coefficient module 134 (e.g., a buffer), a multiplier 136, and a driver 138.

In an example of operation, the control module 128 sets the number of stages to establish the desired response of the filter 124, sets the coefficients 134 accordingly, and sets the controls 140 for the delay line (e.g., rise time, fall time, resetting or setting of flip-flops, etc.). The control module 128 receives information from the baseband processing module, which it uses to determine the particular settings 142 and control signals 140 (i.e., it determines the desired filter response and the corresponding settings 142). The information corresponds to operation of the wireless transceiver, the operation of the receiver only, and/or some other factors that effect performance of the wireless transceiver or receiver. Alternatively, the baseband processing module determines the desired filter response and provides the settings 142 and control signals 140 to the control module 128.

With the number of stages, coefficients 134, and control signals 140 established, the first delay element of the delay line receives a first sample and hold signal $g_{sh}(t)$ from the sample and hold filter circuit. The first stage also receives the inbound RF signal and processes it accordingly (e.g., scales the magnitude of the sample based on the coefficient, etc.). At the next clock interval (or multiple clock intervals) as provided by the filter clock circuit 126, each of the first delay element and the first stage receives a second sample and hold signal and processes it accordingly. In addition, the previous sample and hold signal is provided to the second delay line element and to the second stage.

The programmable FIR filter 124 continues to receive sample and hold signals from the sample and hold filter circuit and propagates them through the corresponding circuitry to produce an output 144. The output 144 is a filtered representation of the output 144 of the sample and hold circuits, which corresponds to a filtered representation of the inbound RF signal at RF, at IF, at fs, or at baseband.

While the programmable FIR filter 124 is shown with a particular configuration, other configurations of the programmable FIR filter are possible. For example, a stage of the programmable FIR filter may include an amplifier stage instead of the coefficient module 134, multiplier 136, and driver 138. As another example, the delay elements may be independent delay devices (i.e., not part of the delay line) and may be individually programmable (e.g., rise time, fall time, delay, etc.). As yet another example, the discrete time filter 124 may include a clock circuit to adjust the clock received from the filter clock circuit 126.

Figure 34:
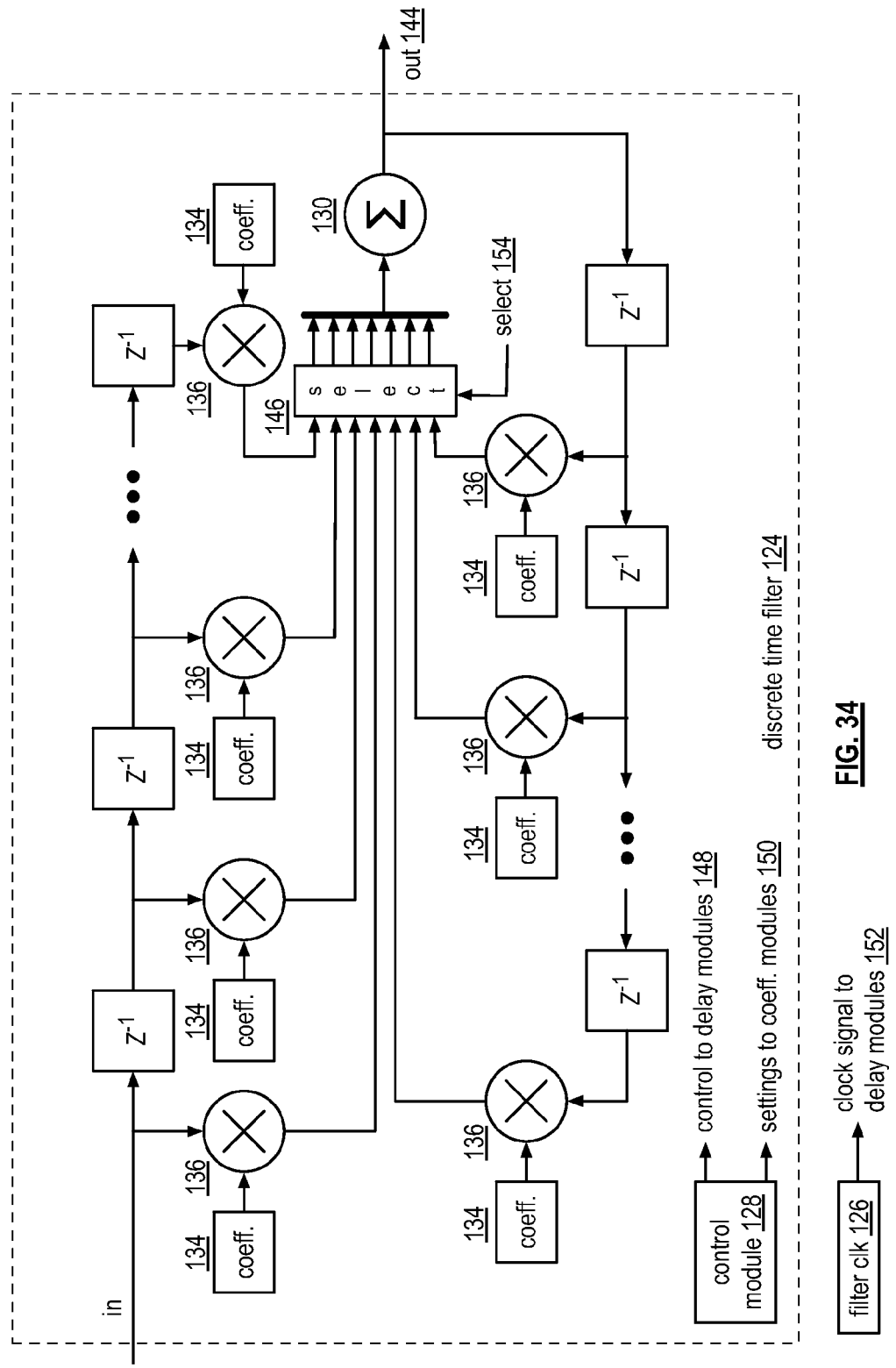
FIG. 34 is a schematic block diagram of another embodiment of a programmable discrete time filter in accordance with the present invention.

FIG. 34 is a schematic block diagram of another embodiment of a programmable discrete time filter 124 having an infinite impulse response (IIR) topology coupled to the filter clock circuit 126. The programmable IIR filter 124 includes a control module 128, two programmable delay lines (e.g., one input set of delay elements (e.g., $Z_{-1}$) and one output set of delay elements), a plurality of stages (e.g., input and output stages, each stage including a coefficient register 134 and a multiplier 136), a summing module 130 (e.g., analog or digital adders), and a selection module 146 (e.g., a multiplexer, a switch module, etc.). Each stage includes a coefficient module 134 (e.g., a buffer), a multiplier 136, and may further include a driver (not shown).

In an example of operation, the control module 128 sets the number of stages to establish the desired response of the filter 124 (e.g., provides a select control signal 154 to the selection module 146), provides settings 150 to the coefficient registers 134 accordingly, and sets the controls for the delay lines 148 (e.g., rise time, fall time, resetting or setting of flip-flops, etc.). The control module 128 receives information from the baseband processing module, which it uses to determine the particular settings and control signals (i.e., it determines the desired filter response and the corresponding settings). The information corresponds to operation of the wireless transceiver, the operation of the receiver only, and/or some other factors that effect performance of the wireless transceiver or receiver. Alternatively, the baseband processing module determines the desired filter response and provides the settings and control signals to the control module 128.

With the number of stages, coefficients 134, and control signals are established, the first delay element of the input delay line receives a first sample and hold signal $g_{sh}(t)$ from the sample and hold filter circuit. The first input stage also receives the inbound RF signal and processes it accordingly (e.g., scales the magnitude of the sample based on the coefficient, etc.). At the next clock interval (or multiple clock intervals) of the clock signal 152 as provided by the filter clock circuit 126, each of the first input delay element and the first input stage receives a second sample and hold signal and processes it accordingly. In addition, the previous sample and hold signal is provided to the second input delay line element, to the second input stage, and to the summing module 130 via the selection module 146 to produce a current output 144. The current output 144 is received by the first delay element of the output delay line.

The programmable IIR filter 124 continues to receive sample and hold signals from the sample and hold filter circuit and propagates them through the corresponding circuitry to produce an output 144. The output 144 is a filtered representation of the output 144 of the sample and hold circuits, which corresponds to a filtered representation of the inbound RF signal at RF, at IF, at fs, or at baseband.

While the programmable IIR filter 124 is shown with a particular configuration, other configurations of the programmable IIR filter 124 are possible. For example, a stage of the programmable IIR filter 124 may include an amplifier stage instead of the coefficient module 134, multiplier 136, and driver. As another example, the delay elements may be independent delay devices (i.e., not part of the delay line) and may be individually programmable (e.g., rise time, fall time, delay, etc.). As yet another example, the discrete time filter 124 may include a clock circuit to adjust the clock received from the filter clock circuit 126.

FIG. 35 is a schematic block diagram of an embodiment of a frequency translation band pass filter (FTBPF) 156 coupled to filter the output of the sample and hold filter circuit 158. The FTBPF 156 includes a plurality of transistors 160 (e.g., a switching network) and a plurality of baseband impedances 162 ($Z_{BB}(s)$).

In an example of operation, the FTBPF 156 provides a high-Q (quality factor) RF filter that filters the output of the sample and hold circuit 158 such that desired frequency pulse (e.g., RF, IF, fs, or baseband) is passed substantially unattenuated to the down conversion module 164 and undesired frequency pulses are attenuated. To achieve such a filter, the baseband impedances 162 (($Z_{BB}(s)$)) collectively provide a low-Q baseband filter having a corresponding filter response, where each of the baseband impedances 162 may be a capacitor, a switched capacitor filter, a switch capacitor resistance, and/or a complex impedance. Note that the impedance of each of the baseband impedances 162 may be the same, different, or combination thereof. Further note that the impedances of each of baseband impedances 162 may be adjusted via control signal from the baseband processing module to adjust the properties of the low-Q baseband filter 166 (e.g., bandwidth, attenuation rate, quality factor, etc.).

The low-Q baseband filter 166 is frequency translated to the desired RF frequency to produce the high-Q RF filter 168 via the clock signals 172 provided by the filter clock 170. FIG. 37 illustrates the frequency translation of the low-Q baseband filter 166 response to the high-Q RF filter 168 response and FIG. 36 illustrates an embodiment of the filter clock circuit 170. As shown in FIG. 36, the filter clock circuit 170 produces four clock signals each having a 25% duty cycle and sequentially phase offset by 900. The clock signals have a frequency corresponding to the carrier frequency of the desired frequency pulse and can be adjusted to better track the desired frequency pulse.

Returning to the discussion of FIG. 35, the FTBPF 156 receives the clock signals 172, which are coupled to the transistors 160 to sequentially couple their respective baseband impedances 162 to the output of the sample and hold filter circuit 158. With the clock rate being at the desired frequency pulse (e.g., at the RF pulse), the low-Q bandpass filter 166 provided by the baseband impedance 162 is shifted to RF (or other desired frequency) creating the high-Q RF bandpass filter 168.

Figure 38:
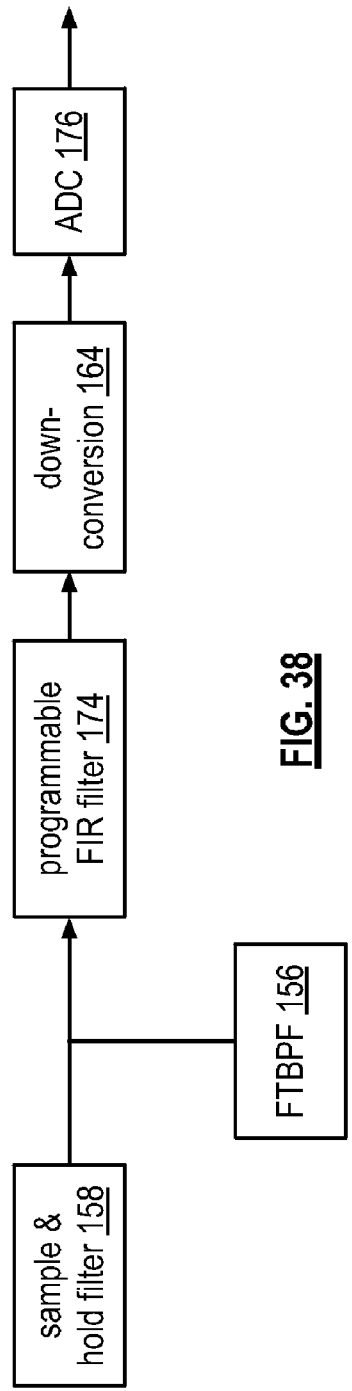
FIG. 38 is a schematic block diagram of another embodiment of a receiver of one or more of the transceivers of FIGS. 1-3 in accordance with the present invention.

FIG. 38 is a schematic block diagram of another embodiment of a receiver of one or more of the transceivers of FIGS. 1-3 that includes a sample and hold filter circuit 158, a FTBPF 156, a programmable FIR filter 174, a down conversion module 164, and an analog to digital converter (ADC) 176. The receiver may further include a band pass filter (BPF), a low noise amplifier (LNA), and a clock circuit module as shown in FIG. 4.

In an example of operation, the sample and hold filter 158 receives an inbound RF signal and samples it at a sampling frequency, which is greater than or equal to two times the bandwidth of the inbound RF signal up to the carrier frequency of the inbound RF signal. The sample and hold filter 158 outputs, in the frequency domain, a plurality of pulses spaced in frequency by the sampling frequency. The sample and hold output includes a pulse at RF, which corresponds to the original inbound RF signal.

The frequency translation bandpass filter (FTBPF) 156 provides an RF filter that passes the RF pulse substantially unattenuated and attenuates the other frequency pulses. The programmable FIR filter 174 (e.g., as discussed with reference to FIG. 33) filters the RF pulse to produce a filtered RF signal, which it provides to the down conversion module 164. The down conversion module 164 converts the output of the programmable FIR 174 to a baseband signal (e.g., an analog symbol stream). The analog to digital converter 176 converts the baseband signal into a digital signal (e.g., an inbound symbol stream).

In an alternate embodiment, the frequency translated band pass filter (FTBPF) 156 is coupled to the input of the sample and hold circuit 158 to function as an RF band pass filter. The programmable FIR filter 174 is programmed to pass the baseband frequency pulse of the output of the sample and hold circuit 158 and to attenuate the other frequency pulses. As such, the output of the programmable FIR filter 174 is at baseband, which eliminates the need for the down conversion module 164.

Figure 39:
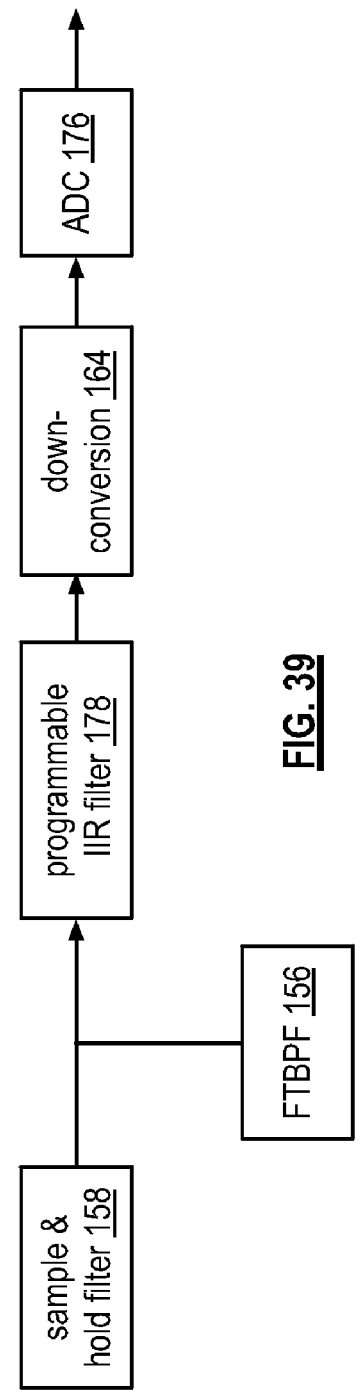
FIG. 39 is a schematic block diagram of another embodiment of a receiver of one or more of the transceivers of FIGS. 1-3 in accordance with the present invention.

FIG. 39 is a schematic block diagram of another embodiment of a receiver of one or more of the transceivers of FIGS. 1-3 that includes a sample and hold filter circuit 158, a FTBPF 156, a programmable IIR filter 178, a down conversion module 164, and an analog to digital converter (ADC) 176. The receiver may further include a band pass filter (BPF), a low noise amplifier (LNA), and a clock circuit module as shown in FIG. 4.

In an example of operation, the sample and hold filter 158 receives an inbound RF signal and samples it at a sampling frequency, which is greater than or equal to two times the bandwidth of the inbound RF signal up to the carrier frequency of the inbound RF signal. The sample and hold filter 158 outputs, in the frequency domain, a plurality of pulses spaced in frequency by the sampling frequency. The sample and hold output includes a pulse at RF, which corresponds to the original inbound RF signal.

The frequency translation bandpass filter (FTBPF) 156 provides an RF filter that passes the RF pulse substantially unattenuated and attenuates the other frequency pulses. The programmable IIR filter 178 (e.g., as discussed with reference to FIG. 34) filters the RF pulse to produce a filtered RF signal, which it provides to the down conversion module 164. The down conversion module 164 converts the output of the programmable IIR 178 to a baseband signal (e.g., an analog symbol stream). The analog to digital converter 176 converts the baseband signal into a digital signal (e.g., an inbound symbol stream).

In an alternate embodiment, the frequency translated band pass filter (FTBPF) 156 is coupled to the input of the sample and hold circuit 158 to function as an RF band pass filter. The programmable IIR filter 178 is programmed to pass the baseband frequency pulse of the output of the sample and hold circuit 158 and to attenuate the other frequency pulses. As such, the output of the programmable IIR filter 178 is at baseband, which eliminates the need for the down conversion module 164.

Figure 40:
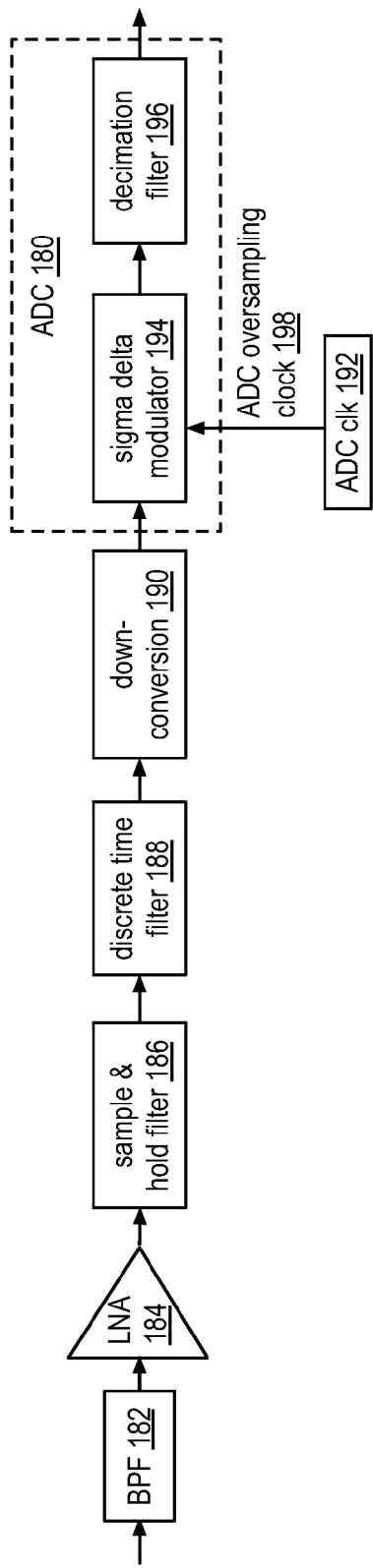
FIG. 40 is a schematic block diagram of an embodiment of an analog to digital converter within a receiver of one or more of the transceivers of FIGS. 1-3 in accordance with the present invention.

FIG. 40 is a schematic block diagram of an embodiment of an analog to digital converter 180 within a receiver of one or more of the transceivers of FIGS. 1-3. The receiver includes a band pass filter (BPF) 182, a low noise amplifier (LNA) 184, a sample and hold filter circuit 186, a discrete time filter 188, a down conversion module 190, an analog to digital converter (ADC) 180, and a clock circuit module (only the analog to digital converter (ADC) clock circuit 192 is shown) that provides an ADC oversampling clock 198. The bandpass filter 182, the low noise amplifier 184, the sample and hold circuit 186, the discrete time filter 188, and the down conversion module 190 function as previously discussed with reference to FIG. 4 and/or other preceding figures.

The ADC 180 includes a sigma delta modulator 184 and decimation filter 196 to convert on analog signal into a digital signal. The sigma delta modulator 194 and/or the decimation filter 196 may be programmable to adjust the analog to digital conversion based on operating conditions of the receiver. For example, for a low data rate wireless communication, the bit resolution of the analog to digital converter 180 may be reduced (e.g., to 8 bits). As another example, for a higher data rate wireless communication, the resolution of the analog to digital converter 180 may be increased (e.g., 12-16 bits). Note that other embodiments of the analog to digital converter 180 may be used. For example, the analog to digital converter 180 may have a flash topology, a successive approximation topology, or other type of analog to digital conversion topology.

Figure 41:
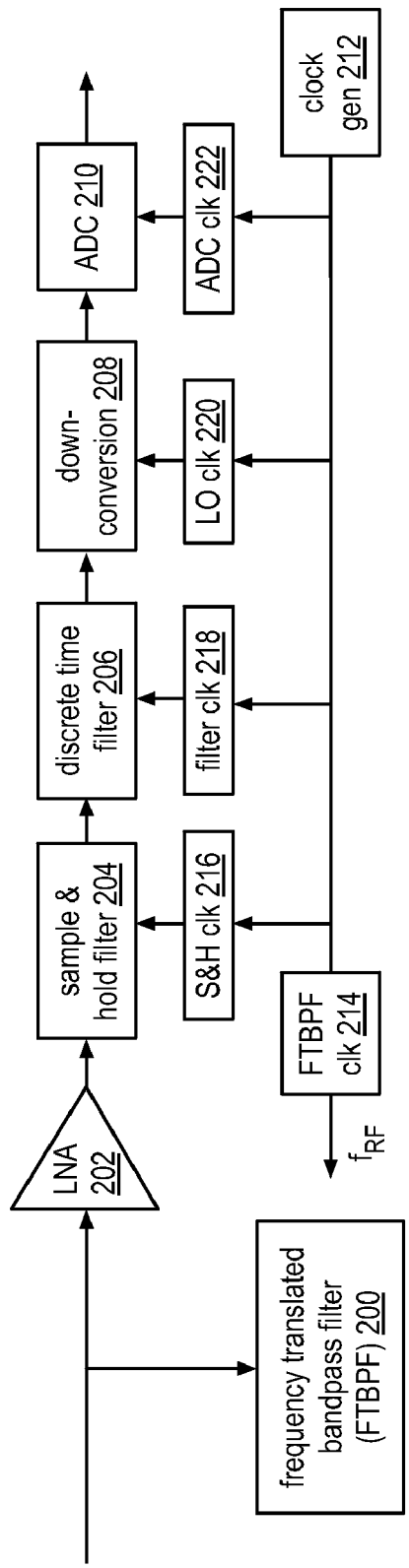
FIG. 41 is a schematic block diagram of another embodiment of a receiver of one or more of the transceivers of FIGS. 1-3 in accordance with the present invention.

FIG. 41 is a schematic block diagram of another embodiment of a receiver of one or more of the transceivers of FIGS. 1-3 that includes a frequency translated band pass filter (FTBPF) 200, a low noise amplifier (LNA) 202, a sample and hold filter circuit 204, a discrete time filter 206, a down conversion module 208, an analog to digital converter (ADC) 210, and a clock circuit module. The clock circuit module includes a clock generator 212, an FTBPF clock 214, a sample and hold (S&H) clock circuit 216, a filter clock circuit 218, a local oscillation (LO) clock circuit 220, and an analog to digital converter (ADC) clock circuit 222.

In an example of operation, the FTBPF 200 filters an inbound RF signal by attenuating out of band signal components and passing, substantially unattenuated, in-band signal components (an example of the FTBPF 200 was described with reference to FIGS. 35-37). The low noise amplifier 202 amplifies the in-band signal components of the inbound RF signal to produce an amplified inbound RF signal.

The sample and hold filter 204 receives the amplified inbound RF signal and samples it in accordance with a sample clock signal and a hold clock signal. The sample and hold filter 204 outputs, in the frequency domain, a plurality of pulses spaced in frequency by the sampling frequency, which includes a pulse at RF (e.g., the original inbound RF signal).

The discrete time filter 206 (which may be a finite impulse response filter, an infinite impulse response filter, a frequency translation bandpass filter, and/or other type of discrete filter) receives the output of the sample and hold filter circuit 204 and filters it. Depending on the filtering response of the discrete time filter 206, the discrete time filter 206 will output, in the frequency domain, a single pulse of the sample and hold output at a particular frequency. The down conversion module 208 converts the output of the discrete time filter 206 to a baseband signal (e.g., an analog symbol stream). The analog to digital converter 210 converts the baseband signal into a digital signal (e.g., an inbound symbol stream.

Figure 42:
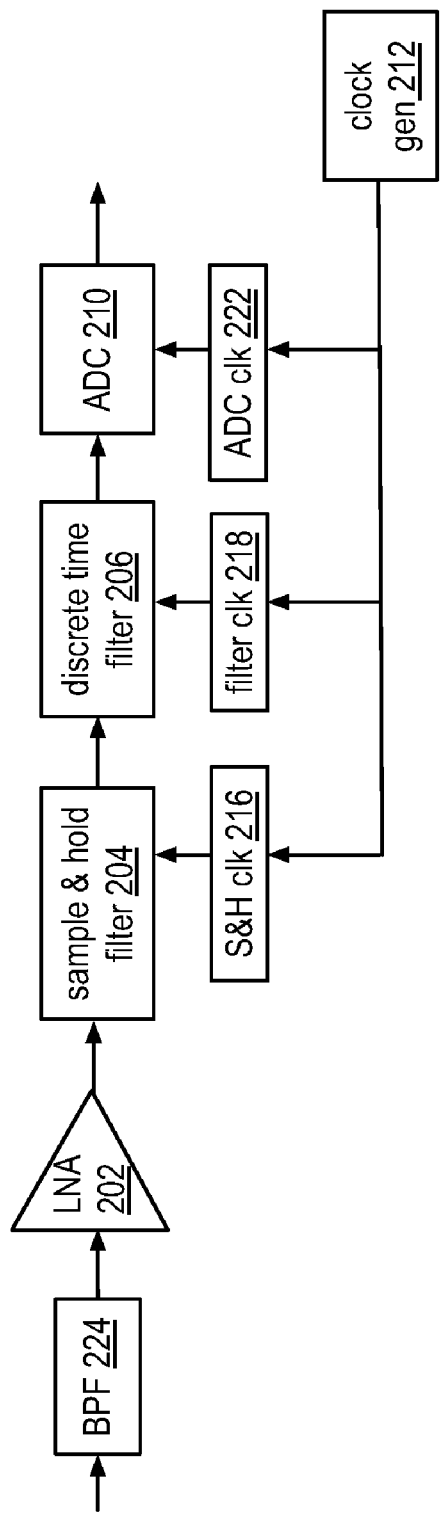
FIG. 42 is a schematic block diagram of another embodiment of a receiver of one or more of the transceivers of FIGS. 1-3 in accordance with the present invention.

FIG. 42 is a schematic block diagram of an embodiment of a receiver of one or more of the transceivers of FIGS. 1-3 that includes a band pass filter (BPF) module 224, sample and hold filter circuit 204, a discrete time filter 206, and an analog to digital converter (ADC) 210. The receiver may further include a low noise amplifier (LNA) 202 and a clock circuit module. The clock circuit module includes a clock generator 212, a sample and hold (S&H) clock circuit 216, a filter clock circuit 218, and an analog to digital converter (ADC) clock circuit 222.

In an example of operation, the band pass filter 224 receives an inbound RF signal from the antenna interface. The band pass filter 224 attenuates out of band signal components and passes, substantially unattenuated, in-band signal components of the inbound RF signal. The bandpass filter module includes a bandpass filter. In an example, the bandpass filter is a frequency translation bandpass filter and the bandpass filter module further includes a buffer module (e.g., one or more buffers and/or inverters) that is operable to buffer the inbound wireless signal prior to filtering.

The low noise amplifier 202 amplifies the in-band signal components of the inbound RF signal to produce an amplified inbound RF signal. With reference to FIG. 43, an inbound RF signal is shown in the frequency domain to have in-band signal components centered about an RF carrier frequency and out of band signal components at the edges of the signal. The output of the low noise amplifier 202 is shown in the time domain and the frequency domain to have the out of band signal components substantially attenuated and, the inbound signal components of the inbound RF signal are substantially unattenuated.

Returning to the discussion of FIG. 42, the sample and hold filter 204 receives the amplified inbound RF signal and samples it in accordance with a sample clock signal and a hold clock signal. With reference to FIG. 44, the sample and hold circuit 204 receives the amplified inbound RF signal (shown in the frequency domain) and samples it at a sampling frequency (fs). In this example, the sampling frequency is greater than or equal to two times the bandwidth of the amplified inbound RF signal. In general, the bandwidth of the amplified inbound RF signal corresponds to the bandwidth of the baseband signal component of the inbound RF signal. For instance, the bandwidth of the baseband inbound signal may be a few hundred kilohertz to tens of megahertz. The sample and hold filter 204 outputs, in the frequency domain, a plurality of pulses spaced in frequency by the sampling frequency, which includes the original inbound RF signal at RF.

Returning to the discussion of FIG. 42, the discrete time filter 206 (which may be a finite impulse response filter, an infinite impulse response filter, a frequency translation bandpass filter, and/or other type of discrete filter) receives the output of the sample and hold filter circuit 204 and filters it to baseband. With reference to FIG. 45, the filter response 228 of the discrete digital filter 204 is at baseband and, as such, its output includes the baseband pulse of the pulse train output of the sample and hold filter circuit 204. The analog to digital converter 210 converts the baseband signal into a digital signal (e.g., an inbound symbol stream), which may be process as previously described with reference to FIGS. 1-3.

Figure 46:
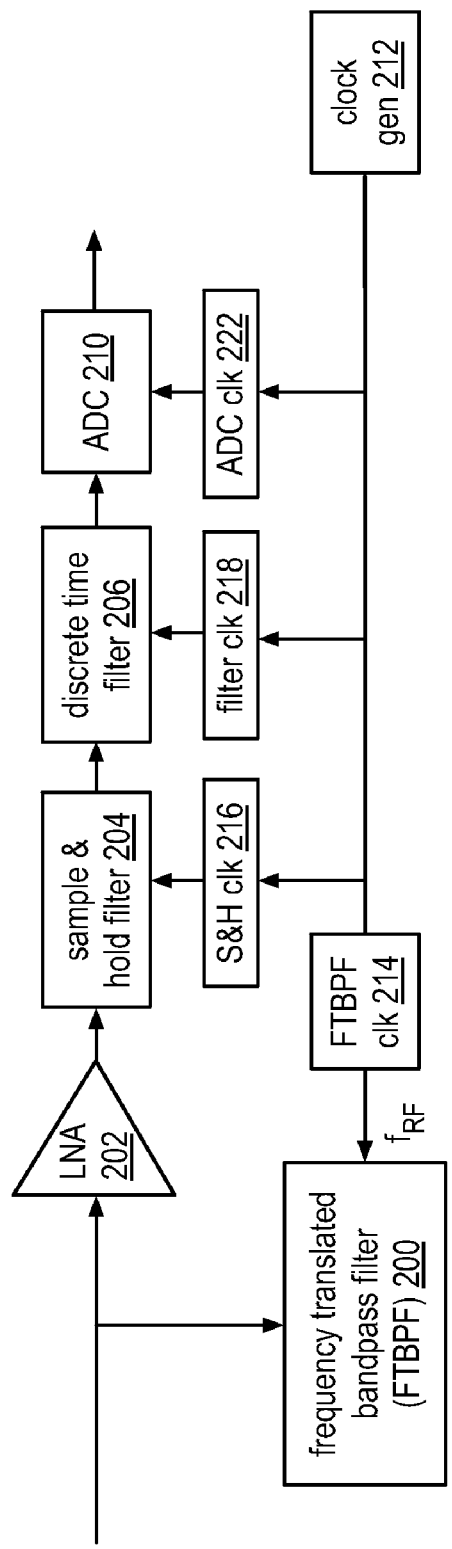
FIG. 46 is a schematic block diagram of another embodiment of a receiver of one or more of the transceivers of FIGS. 1-3 in accordance with the present invention.

FIG. 46 is a schematic block diagram of another embodiment of a receiver of one or more of the transceivers of FIGS. 1-3 that includes a frequency translated band pass filter (FTBPF) 200, a low noise amplifier (LNA) 202, a sample and hold filter circuit 204, a discrete time filter 206, an analog to digital converter (ADC) 210, and a clock circuit module. The clock circuit module includes a clock generator 212, an FTBPF clock circuit 214, a sample and hold (S&H) clock circuit 216, a filter clock circuit 218, and an analog to digital converter (ADC) clock circuit 222.

In an example of operation, the FTBPF 200 filters an inbound RF signal by attenuating out of band signal components and passing, substantially unattenuated, in-band signal components of the inbound RF signal. The low noise amplifier 202 amplifies the in-band signal components of the inbound RF signal to produce an amplified inbound RF signal. As an example, the output of the LNA 202 is similar to the output of the LNA 202 shown in FIG. 43.

The sample and hold filter 204 receives the amplified inbound RF signal and samples it in accordance with a sample clock signal and a hold clock signal. With reference to FIG. 44, the sample and hold circuit 204 receives the amplified inbound RF signal (shown in the frequency domain) and samples it at a sampling frequency (fs). In this example, the sampling frequency is greater than or equal to two times the bandwidth of the amplified inbound RF signal.

Returning to the discussion of FIG. 46, the discrete time filter 206 (which may be a finite impulse response filter, an infinite impulse response filter, a frequency translation bandpass filter, and/or other type of discrete filter) receives the output of the sample and hold filter circuit 204 and filters it to baseband. With reference to FIG. 45, the filter response of the discrete digital filter 206 is at baseband and, as such, its output includes the baseband pulse of the pulse train output of the sample and hold filter circuit 204. The analog to digital converter 210 converts the baseband signal into a digital signal (e.g., an inbound symbol stream), which may be process as previously described with reference to FIGS. 1-3.

Figure 47:
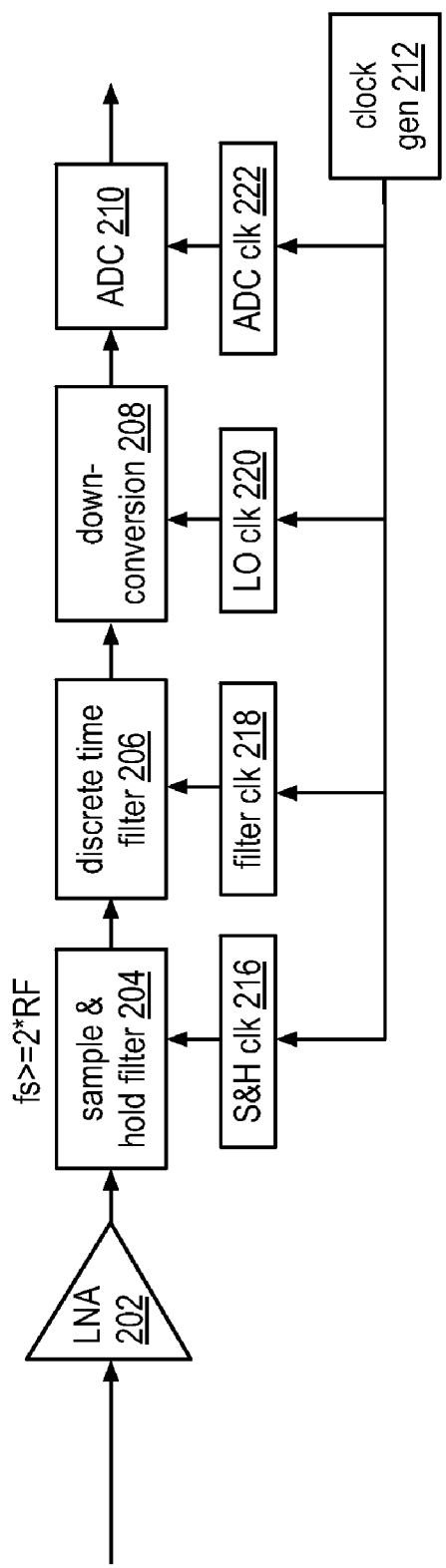
FIG. 47 is a schematic block diagram of another embodiment of a receiver of one or more of the transceivers of FIGS. 1-3 in accordance with the present invention.

FIG. 47 is a schematic block diagram of another embodiment of a receiver of one or more of the transceivers of FIGS. 1-3 that includes a sample and hold filter circuit 204, a discrete time filter 206, and a down conversion module 208. The receiver may further include a low noise amplifier (LNA) 202, an analog to digital converter (ADC) 210, and a clock circuit module. The clock circuit module includes a clock generator 212, a sample and hold (S&H) clock circuit 216, a filter clock circuit 218, a local oscillation (LO) clock circuit 220, and an analog to digital converter (ADC) clock circuit 222. Note that, in this embodiment, the receiver may not include an RF BPF or it includes a wideband RF BPF (e.g., has a band pass region that covers more than one frequency band).

In an example of operation, the low noise amplifier 202 amplifies the inbound RF signal to produce an amplified inbound RF signal. With reference to FIG. 48, an inbound RF signal 226 is shown in the frequency domain to have in-band signal components centered about an RF carrier frequency and out of band signal components at the edges of the signal. The output of the low noise amplifier 202 is shown in the time domain and the frequency domain to include the out of band signal components and the inbound signal components of the inbound RF signal.

Returning to the discussion of FIG. 47, the sample and hold filter 204 receives the amplified inbound RF signal and samples it in accordance with a sample clock signal and a hold clock signal. With reference to FIG. 49, the sample and hold circuit 204 receives the amplified inbound RF signal (shown in the frequency domain) and samples it at a sampling frequency (fs). In this example, the sampling frequency is greater than or equal to two times RF or MMW (e.g., the carrier frequency of the inbound RF or MMW signal). The sample and hold filter 204 outputs, in the frequency domain, a plurality of pulses spaced in frequency by the sampling frequency. The sample and hold output includes a pulse at RF, which corresponds to the original inbound RF signal 230.

Returning to the discussion of FIG. 47, the discrete time filter 206 (which may be a finite impulse response filter, an infinite impulse response filter, a frequency translation bandpass filter, and/or other type of discrete filter) receives the output of the sample and hold filter circuit 204 and filters it to RF. With reference to FIG. 50, the filter response 228 of the discrete digital filter 206 is at RF and, as such, its output includes the RF pulse of the pulse train output of the sample and hold filter circuit 204.

Returning to the discussion of FIG. 47, the down conversion module 208 converts the output of the discrete time filter 206, which is at a wireless frequency (e.g., the RF or MMW carrier frequency of the inbound wireless signal) to a baseband signal (e.g., an analog symbol stream) as shown in FIG. 51. The analog to digital converter 210 converts the baseband signal into a digital signal (e.g., an inbound symbol stream), which may be process as previously described with reference to FIGS. 1-3.

Figure 52:
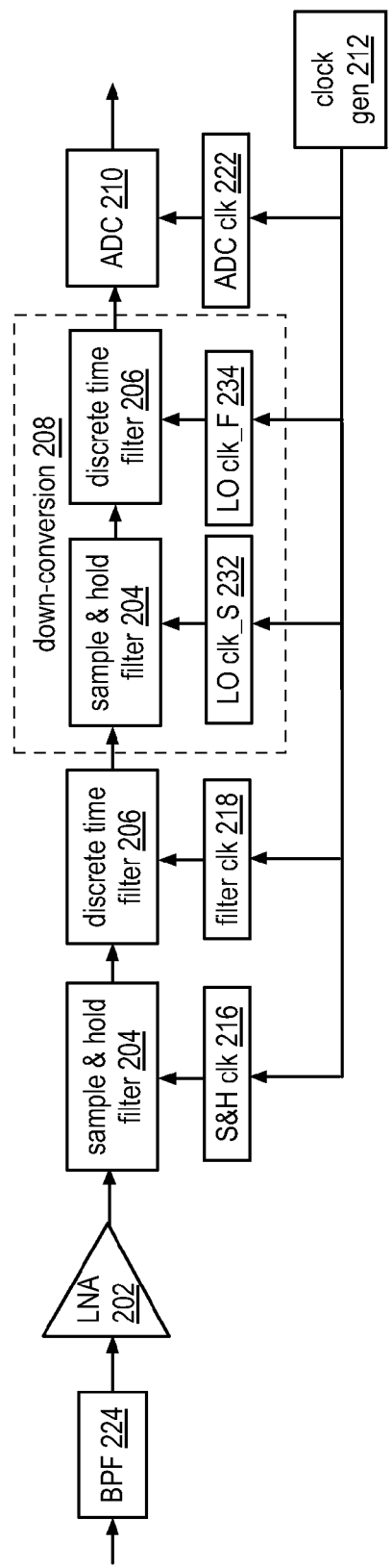
FIG. 52 is a schematic block diagram of another embodiment of a receiver of one or more of the transceivers of FIGS. 1-3 in accordance with the present invention.

FIG. 52 is a schematic block diagram of another embodiment of a receiver of one or more of the transceivers of FIGS. 1-3 that includes a band pass filter (BPF) 224, a low noise amplifier (LNA) 202, a sample and hold filter circuit 204, a discrete time filter 206, a programmable conversion module, which may include a down conversion module 208, and an analog to digital converter (ADC) 210. The receiver may further include a clock circuit module that includes a clock generator 212, a sample and hold (S&H) clock circuit 216, a filter clock circuit 218, a local oscillation (LO) clock circuit 232-234, and an analog to digital converter (ADC) clock circuit 222. The down conversion module 208 includes a sample and hold filter 204 and a discrete time filter 206.

In an example of operation, the band pass filter 224 receives an inbound RF signal from the antenna interface. The band pass filter 224 attenuates out of band signal components and passes, substantially unattenuated, in-band signal components of the inbound RF signal. The low noise amplifier 202 amplifies the in-band signal components of the inbound RF signal to produce an amplified inbound RF signal.

The sample and hold filter 204 receives the amplified inbound RF signal and samples it in accordance with a sample clock signal and a hold clock signal, which are established in accordance with control information (e.g., information to establish sample rate, ratio of sampling to holding, impedance module tuning, etc.). With reference to FIG. 53, the sample and hold circuit 204 receives the amplified inbound RF signal (shown in the frequency domain) and samples it at a sampling frequency (fs). In this example, the sampling frequency is greater than or equal to two times the bandwidth of the amplified inbound RF signal. The sample and hold filter 204 outputs, in the frequency domain, a plurality of pulses spaced in frequency by the sampling frequency. The sample and hold output includes a pulse at RF, which corresponds to the original inbound RF signal.

Returning to the discussion of FIG. 52, the discrete time filter 206 (which may be a finite impulse response filter, an infinite impulse response filter, a frequency translation bandpass filter, and/or other type of discrete filter) receives the output of the sample and hold filter circuit 204 and filters it to an intermediate frequency (IF=RF−n*fs, where n is an integer greater than or equal to 1). With reference to FIG. 54, the filter response of the discrete digital filter 206 is at IF and, as such, its output includes the IF pulse of the pulse train output of the sample and hold filter circuit 204.

Returning to the discussion of FIG. 52, the down conversion module 208 receives the IF signal from the discrete digital filter 206 via a sample and hold filter circuit 204. With reference to FIG. 55, the sample and hold circuit 204 receives the IF signal and samples it at a sampling frequency (fs). In this example, the sampling frequency is greater than or equal to two times the bandwidth of the IF signal, which may be less than or equal to the bandwidth of the inbound RF signal. The sample and hold filter 204 outputs, in the frequency domain, a plurality of pulses spaced in frequency by the sampling frequency. The sample and hold output includes a pulse at IF, which corresponds to its original input IF signal.

With reference to FIG. 56, the discrete time filter 206 (which may be a finite impulse response filter, an infinite impulse response filter, a frequency translation bandpass filter, and/or other type of discrete filter) receives the output of the sample and hold filter circuit 204 of the down conversion module 206 and filters it baseband. As shown, the filter response 228 of the discrete digital filter 206 is at baseband and, as such, its output includes the baseband pulse of the pulse train output of the sample and hold filter circuit 204. The analog to digital converter 210 converts the baseband signal into a digital signal (e.g., an inbound symbol stream), which may be process as previously described with reference to FIGS. 1-3.

Figure 57:
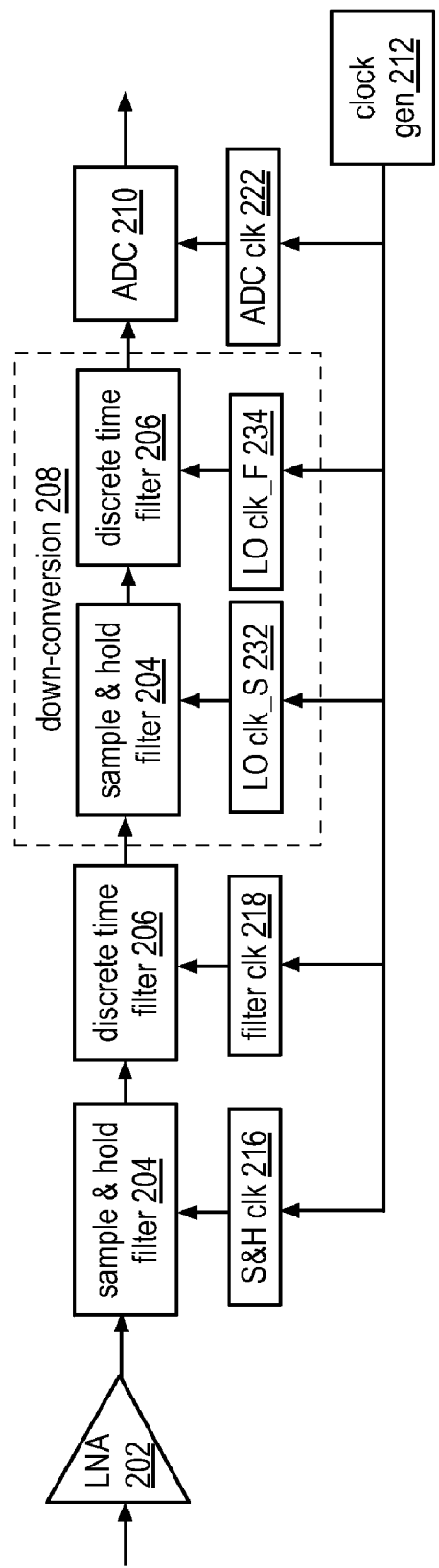
FIG. 57 is a schematic block diagram of another embodiment of a receiver of one or more of the transceivers of FIGS. 1-3 in accordance with the present invention.

FIG. 57 is a schematic block diagram of another embodiment of a receiver of one or more of the transceivers of FIGS. 1-3 that includes a low noise amplifier (LNA) 202, a sample and hold filter circuit 204, a discrete time filter 206, a down conversion module 208, an analog to digital converter (ADC) 210, and a clock circuit module. The clock circuit module includes a clock generator 212, a sample and hold (S&H) clock circuit 216, a filter clock circuit 218, a local oscillation (LO) clock circuit 232-234, and an analog to digital converter (ADC) clock circuit 222. The down conversion module 208 includes a sample and hold filter 204 and a discrete time filter 206. Note that, in this embodiment, the receiver may not include an RF BPF or it includes a wideband RF BPF (e.g., has a band pass region that covers more than one frequency band).

In an example of operation, the low noise amplifier 202 amplifies the inbound RF signal to produce an amplified inbound RF signal. The sample and hold filter 204 receives the amplified inbound RF signal and samples it in accordance with a sample clock signal and a hold clock signal. With reference to FIG. 58, the sample and hold circuit 204 receives the amplified inbound RF signal and samples it at a sampling frequency (fs). In this example, the sampling frequency is greater than or equal to two times RF (e.g., the carrier frequency of the inbound RF signal). The sample and hold filter 204 outputs, in the frequency domain, a plurality of pulses spaced in frequency by the sampling frequency. The sample and hold output includes a pulse at RF, which corresponds to the original inbound RF signal 230.

Returning to the discussion of FIG. 57, the discrete time filter 206 (which may be a finite impulse response filter, an infinite impulse response filter, a frequency translation bandpass filter, and/or other type of discrete filter) receives the output of the sample and hold filter circuit 204 and filters it to RF. With reference to FIG. 59, the filter response 228 of the discrete digital filter 206 is at RF and, as such, its output includes the RF pulse of the pulse train output of the sample and hold filter circuit 204.

Returning to the discussion of FIG. 57, the down conversion module 208 receives the IF signal from the discrete digital filter 206 via a sample and hold filter circuit 204. With reference to FIG. 60, the sample and hold circuit 204 receives the IF signal and samples it at a sampling frequency (fs). In this example, the sampling frequency is greater than or equal to two times the bandwidth of the inbound RF signal. The sample and hold filter 204 outputs, in the frequency domain, a plurality of pulses spaced in frequency by the sampling frequency. The sample and hold output includes a pulse at RF, which corresponds to its original input RF signal.

With reference to FIG. 61, the discrete time filter 206 (which may be a finite impulse response filter, an infinite impulse response filter, a frequency translation bandpass filter, and/or other type of discrete filter) receives the output of the sample and hold filter circuit 204 of the down conversion module 208 and filters it baseband. As shown, the filter response of the discrete digital filter 206 is at baseband and, as such, its output includes the baseband pulse of the pulse train output of the sample and hold filter circuit 204. The analog to digital converter 210 converts the baseband signal into a digital signal (e.g., an inbound symbol stream), which may be process as previously described with reference to FIGS. 1-3.

Figure 62:
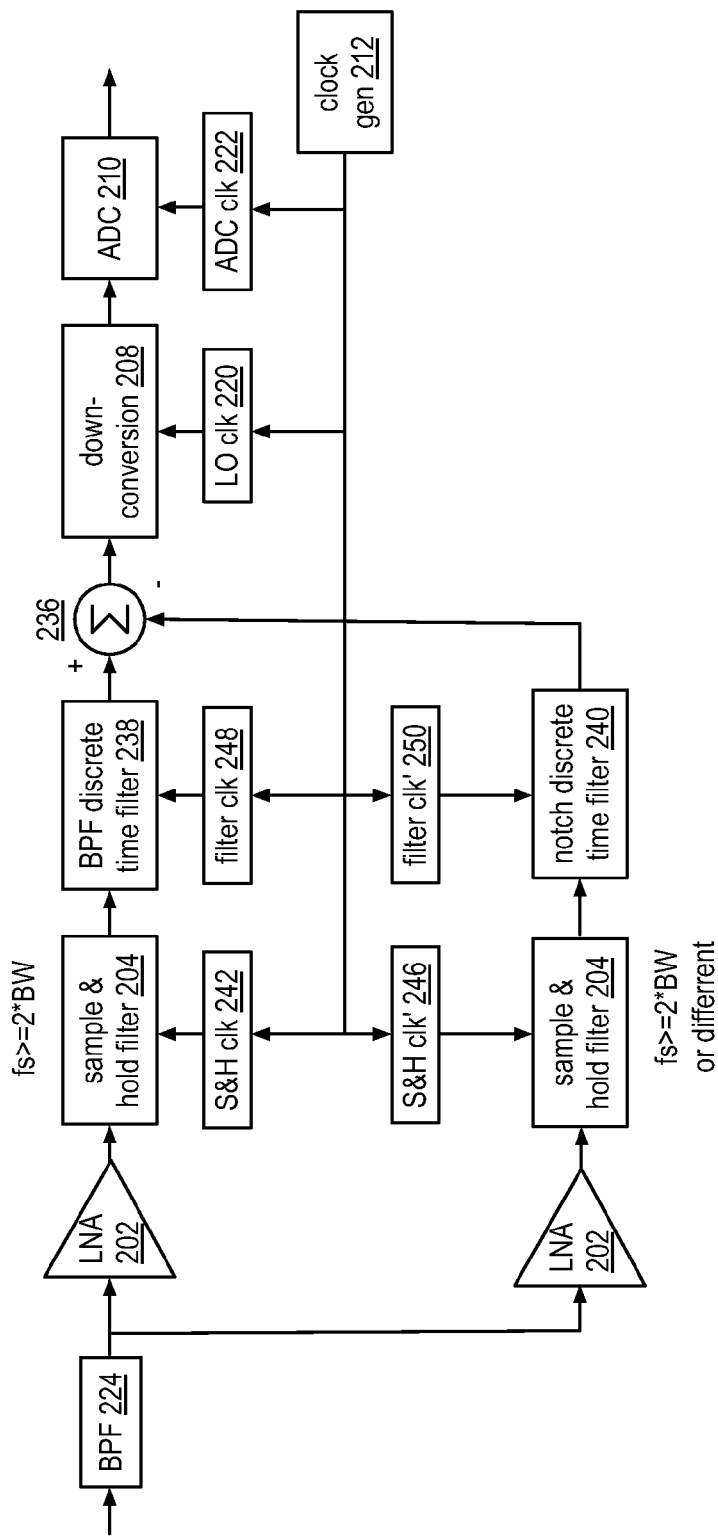
FIG. 62 is a schematic block diagram of another embodiment of a receiver of one or more of the transceivers of FIGS. 1-3 in accordance with the present invention.

FIG. 62 is a schematic block diagram of another embodiment of a receiver of one or more of the transceivers of FIGS. 1-3 that includes a bandpass filter 224, a forward RF path, a blocker RF path, a combining module 236, a down conversion module 208, an analog to digital converter 210, and a clock generation circuit module. The forward RF path includes a low noise amplifier 202, a sample and hold filter circuit 204, and a band pass frequency discrete time filter 238. The blocker RF path includes a low noise amplifier 202, a sample and hold filter circuit 204, and a notch discrete time filter 240. The clock circuit module includes a clock generator 212, a forward path sample and hold (S&H) clock circuit 242, a forward path filter clock circuit 248, a blocker path sample and hold (S&H) clock circuit 246, a blocker path filter clock circuit 250, a local oscillation (LO) clock circuit 220, and an analog to digital converter (ADC) clock circuit 222.

In an example of operation, the band pass filter 224 receives an inbound RF signal from the antenna interface. The band pass filter 224 attenuates out of band signal components and passes, substantially unattenuated, in-band signal components of the inbound RF signal to produce a filtered inbound RF signal. Nevertheless, due to the signal strength of a blocking signal (e.g., an interfering signal having a frequency close to the frequency of the inbound RF signal, the transmit signal, or some other undesired signal) component passes through the RF BPF 224. As such, the filtered inbound RF signal includes one or more blocker components. The RF BPF 224 provides the filtered inbound RF signal to the forward RF path and the blocker RF path.

Figure 63:
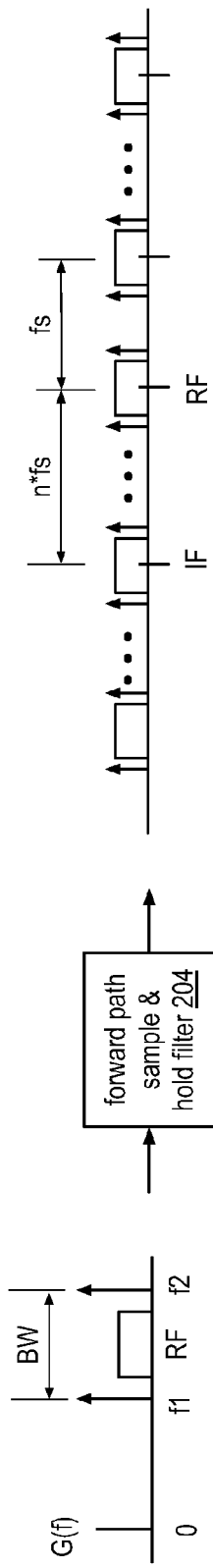
FIG. 63 is a diagram of an example of a frequency domain representation of an input and an output of a forward path sample and hold filter circuit of the receiver of FIG. 62 in accordance with the present invention.

The low noise amplifier 202 of the forward RF path amplifies the filtered inbound RF signal to produce an amplified inbound RF signal. The sample and hold filter 204 of the forward RF path receives the amplified inbound RF signal and samples it in accordance with a sample clock signal and a hold clock signal. With reference to FIG. 63, the forward path sample and hold circuit 204 receives the amplified inbound RF signal (shown in the frequency domain to include a desired inbound RF signal component and one or more blockers at f1 and/or at f2) and samples it at a sampling frequency (fs). In this example, the sampling frequency is greater than or equal to two times the bandwidth of the amplified inbound RF signal and the potential blockers. In this manner, the blockers, which are too close and too strong to effectively filter, are passed (and may be attenuated). The sample and hold filter 204 outputs, in the frequency domain, a plurality of pulses spaced in frequency by the sampling frequency. Each pulse of the frequency pulse train includes one or more blocker components and the desired inbound RF component. The sample and hold output includes a pulse at RF, which corresponds to the original inbound RF signal.

Figure 64:
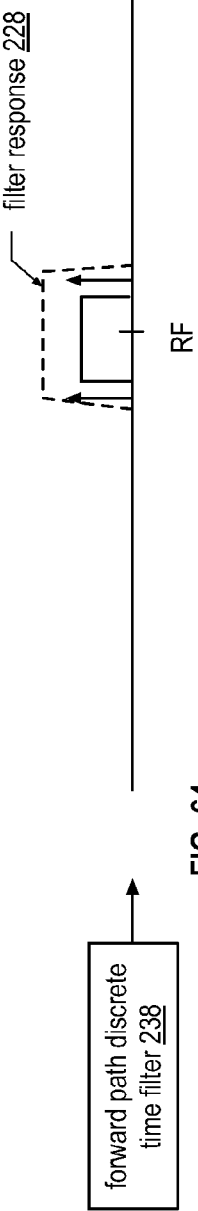
FIG. 64 is a diagram of an example of a frequency domain representation of an output of a forward path discrete time filter of the receiver of FIG. 62 in accordance with the present invention.

Returning to the discussion of FIG. 62, the forward path discrete time filter 238 (which may be a finite impulse response filter, an infinite impulse response filter, a frequency translation bandpass filter, and/or other type of discrete filter) receives the output of the forward path sample and hold filter circuit 204 and filters it to RF. With reference to FIG. 64, the filter response 228 of the discrete digital filter 238 is at RF and has a bandpass region that includes the one or more blockers. As such, the output of the forward path discrete time filter 238 includes the RF pulse (e.g., the desired inbound RF signal component and the one or more blockers) of the pulse train output of the sample and hold filter circuit 204.

Figure 65:
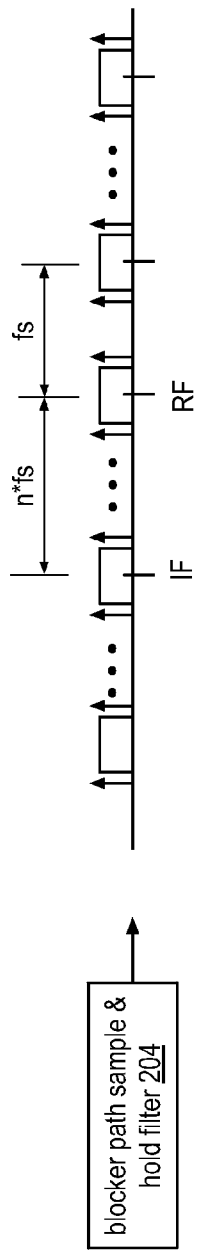
FIG. 65 is a diagram of an example of a frequency domain representation of an output of a blocker path sample and hold filter circuit of the receiver of FIG. 62 in accordance with the present invention.

Returning to the discussion of FIG. 62, the low noise amplifier 202 of the blocker RF path amplifies the filtered inbound RF signal to produce an amplified inbound RF signal. The sample and hold filter 204 of the blocker RF path receives the amplified inbound RF signal and samples it in accordance with a sample clock signal and a hold clock signal. With reference to FIG. 65, the blocker path sample and hold circuit 204 receives the amplified inbound RF signal (shown in the frequency domain to include a desired inbound RF signal component and one or more blockers at f1 and/or at f2) and samples it at a sampling frequency (fs). In this example, the sampling frequency is greater than or equal to two times the bandwidth of the amplified inbound RF signal and the potential blockers. In this manner, the blockers, which are too close and too strong to effectively filter, are passed (and may be attenuated). The sample and hold filter 204 outputs, in the frequency domain, a plurality of pulses spaced in frequency by the sampling frequency. Each pulse of the frequency pulse train includes one or more blocker components and the desired inbound RF component. The sample and hold output includes a pulse at RF, which corresponds to the original inbound RF signal.

Figure 66:
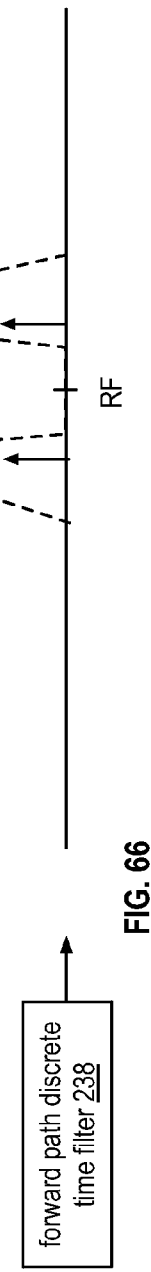
FIG. 66 is a diagram of an example of a frequency domain representation of an output of a blocker path discrete time filter of the receiver of FIG. 62 in accordance with the present invention.

Returning to the discussion of FIG. 62, the blocker path discrete time filter 240 (which may be a finite impulse response filter, an infinite impulse response filter, a frequency translation bandpass filter, and/or other type of discrete filter) receives the output of the blocker path sample and hold filter circuit 204 and notch filters it to RF. With reference to FIG. 66, the filter response 252 of the discrete digital filter 240 is a notch filter 240 at RF that attenuates the desired inbound RF signal component and passes the one or more blockers. As such, the output of the blocker path discrete time filter 240 includes the one or more blockers of the RF pulse of the pulse train.

Returning to the discussion of FIG. 62, the combining module 236 combines (e.g., subtracts, etc.) the output of the blocker path discrete time filter 240 from the output of the forward path discrete time filter 238. Since the blocker path includes the one or more blocker signals only, when it is subtracted from the forward path signal, which includes the desired inbound RF signal component and the one or more blockers, the resultant is the desired inbound RF signal component.

The down conversion module 208 may be implemented using analog circuitry (e.g., a mixer, a local oscillation, and one or more pass filters) or it may be implemented as discrete time digital circuitry (e.g., a sample and hold circuit 204 and a discrete time filter 238-240). Regardless of the implementation, the down conversion module 208 converts the output of the subtraction module 236 to a baseband signal (e.g., an analog symbol stream). The analog to digital converter 210 converts the baseband signal into a digital signal (e.g., an inbound symbol stream), which may be process as previously described with reference to FIGS. 1-3. Note that, if the output of the combining module is at baseband, then the down conversion module may be omitted and the ADC 210 converts the filtered inbound baseband signal into a digital inbound baseband signal.

Figure 67:
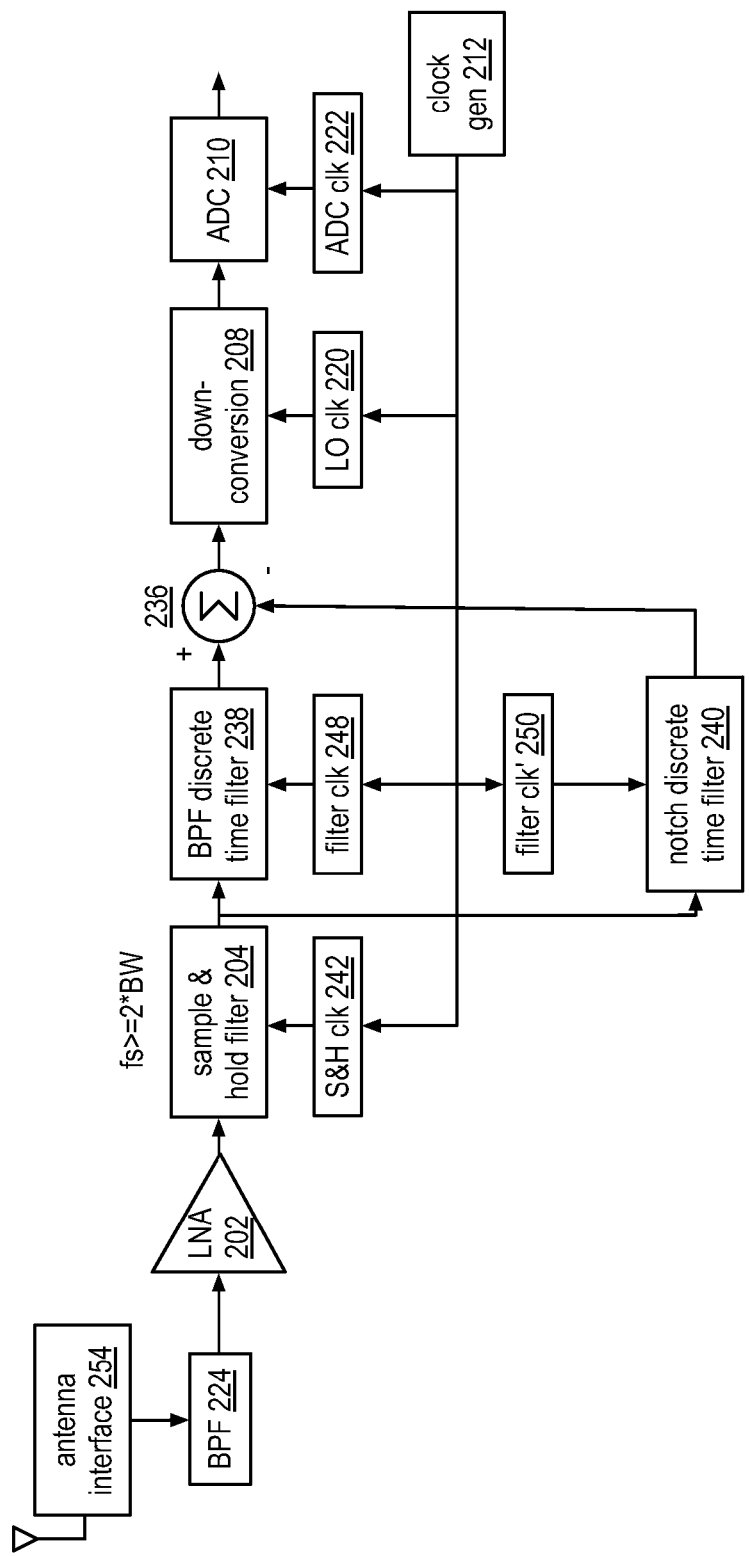
FIG. 67 is a schematic block diagram of another embodiment of a receiver of one or more of the transceivers of FIGS. 1-3 in accordance with the present invention.

FIG. 67 is a schematic block diagram of another embodiment of a receiver of one or more of the transceivers of FIGS. 1-3 that includes a bandpass filter 224, a low noise amplifier 202, a sample and hold filter circuit 204, a band pass frequency discrete time filter 238, a notch discrete time filter 240, a combining module 236, a down conversion module 208, an analog to digital converter 210, and a clock generation circuit module. The clock circuit module includes a clock generator 212, a sample and hold (S&H) clock circuit 242, a BPF filter clock circuit 248, a notch filter clock circuit 250, a local oscillation (LO) clock circuit 220, and an analog to digital converter (ADC) clock circuit 222.

In an example of operation, the band pass filter 224 receives an inbound RF signal from the antenna interface 254. The band pass filter 224 attenuates out of band signal components and passes, substantially unattenuated, in-band signal components of the inbound RF signal to produce a filtered inbound RF signal. Nevertheless, due to the signal strength of a blocking signal (e.g., an interfering signal having a frequency close to the frequency of the inbound RF signal, the transmit signal, or some other undesired signal) component passes through the RF BPF 224. As such, the filtered inbound RF signal includes one or more blocker components. The RF BPF 224 provides the filtered inbound RF signal to the forward RF path and the blocker RF path.

The low noise amplifier 202 amplifies the filtered inbound RF signal to produce an amplified inbound RF signal. The sample and hold filter 204 receives the amplified inbound RF signal and samples it in accordance with a sample clock signal and a hold clock signal. With reference to FIG. 63, the sample and hold circuit 204 receives the amplified inbound RF signal (shown in the frequency domain to include a desired inbound RF signal component and one or more blockers at f1 and/or at f2) and samples it at a sampling frequency (fs) to produce a frequency pulse train.

Returning to the discussion of FIG. 67, the BPF discrete time filter 238 (which may be a finite impulse response filter, an infinite impulse response filter, a frequency translation bandpass filter, and/or other type of discrete filter) receives the output of the sample and hold filter circuit 204 and filters it to RF. With reference to FIG. 64, the filter response 228 of the discrete digital filter 238 is at RF and has a bandpass region that includes the one or more blockers. As such, the output of the forward path discrete time filter 238 includes the RF pulse (e.g., the desired inbound RF signal component and the one or more blockers) of the pulse train output of the sample and hold filter circuit 204.

Returning to the discussion of FIG. 67, the notch discrete time filter 240 (which may be a finite impulse response filter, an infinite impulse response filter, a frequency translation bandpass filter, and/or other type of discrete filter) receives the output of the sample and hold filter circuit 204 and notch filters it to RF. With reference to FIG. 66, the filter response 252 of the discrete digital filter 240 is a notch filter 240 at RF that attenuates the desired inbound RF signal component and passes the one or more blockers. As such, the output of the blocker path discrete time filter 240 includes the one or more blockers of the RF pulse of the pulse train.

Returning to the discussion of FIG. 67, the combining module 236 combines the output of the blocker path discrete time filter 240 from the output of the forward path discrete time filter 238. The down conversion module 208 converts the output of the subtraction module 236 to a baseband signal (e.g., an analog symbol stream). The analog to digital converter 210 converts the baseband signal into a digital signal (e.g., an inbound symbol stream), which may be process as previously described with reference to FIGS. 1-3.

Figure 68:
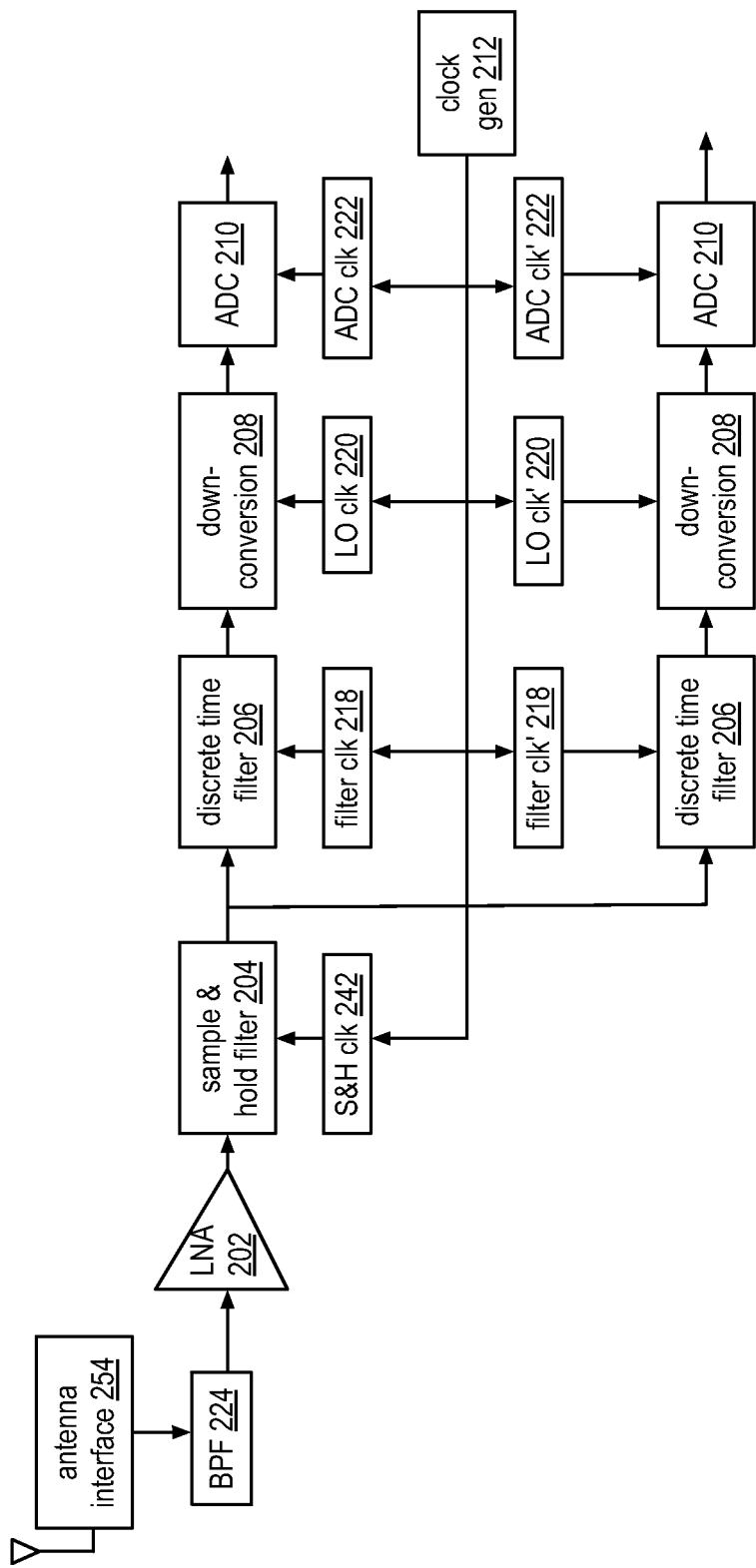
FIG. 68 is a schematic block diagram of another embodiment of a receiver of one or more of the transceivers of FIGS. 1-3 in accordance with the present invention.

FIG. 68 is a schematic block diagram of another embodiment of a receiver of one or more of the transceivers of FIGS. 1-3 that includes a bandpass filter 224, a low noise amplifier 202, a sample and hold circuit 204, a clock generation circuit, and a plurality of down conversion paths. Each of the down conversion paths includes a discrete time filter 206, a down conversion module 208, and an analog to digital converter 210. The clock generation circuit includes a clock generator 212, a sample and hold clock circuit 242, a plurality of filter clock circuits 218, a plurality of local oscillation (LO) clock circuits 220, and a plurality of analog to digital converter clock circuits 222.

In an example of operation, the band pass filter 224 receives an inbound RF signal from the antenna interface 254. The band pass filter 224 attenuates out of band signal components and passes, substantially unattenuated, in-band signal components of the inbound RF signal. The low noise amplifier 202 amplifies the in-band signal components of the inbound RF signal to produce an amplified inbound RF signal. With reference to FIG. 69, an inbound RF signal is shown in the frequency domain to have in-band signal components centered about an RF carrier frequency and out of band signal components at the edges of the signal. The output of the low noise amplifier 202 is shown in the frequency domain to substantially attenuate the out of band signal components and to pass, substantially unattenuated, the inbound signal components of the inbound RF signal.

Returning to the discussion of FIG. 68, the sample and hold filter 204 receives the amplified inbound RF signal and samples it in accordance with a sample clock signal and a hold clock signal. With reference to FIG. 70, the sample and hold circuit 204 receives the amplified inbound RF signal and samples it at a sampling frequency (fs). In this example, the sampling frequency is greater than or equal to two times the bandwidth of the amplified inbound RF signal. In general, the bandwidth of the amplified inbound RF signal corresponds to the bandwidth of the baseband signal component of the inbound RF signal. The sample and hold filter 224 outputs, in the frequency domain, a plurality of pulses spaced in frequency by the sampling frequency. The sample and hold output includes a pulse at RF, which corresponds to the original inbound RF signal.

Returning to the discussion of FIG. 68, the discrete time filters 206 of each down conversion path receives the output of the sample and hold circuit 204. Each discrete time filter 206 (which may be a finite impulse response filter, an infinite impulse response filter, a frequency translation bandpass filter, and/or other type of discrete filter) filters the frequency pulse train (e.g., the output of the S&H circuit) in accordance with its filtering response. For example and with reference to FIGS. 71 and 72, if a first discrete time filter 206 has a frequency response of a band pass filter at RF, then it will output the RF pulse of the pulse train and attenuate the other frequency pulses. If a second discrete time filter 206 has a frequency response of a band pass filter at IF (e.g., RF−n*fs, where n is an integer equal to or greater than 1), then it will output the IF pulse of the pulse train and attenuate the other frequency pulses. With each discrete time filter 206 having a band pass filter response at different frequencies, the output of the sample and hold output is represented by a plurality of different filtered frequency pulses.

Returning to the discussion of FIG. 68, each of the down conversion module 208 may be implemented using analog circuitry (e.g., a mixer, a local oscillation, and one or more pass filters) or it may be implemented as discrete time digital circuitry (e.g., a sample and hold circuit 204 and a discrete time filter 206). Regardless of the implementation, the down conversion module 208 of the first path converts the output of the first discrete time filter 206 (e.g., the RF frequency pulse) to a baseband signal (e.g., an analog symbol stream). The analog to digital converter 210 of the first path converts the baseband signal into a first digital signal (e.g., an inbound symbol stream).

Similarly, the down conversion module 208 of the second path converts the output of the second discrete time filter 206 (e.g., the IF frequency pulse) to a baseband signal (e.g., an analog symbol stream). The analog to digital converter 210 of the second path converts the baseband signal into a second digital signal (e.g., an inbound symbol stream). As such, a plurality of inbound symbol streams is created from the inbound RF signal.

The processing module may process the plurality of inbound symbol streams in a variety of ways. For example, the processing module converts each of the inbound symbol streams into inbound data, wherein one of the converted inbound data is used as the output. As another example, the processing module combines the first and second inbound baseband signals using an averaging function to produce the inbound signal, which it converts into the inbound data. As yet another example, the processing module combines the first and second inbound baseband signals using a weighted average function to produce the inbound signal, which it converts into the inbound data. As a further example, the processing module combines the first and second inbound baseband signals using a root mean square function to produce the inbound signal, which it converts into the inbound data. As a still further example, the processing module combines the first and second inbound baseband signals using a mathematical function to produce the inbound signal, which it converts into the inbound data. As an even further example, the processing module selects one of the first and second inbound baseband signals to produce the inbound signal, which it converts into the inbound data. As another further example, the processing module selects portions from each of the first and second inbound baseband signals to produce the inbound signal, which it converts into the inbound data. The portions may be selected based on decoding factors such as signal strength, accuracy of mapping symbols to bit patterns, etc. As another example, the inbound symbol streams may be compared with one another to determine accuracy of the receiving process (e.g., conversion of the inbound RF signal into inbound data) and to make corrections thereof.

Figure 73:
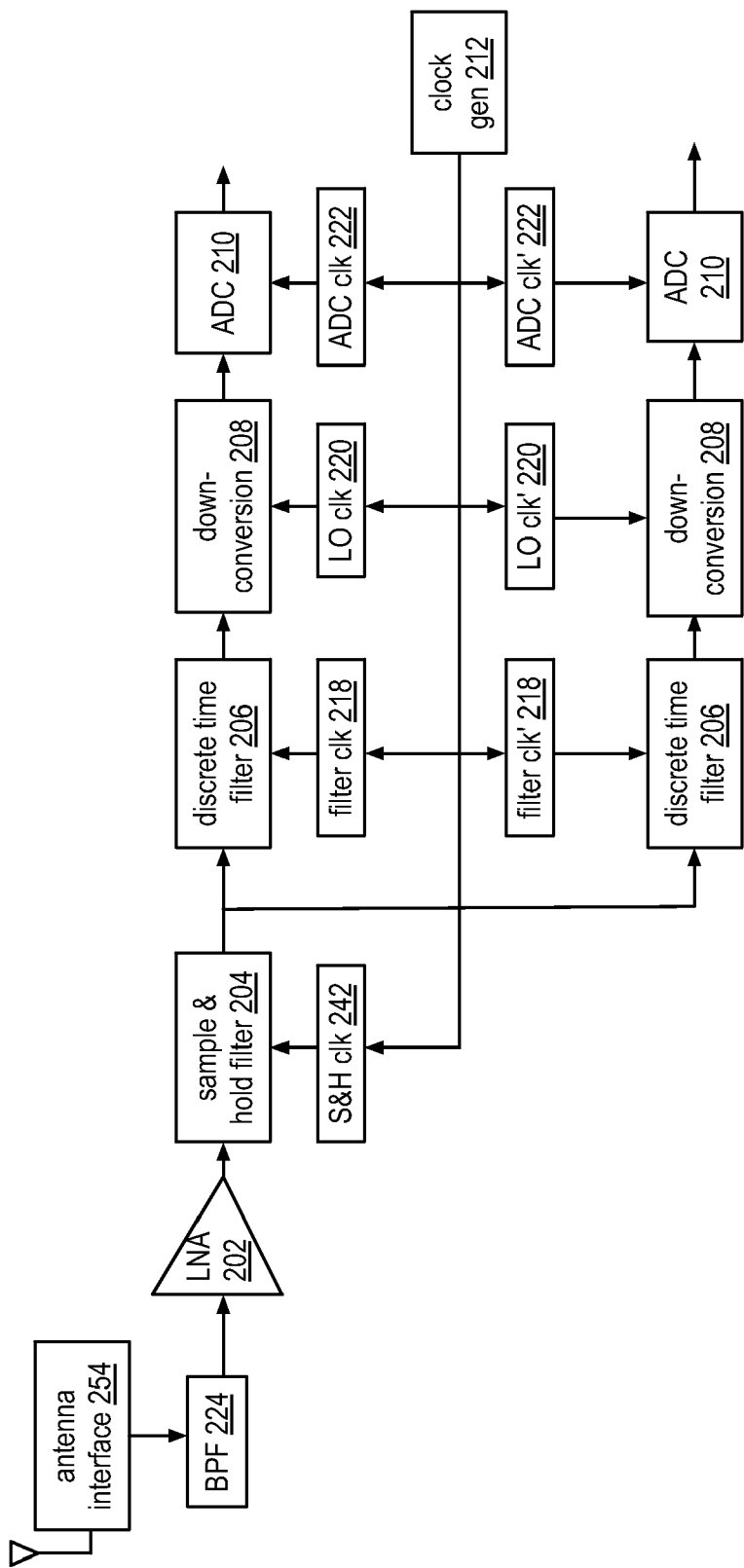
FIG. 73 is a schematic block diagram of another embodiment of a receiver of one or more of the transceivers of FIGS. 1-3 in accordance with the present invention.

FIG. 73 is a schematic block diagram of another embodiment of a receiver of one or more of the transceivers of FIGS. 1-3 that includes a bandpass filter 224, a low noise amplifier 202, a sample and hold circuit 204, a clock generation circuit, and a plurality of down conversion paths. Each of the down conversion paths includes a discrete time filter 206, a down conversion module 208 (may omit if discrete time filter 206 has a baseband BPF response), and an analog to digital converter 210. The clock generation circuit includes a clock generator 212, a sample and hold clock circuit 242, a plurality of filter clock circuits 218, a plurality of local oscillation (LO) clock circuits 220, and a plurality of analog to digital converter clock circuits 222.

In an example of operation, the band pass filter 224 receives an inbound RF signal from the antenna interface 254. The inbound RF signal includes a plurality of channels (or subcarriers), wherein one or more of the channels includes data of a communication. The band pass filter 224 attenuates out of band signal components and passes, substantially unattenuated, in-band signal components of the inbound RF signal. The low noise amplifier 202 amplifies the in-band signal components of the inbound RF signal to produce an amplified inbound RF signal. With reference to FIG. 74, an inbound RF signal is shown in the frequency domain to have in-band signal components centered about an RF carrier frequency and out of band signal components at the edges of the signal. The output of the low noise amplifier 202 is shown in the frequency domain to substantially attenuate the out of band signal components and to pass, substantially unattenuated, the inbound signal components of the inbound RF signal. In addition, the amplified inbound RF signal includes a plurality of channels, or sub-carriers of an OFDM based wireless communication. The gray shaded channels indicate that they are carrying data and the white shaded channels indicate that they are not currently carrying data.

Returning to the discussion of FIG. 73, the sample and hold filter 204 receives the amplified inbound RF signal and samples it in accordance with a sample clock signal and a hold clock signal. With reference to FIG. 75, the sample and hold circuit 204 receives the amplified inbound RF signal and samples it at a sampling frequency (fs). In this example, the sampling frequency is greater than or equal to two times the bandwidth of the amplified inbound RF signal. In general, the bandwidth of the amplified inbound RF signal corresponds to the bandwidth of the baseband signal component of the inbound RF signal. The sample and hold filter 204 outputs, in the frequency domain, a plurality of pulses (each including the plurality of channels 256) spaced in frequency by the sampling frequency. The sample and hold output includes a pulse at RF, which corresponds to the original inbound RF signal.

Returning to the discussion of FIG. 73, the discrete time filters 206 of each down conversion path receives the output of the sample and hold circuit 204. Each discrete time filter 205 (which may be a finite impulse response filter, an infinite impulse response filter, a frequency translation bandpass filter, and/or other type of discrete filter) filters the frequency pulse train (e.g., the output of the S&H circuit 204) in accordance with its filtering response. For example and with reference to FIGS. 76 and 77, if a first discrete time filter 206 has a frequency response of a band pass filter at RF for a specific channel or channels (or sub-carrier or sub-carriers), then it will output the desired channel(s) of the RF pulse of the pulse train and attenuate the other frequency pulses. If a second discrete time filter 206 has a frequency response of a band pass filter at IF (e.g., RF−n*fs, where n is an integer equal to or greater than 1) for a specific channel(s) (or sub-carrier(s)), then it will output the desired channel(s) of the IF pulse of the pulse train and attenuate the other frequency pulses. With each discrete time filter 206 having a band pass filter response at different frequencies (including the potential of having one at baseband), each channel(s) containing data is represented by a different one of the filtered frequency pulses.

Returning to the discussion of FIG. 73, each of the down conversion module 208 may be implemented using analog circuitry (e.g., a mixer, a local oscillation, and one or more pass filters) or it may be implemented as discrete time digital circuitry (e.g., a sample and hold circuit 204 and a discrete time filter 206). Regardless of the implementation, the down conversion module 208 of the first path converts the output of the first discrete time filter 206 (e.g., the RF frequency pulse) to a baseband signal (e.g., an analog symbol stream of the first channel(s)). The analog to digital converter 210 of the first path converts the baseband signal into a first digital signal (e.g., an inbound symbol stream).

Similarly, the down conversion module 208 of the second path converts the output of the second discrete time filter 206 (e.g., the IF frequency pulse) to a baseband signal (e.g., an analog symbol stream of the second channel(s)). The analog to digital converter 210 of the second path converts the baseband signal into a second digital signal (e.g., an inbound symbol stream).

The baseband processing module processes the inbound symbol streams to produce a plurality of inbound data. The plurality of inbound data may be part of one communication or part of several communications. As such, the receiver of FIG. 73 can support a single communication that uses multiple channels and/or support multiple communications using multiple channels.

Figure 78:
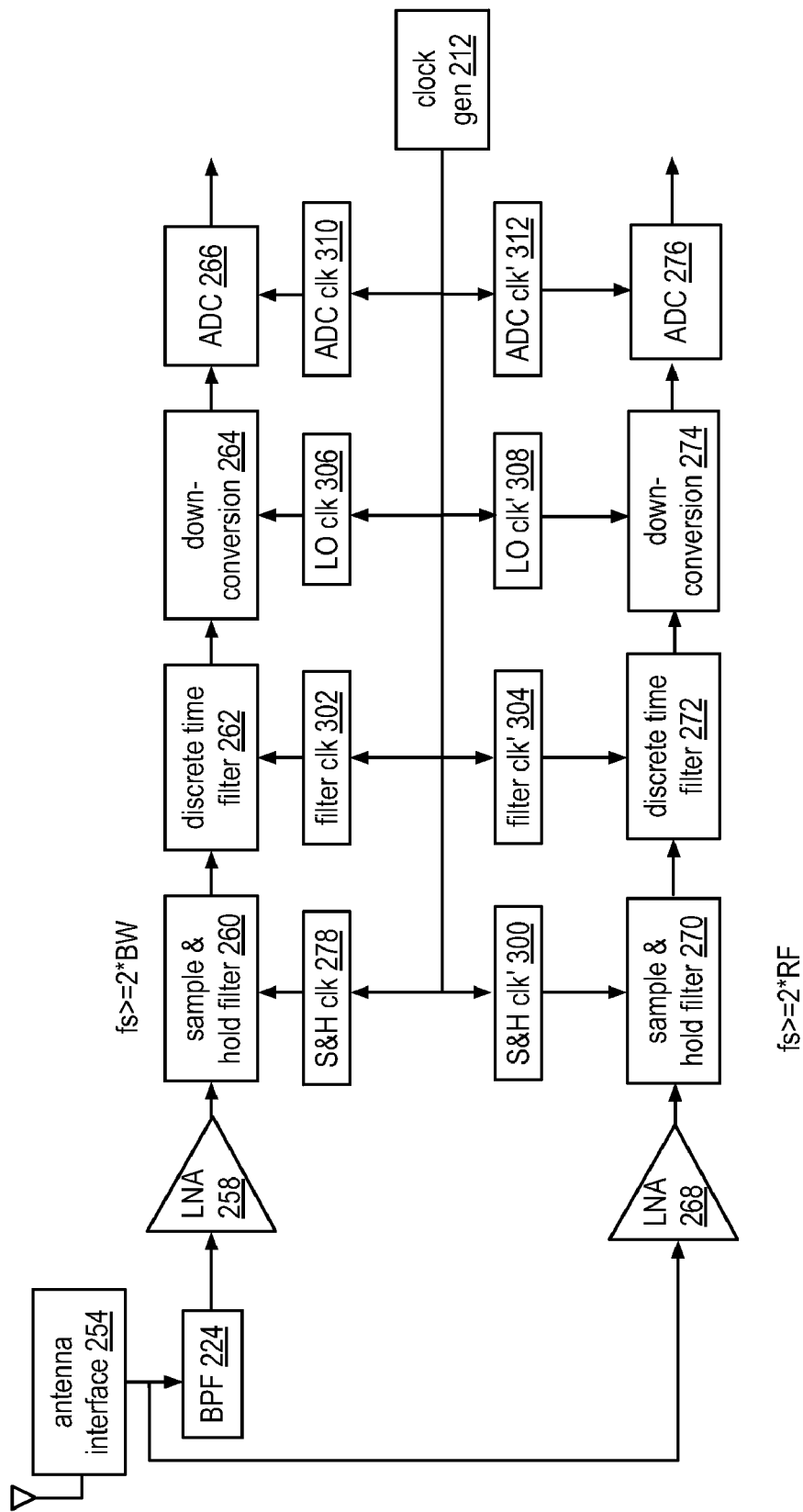
FIG. 78 is a schematic block diagram of another embodiment of a receiver of one or more of the transceivers of FIGS. 1-3 in accordance with the present invention.

FIG. 78 is a schematic block diagram of another embodiment of a receiver of one or more of the transceivers of FIGS. 1-3 that includes a bandpass filter 224, a first path, a second path, and a clock generation circuit. The first path is coupled to the output of the bandpass filter 224 and includes a first low noise amplifier 258, a first sample and hold circuit, 260 a first discrete time filter 262, a first down conversion module 264 (may omit if discrete time filter has a baseband BPF response), and a first analog to digital converter 266. The second path is coupled to the input of the bandpass filter 224 and includes a second low noise amplifier 268, a second sample and hold circuit 270, a second discrete time filter 272, a second down conversion module 274, and a second analog to digital converter 276. The clock generation circuit includes a clock generator 212, first and second sample and hold clock circuits 278-300, first and second filter clock circuits 302-304, first and second local oscillation (LO) clock circuits 306-308, and first and second analog to digital converter clock circuits 310-312.

In an example of operation, the band pass filter 224 receives an inbound RF signal from the antenna interface. The band pass filter 224 attenuates out of band signal components and passes, substantially unattenuated, in-band signal components of the inbound RF signal to produce a filtered inbound RF signal. The unfiltered inbound RF signal is provided to the second path and the filtered inbound RF signal is provided to the first path.

In the first path, the first low noise amplifier 258 amplifies the in-band signal components of the inbound RF signal to produce an amplified inbound RF signal. The first sample and hold filter 260 receives the amplified inbound RF signal and samples it at a sampling rate that is greater than or equal to two times the bandwidth of the amplified inbound RF signal. The first discrete time filter 262 receives the output of the sample and hold filter circuit 260 and filters it. Depending on the filtering response of the discrete time filter 262, the discrete time filter 262 will output, in the frequency domain, a single pulse of the sample and hold output at a particular frequency (e.g., RF, IF, fs, baseband, etc). If the filter response of the discrete time filter 262 is at baseband, the first down conversion module 264 may be omitted. If included, the first down conversion module 264 converts the output of the discrete time filter 262 to a baseband signal (e.g., an analog symbol stream). The first analog to digital converter 266 converts the baseband signal into a digital signal (e.g., a first inbound symbol stream).

In the second path, the second low noise amplifier 268 amplifies the unfiltered inbound RF signal to produce a second amplified inbound RF signal. The second sample and hold filter 270 receives the second amplified inbound RF signal and samples it at a sampling rate that is greater than or equal to two times RF (e.g., the carrier frequency of the inbound RF signal). The second discrete time filter 272 receives the output of the second sample and hold filter circuit 270, filters it at RF, and outputs the frequency pulse at RF. The second down conversion module 274 converts the output of the second discrete time filter 272 to a baseband signal (e.g., an analog symbol stream). The second analog to digital converter 276 converts the baseband signal into a second digital signal (e.g., a second inbound symbol stream).

Each of the first and second inbound symbol streams may be converted into inbound data, wherein one of the converted inbound data is used as the output. Alternatively, portions of the first and second inbound symbol streams are selected and the selected portions are converted into the inbound data. The portions may be selected based on decoding factors such as signal strength, accuracy of mapping symbols to bit patterns, etc. As another example, the first and second inbound symbol streams may be compared with one another to determine accuracy of the receiving process (e.g., conversion of the inbound RF signal into inbound data) and to make corrections thereof.

Figure 79:
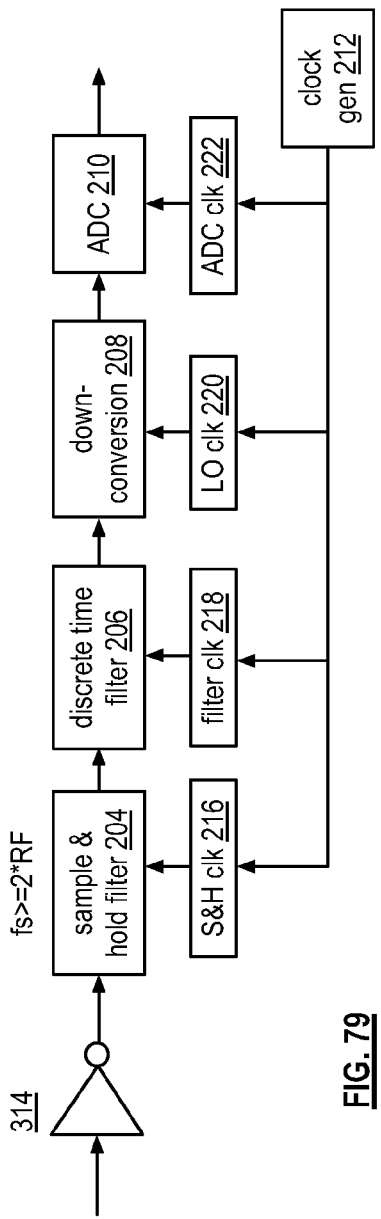
FIG. 79 is a schematic block diagram of another embodiment of a receiver of one or more of the transceivers of FIGS. 1-3 in accordance with the present invention.

FIG. 79 is a schematic block diagram of another embodiment of a receiver of one or more of the transceivers of FIGS. 1-3 includes a buffer module 314 (e.g., an inverter, a buffer, and/or a wide bandwidth unity gain amplifier), a sample and hold filter circuit 204, a discrete time filter 206, a down conversion module 208, an analog to digital converter (ADC) 210, and a clock circuit module. The clock circuit module includes a clock generator 212, a sample and hold (S&H) clock circuit 216, a filter clock circuit 218, a local oscillation (LO) clock circuit 220, and an analog to digital converter (ADC) clock circuit 222. Note that, in this embodiment, the receiver may not include an RF BPF or it includes a wideband RF BPF (e.g., has a band pass region that covers more than one frequency band). Further note that the receiver includes an inverter 314 instead of an LNA.

In an example of operation, the inverter 314 receives the inbound RF signal from the antenna interface and provides it to the sample and hold filter circuit 204. The inverter 314 has a wider bandwidth than an LNA and, as such, the inbound RF signal may be a wide bandwidth signal (e.g., span more than one frequency band, include multiple frequencies within a given frequency band, etc.). The sample and hold filter 204 samples inbound RF signal in accordance with a sample clock signal and a hold clock signal, which are clocked in accordance with a sampling frequency (fs). In this example, the sampling frequency is greater than or equal to two times RF (e.g., the carrier frequency of the inbound RF signal). The sample and hold filter 204 outputs, in the frequency domain, a plurality of pulses spaced in frequency by the sampling frequency. The sample and hold output includes a pulse at RF, which corresponds to the original inbound RF signal.

The discrete time filter 206 (which may be a finite impulse response filter, an infinite impulse response filter, a frequency translation bandpass filter, and/or other type of discrete filter) receives the output of the sample and hold filter circuit 204 and filters it to RF. In this example, the filter response of the discrete digital filter 206 is at RF and, as such, its output includes the RF pulse of the pulse train and attenuates the other frequency pulses.

The down conversion module 208 may be implemented using analog circuitry (e.g., a mixer, a local oscillation, and one or more pass filters) or it may be implemented as discrete time digital circuitry (e.g., a sample and hold circuit 204 and a discrete time filter 206). Regardless of the implementation, the down conversion module 208 converts the output of the discrete time filter 206 to a baseband signal (e.g., an analog symbol stream). The analog to digital converter 210 converts the baseband signal into a digital signal (e.g., an inbound symbol stream), which may be process as previously described with reference to FIGS. 1-3.

Figure 80:
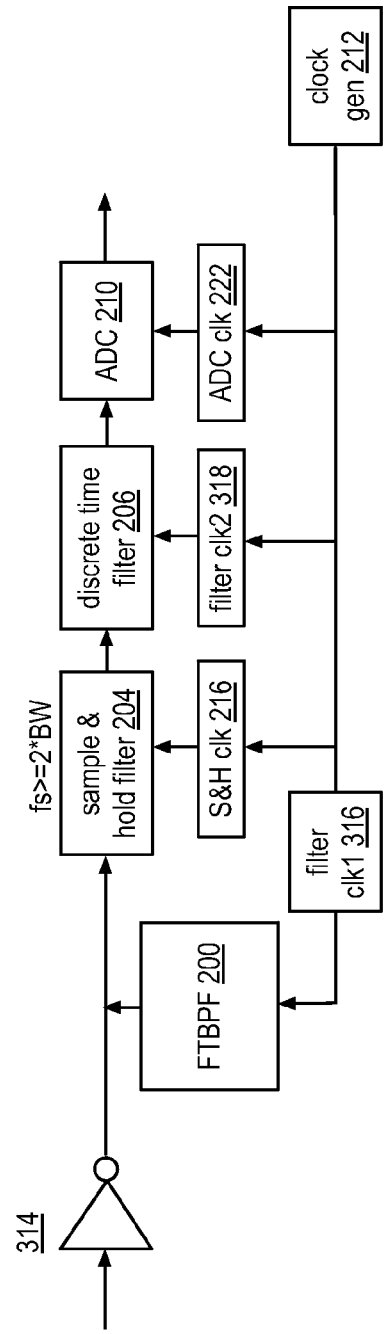
FIG. 80 is a schematic block diagram of another embodiment of a receiver of one or more of the transceivers of FIGS. 1-3 in accordance with the present invention.

FIG. 80 is a schematic block diagram of another embodiment of a receiver of one or more of the transceivers of FIGS. 1-3 that includes a frequency translated band pass filter (FTBPF) 200, a buffer module 314 (e.g., an inverter, a buffer, and/or a wide bandwidth unity gain amplifier), a sample and hold filter circuit 204, a discrete time filter 206, an analog to digital converter (ADC) 210, and a clock circuit module. The clock circuit module includes a clock generator 212, an FTBPF clock circuit 316, a sample and hold (S&H) clock circuit 216, a filter clock circuit 318, and an analog to digital converter (ADC) clock circuit 222.

In an example of operation, the inverter 314 receives the inbound RF signal from the antenna interface and provides it to the FTBPF 200 and the sample and hold filter circuit 204. The inverter 314 has a wider bandwidth than an LNA; as such, the inbound RF signal may be a wide bandwidth signal (e.g., span more than one frequency band, include multiple frequencies within a given frequency band, etc.). The FTBPF 200 filters an inbound RF signal by attenuating out of band signal components and passing, substantially unattenuated, in-band signal components of the inbound RF signal to produce a filtered inbound RF signal.

The sample and hold filter 204 receives the filtered inbound RF signal and samples it in accordance with a sample clock signal and a hold clock signal, which is clocked in accordance with a sampling frequency y (fs). In this example, the sampling frequency is greater than or equal to two times the bandwidth of the filtered inbound RF signal.

The discrete time filter 206 receives the output of the sample and hold filter circuit 204 and filters it to baseband. In this example, the filter response of the discrete digital filter 206 is at baseband and, as such, its output includes the baseband pulse of the pulse train output of the sample and hold filter circuit 204, with the other frequency pulses being attenuated. The analog to digital converter 210 converts the baseband signal into a digital signal (e.g., an inbound symbol stream), which may be process as previously described with reference to FIGS. 1-3.

Figure 81:
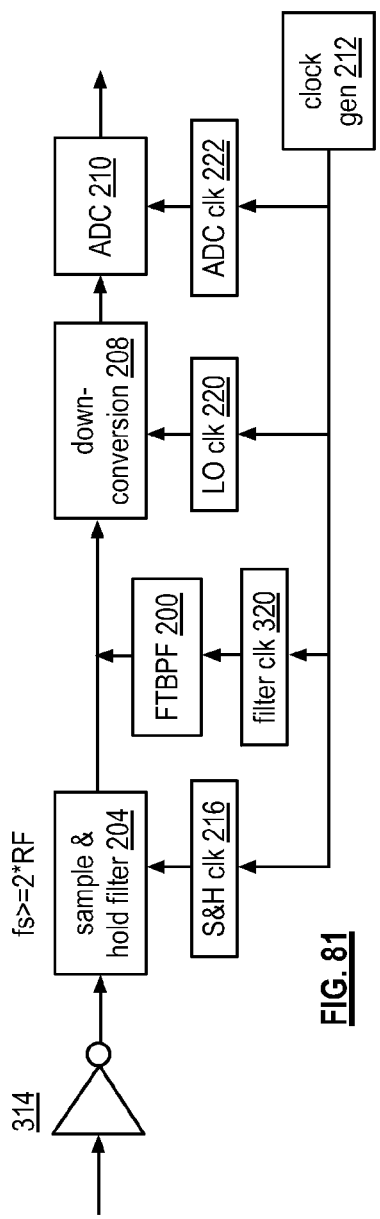
FIG. 81 is a schematic block diagram of another embodiment of a receiver of one or more of the transceivers of FIGS. 1-3 in accordance with the present invention.

FIG. 81 is a schematic block diagram of another embodiment of a receiver of one or more of the transceivers of FIGS. 1-3 that includes a buffer module 314 (e.g., an inverter, a buffer, and/or a wide bandwidth unity gain amplifier), a sample and hold filter circuit 204 a frequency translated band pass filter (FTBPF) 200, a down conversion module 208, an analog to digital converter (ADC) 210, and a clock circuit module. The clock circuit module includes a clock generator 212, an FTBPF clock circuit, a sample and hold (S&H) clock circuit 216, a filter clock circuit 320, an LO clock circuit 220, and an analog to digital converter (ADC) clock circuit 222.

In an example of operation, the inverter 314 receives the inbound RF signal from the antenna interface and provides it to the sample and hold filter circuit 204. The sample and hold filter 204 samples inbound RF signal in accordance with a sample clock signal and a hold clock signal, which are clocked in accordance with a sampling frequency (fs). In this example, the sampling frequency is greater than or equal to two times RF (e.g., the carrier frequency of the inbound RF signal). The sample and hold filter 214 outputs, in the frequency domain, a plurality of pulses spaced in frequency by the sampling frequency. The sample and hold output includes a pulse at RF, which corresponds to the original inbound RF signal.

The FTBPF 200 filters the output of the sample and hold filter circuit 204 to RF. In this example, the filter response of the FTBPF 200 is a bandpass filter at RF and, as such, its output includes the RF pulse of the pulse train and attenuates the other frequency pulses. The down conversion module 208 converts the output of the discrete time filter to a baseband signal (e.g., an analog symbol stream). The analog to digital converter 310 converts the baseband signal into a digital signal (e.g., an inbound symbol stream), which may be process as previously described with reference to FIGS. 1-3.

Figure 82:
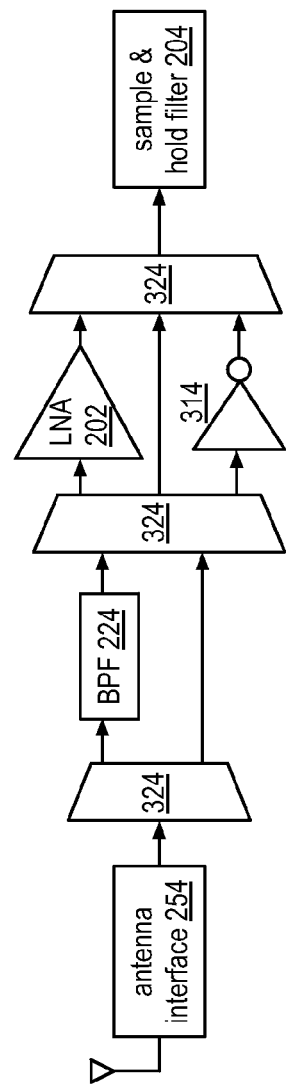
FIG. 82 is a schematic block diagram of an embodiment of a programmable front end of a receiver of one or more of the transceivers of FIGS. 1-3 in accordance with the present invention.

FIG. 82 is a schematic block diagram of an embodiment of a programmable front end 322 of a receiver of one or more of the transceivers of FIGS. 1-3. The programmable front end 322 includes the antenna interface 254, a plurality of switching modules 324, an RF bandpass filter 224, a low noise amplifier 202, an inverter 314, and a sample and hold circuit 204. The plurality of switching modules 324 (e.g., multiplexers, switches, programmable gates, transistors, etc.) allow for a variety of front end configurations. For example, the inbound RF signal (i.e., the output of the antenna interface 254) may be directly provided to the sample and hold circuit 204. As another example, the inbound RF signal may be bandpass filtered via the BPF 224 (which may be programmable to adjust the bandpass region, the center frequency, the attenuation rate, etc.), amplified by the LNA 202, then provided to the sample and hold circuit 204.

Figure 83:
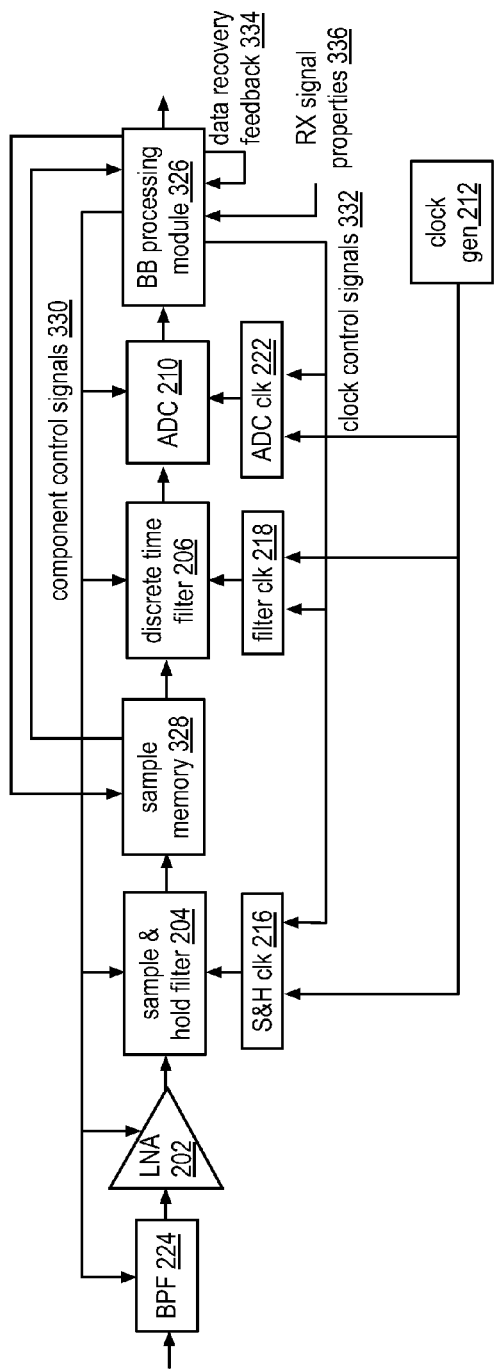
FIG. 83 is a schematic block diagram of another embodiment of a receiver of one or more of the transceivers of FIGS. 1-3 in accordance with the present invention.

FIG. 83 is a schematic block diagram of another embodiment of a receiver of one or more of the transceivers of FIGS. 1-3 coupled to the baseband processing module 326. The receiver includes a band pass filter (BPF) 224, a low noise amplifier (LNA) 202, a sample and hold filter circuit 204, sample memory 328, a discrete time filter 206, an analog to digital converter (ADC) 310, and a clock circuit module. The clock circuit module includes a clock generator 212, a sample and hold (S&H) clock circuit 216, a filter clock circuit 218, a local oscillation (LO) clock circuit, and an analog to digital converter (ADC) clock circuit 222. Note that the receiver may also include a down conversion module if the discrete time filter has a bandpass filter response at RF, IF, or fs.

The baseband processing module 326 is coupled to provide control signals to one or more of a band pass filter (BPF) 224, a low noise amplifier (LNA) 202, a sample and hold filter circuit 204, the sample memory 328, a discrete time filter 206, an analog to digital converter (ADC) 210, and a clock circuit module to optimize performance of the receiver based on data recovery feedback 334 (e.g., bit error rate, packet error rate, the data, etc.) and/or receive signal properties 336 (e.g., SNR, signal to interference, RSSI, testing, noise, frequency band of operation, etc.).

The control signals 330 may be used to adjust settings of a component. For example, one or more control signals 330 may be provided to the BPF 224 to change the bandpass region, the center frequency, the attenuation rate, etc. As another example, one or more control signals 330 may be provided to the LNA 202 to change gain, linearity, bandwidth, efficiency, noise, output dynamic range, slew rate, rise rate, settling time, overshoot, stability factor, etc. As yet another example, one or more control signals 330 may be provided to the sample and hold filter circuit 204 to change the impedances, impedance circuits, etc. As a further example, one or more control signals 330 may be provided to the discrete time filter 206 to program it as described with reference to one or more of FIGS. 33-37. As a still further example, the control signals may be provided to the sample memory regarding storing samples and/or retrieving samples. The baseband processing module 326 may also provide one or more control signals 332 to the clock circuits. As an example, one or more control signals 332 may be provided to the S&H clock circuit 216 to adjust the sampling frequency, the sampling period, the hold period, etc.

In an example of operation, the band pass filter 224 receives an inbound RF signal from the antenna interface. The band pass filter 224 attenuates out of band signal components and passes, substantially unattenuated, in-band signal components of the inbound RF signal. The low noise amplifier 202 amplifies the in-band signal components of the inbound RF signal to produce an amplified inbound RF signal.

The sample and hold filter 204 receives the amplified inbound RF signal and samples it in accordance with a sample clock signal and a hold clock signal that are clocked in accordance with a sampling frequency (fs). In this example, the sampling frequency is greater than or equal to two times the bandwidth of the amplified inbound RF signal.

The sample memory 328 stores the samples outputted by the sample and hold filter circuit 204. The sample memory 328 may store a few samples to millions of samples in a rolling manner; may take a snapshot of the samples, etc. The baseband processing module 326 controls the storage and retrieval of the samples to/from the storage memory. In addition, the baseband processing module 326 may utilize the stored samples for receiver calibration functions, receiver testing functions, and/or error correction. One or more examples will be described with reference to FIGS. 86-90.

The discrete time filter 206 filters samples retrieved from the sample memory 328 based on its filtering response. In this example, the filter response of discrete time filter 206 corresponds to a bandpass filter 224 at baseband such that the discrete time filter 206 outputs the baseband frequency pulse and attenuates the other frequency pulses of the frequency pulse train of the sample and hold circuit 204. The analog to digital converter 210 converts the baseband signal into a digital signal (e.g., an inbound symbol stream).

Figure 84:
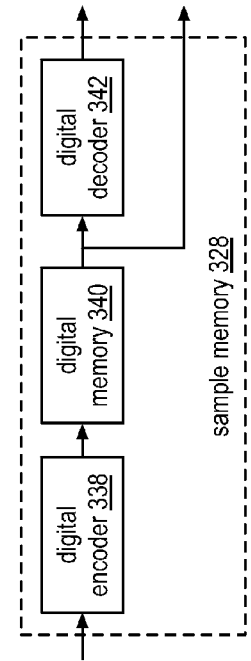
FIG. 84 is a schematic block diagram of an embodiment of sample memory of the receiver of FIG. 83 in accordance with the present invention.

FIG. 84 is a schematic block diagram of an embodiment of sample memory 328 of the receiver of FIG. 83 that includes a digital encoder 338, digital memory 340, and a digital decoder 342. The digital memory 340 may be non-volatile or volatile memory random access memory of any construct (e.g., flash, S-RAM, D-RAM, dual data rate, etc.). The digital encoder 338 (e.g., a flash ADC, a thermometer ADC, etc.) converts the analog sample value (e.g., magnitude) of a sample into a digital value. The digital decoder 342 performs the inverse function of the digital encoder 338 (e.g., converts the digital value back into an analog sample value).

Figure 85:
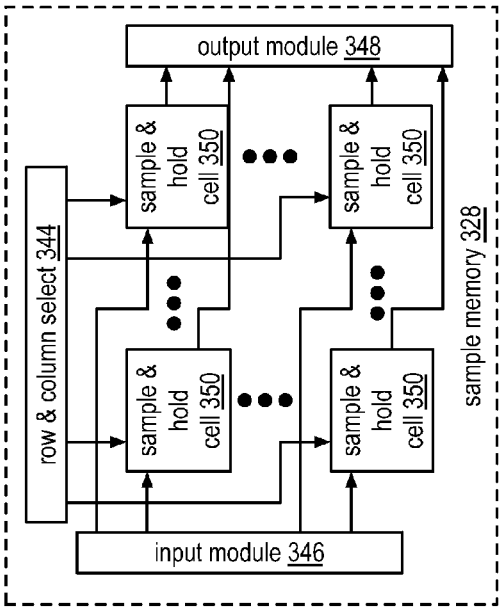
FIG. 85 is a schematic block diagram of another embodiment of sample memory of the receiver of FIG. 83 in accordance with the present invention.

FIG. 85 is a schematic block diagram of another embodiment of sample memory 328 of the receiver of FIG. 83 that includes a row & column select module 344, an input module 346, an output module 348, and a plurality of sample and hold cells 350. Each of the sample and hold cells 350 may be conventional sample and hold circuits and are arranged into rows and columns. Each cell 350 is individually accessible for storing or retrieving a sample value via the row and column select module 244. Alternatively or in addition, the cells 350 may also be accessible in a group (e.g., a row of cells, a column of cells, a block of cells, etc.).

In an example of operation, the row & select module 344 selects a cell 350 to receive a sample value (e.g., an analog voltage). The input module 346 receives the sample from the sample and hold circuit and provides it to the selected cell 350 for storage therein. The row & column select module 344 tracks the storage location of each sample value in a memory table, which the baseband processing module may access. To retrieve a stored sample value, the row & column select module 344 selects the appropriate cells 350. The output module 348 couples to the selected cell 350 and outputs the retrieved sample value. By buffering the samples using a sample memory 328, the baseband processing module may be able to correct bit errors, correct packet errors, better calibrate the receiver, etc.

Figure 86:
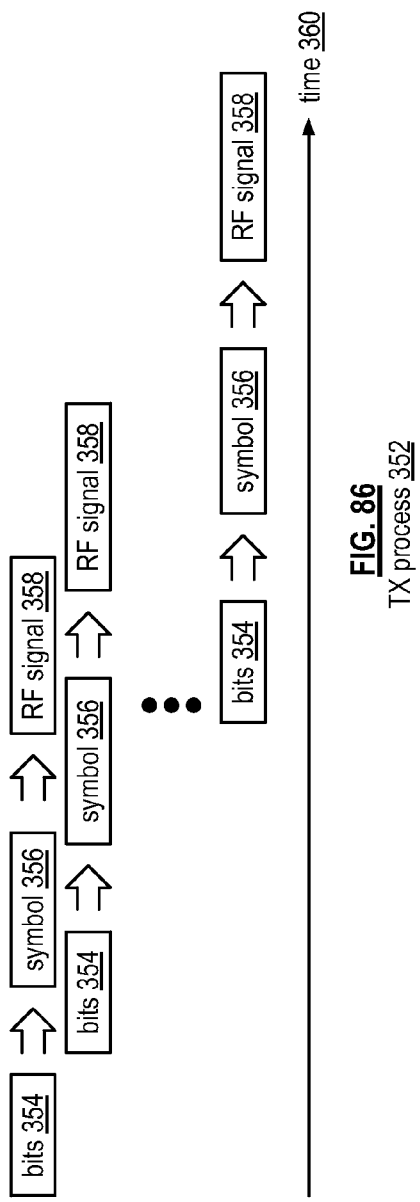
FIG. 86 is a diagram of an example of converting bits into outbound RF signals in accordance with the present invention.

FIG. 86 is a diagram of an example of the functional operation of a transmitter 352. In general, a transmitter converts outbound data into outbound RF signals 358, which is done in a sequential manner. For example, the outbound data is divided into data words of 2 to 16 bits 354 per word, where each word is serially converted into a symbol 356 in accordance with a data mapping protocol (e.g., QPSK, BPSK, QAM, FSK, ASK, etc.). An RF transmitter section converts each symbol 356 into an RF signal 358 (or a portion thereof), which is transmitted for a given period of time 360 (e.g., nanoseconds to milliseconds).

As shown, while one data word 354 is being converted into a symbol 356 the next data word 354 is being prepared for conversion into a symbol 356; similarly, as one symbol 356 is being converted into an RF signal 358 the next symbol 356 is being prepared for the same conversion. As such, every stage of a transmitter (e.g., the baseband processing, the up conversion, etc.) is continually active performing its corresponding function.

Figure 87:
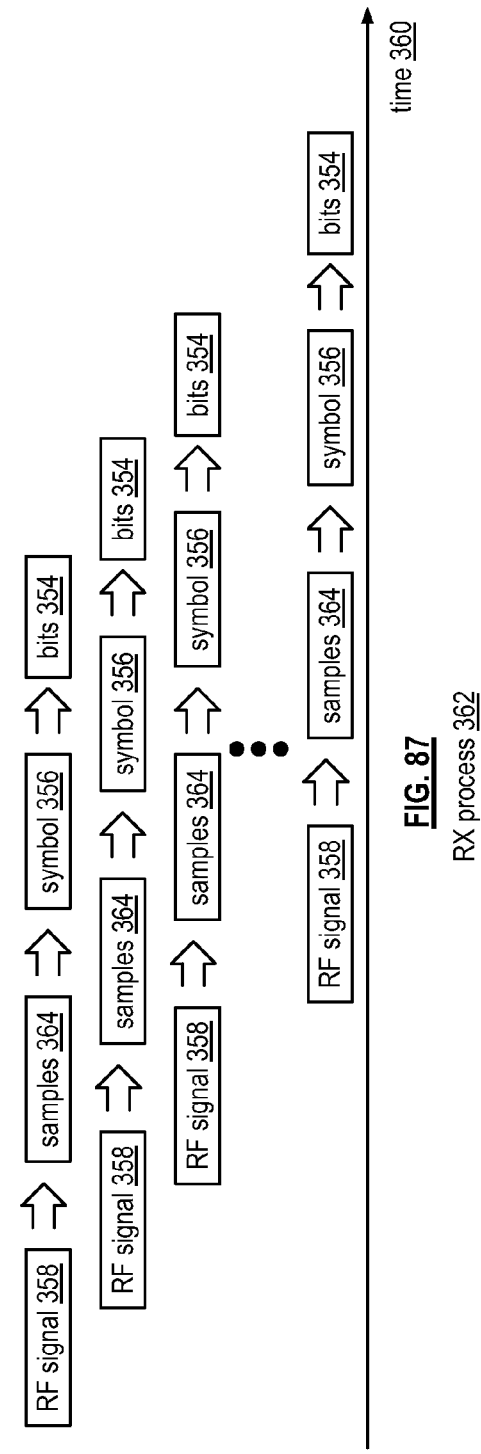
FIG. 87 is a diagram of an example of converting inbound RF signals into bits in accordance with the present invention.

FIG. 87 is a diagram of an example of the functional operation of a receiver 362 that includes a sample and hold filter circuit. In general, a receiver converts inbound RF signals 358 into inbound data in a sequential manner. For example, an inbound signal 358, which corresponds to a symbol 356, is sampled to produce samples 364. The samples 364 are subsequently converted into a symbol 356, which is then converted into bits 354 (e.g., a data word) in accordance with a data demapping protocol.

As shown, while one inbound RF signal 358 is being sampled, another inbound RF signal 358 is being received and readied for sampling. Similarly, as one set of samples 364 is being converted into a symbol 356, another set of samples 364 is being created from an inbound RF signal 358; and as one symbol 356 is being converted into bits 354, another set of samples 364 is being converted into a symbol 356. In this manner, every stage of a receiver (e.g., the RF front end, the down conversion process, and the baseband processing) is active performing its corresponding function. As long as inbound RF signals 358 are accurately converted into bits 354, the pipelined process of the receiver continues as described. If, however, an inaccuracy occurs in converting an RF signal 358 into bits 354, the bits 354 are lost.

Figure 88:
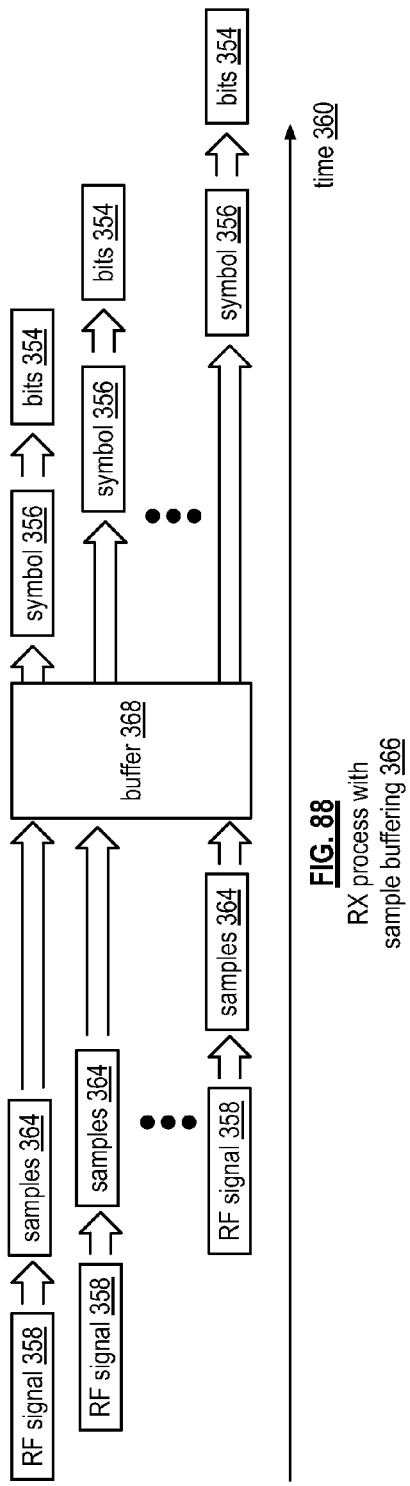
FIG. 88 is a diagram of an example of converting inbound RF signals into bits that includes sample buffering in accordance with the present invention.

FIG. 88 is a diagram of an example of the functional operation of a receiver 366 that includes a sample and hold filter circuit and sample memory. In this example, the RF signals 358 are converted into samples 364 as previously discussed with reference to FIG. 87 but are buffered in the sample memory prior to conversion into symbols 356. At a desired rate, the symbols 356 are retrieved from the buffer 368 and subsequently converted into bits 354. The amount of buffering, overflow threshold, underflow threshold, etc. of the buffer 368 is programmable by the baseband processing module.

Figure 89:
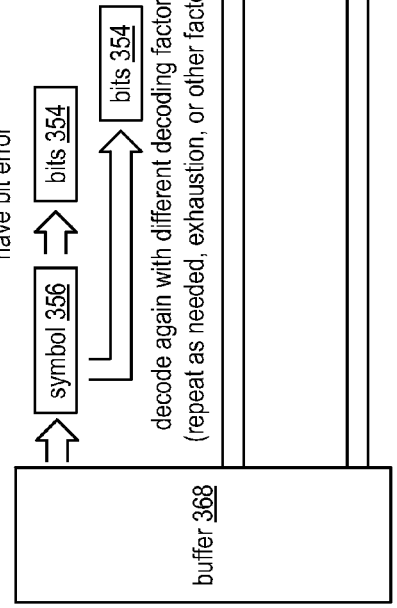
FIG. 89 is a diagram of an example of converting inbound RF signals into bits that includes error correction processing in accordance with the present invention.

FIG. 89 is a diagram of an example of the functional operation of a receiver 370 that includes a sample and hold filter circuit and sample memory correcting a bit error. In this example, the symbols 356 are the buffered in the system memory and retrieved sequentially. The first symbol 356 retrieved from the buffer 368 encountered an error when converting into the desired bits 354. The error may be caused by a number of factors including, but not limited to, low signal-to-noise ratio, errors in approximations, etc.

When the error is detected and prior to retrieving the next symbol 356, the present symbol 356 is decoded again using a different set of decoding factors. The decoding factors include a de-mapping protocol, de-puncturing protocol, decoding protocol, maximum likelihood estimations, and/or any other variable in converting a symbol 356 into bits 354. With the decoding factors adjusted, the symbol 356 is again converted into bits 354. If the conversion is successful, the next symbol 356 is retrieved and decoded to produce the next set of bits 354. If, however, the conversion was not successful, it is tried again until the symbol 356 is properly decoded, an exhaustion factor is reached, or some other indication to cease decoding the symbol 356 is triggered. Note that once samples have been correctly decoded, the processing module may issue a delete command to the sample memory.

Figure 90:
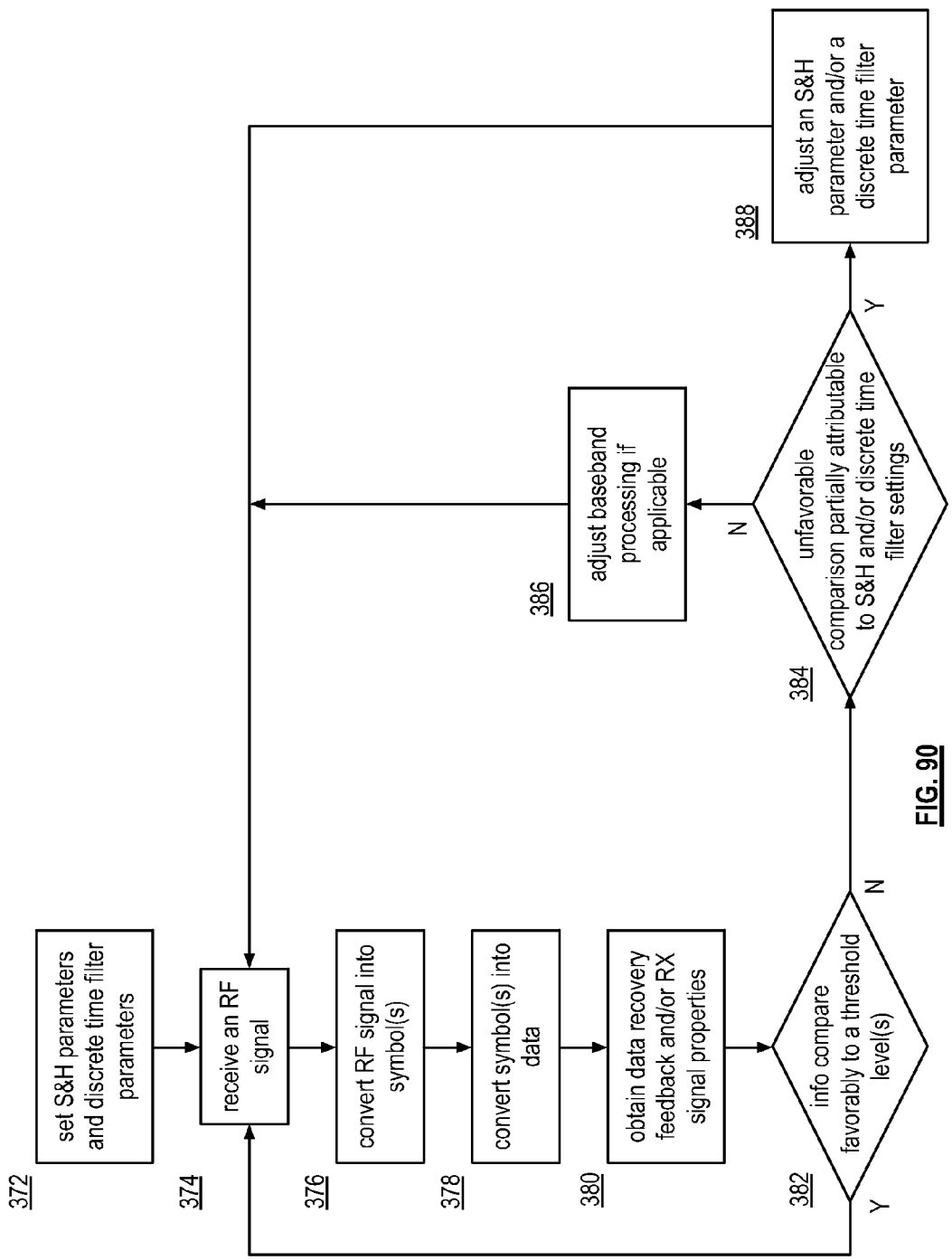
FIG. 90 is a logic diagram of an example method of setting, adjusting, and/or calibrating receiver parameters in accordance with the present invention.

FIG. 90 is a logic diagram of an example method that may be performed by a baseband processing module. The method begins by setting parameters for the sample and hold and the parameters for the discrete time filter 372. The sample and hold parameters include sampling period, sampling interval, sampling frequency, impedance values, impedance circuit settings, etc. The discrete time filter parameters include coefficients, delay line settings, number of stages, etc.

The method continues by receiving an RF signal 374, which may be an inbound RF communication signal, a test signal, and/or a calibration signal. The method continues by converting the RF signal into one or more symbols 376. The method then continues by converting the symbols into data 378. Note that this step may be skipped if the testing of the sample and hold circuits and discrete time filter can be done by analyzing the symbols, which may be done by a correlation technique, a matching technique, etc.

The method continues by obtaining (e.g., receiving, generating, looking up, etc.) data recovery feedback and/or receive signal properties 380. The data recovery feedback includes a bit error rate, a packet error rate, decoding information such as a mapping protocol, etc. The receive signal properties include received signal strength indication (RSSI), signal-to-noise ratio (SNR), signal to interference ratio, etc.

The method continues by determining whether the information (e.g., the data recovery feedback and/or the receive signal properties) compares favorably to a threshold level (e.g., given the current settings, is the receiver operating at an acceptable level, an optimal level, and/or below the acceptable level, etc.) 382. If the information compares favorably to the threshold level, the process repeats by receiving and other RF signal 374.

If, however, the information compares unfavorably to the threshold level, the process continues by determining whether the unfavorable comparison is at least partially attributable to the sample and hold circuit and or to the discrete time filter 384. If not, the method continues by adjusting one or more receiver baseband processing settings 386. Having made such an adjustment, the method repeats by receiving another RF signal.

If, however, the unfavorable comparison is at least partially attributable to the sample and hold circuit and/or the discrete time filter, the method continues by adjusting a sampling hold parameter and/or a discrete time filter parameter 388. For example, if the signal-to-noise ratio is too low, the discrete time filter and/or the sampling hold filter circuit may be adjusted to improve the filtering of the inbound RF signal. In this manner, the signal-to-noise ratio might be increased. Having made an adjustment to the S&H parameters and/or the discrete time filter parameters, the method repeats by receiving another RF signal.

Figure 91:
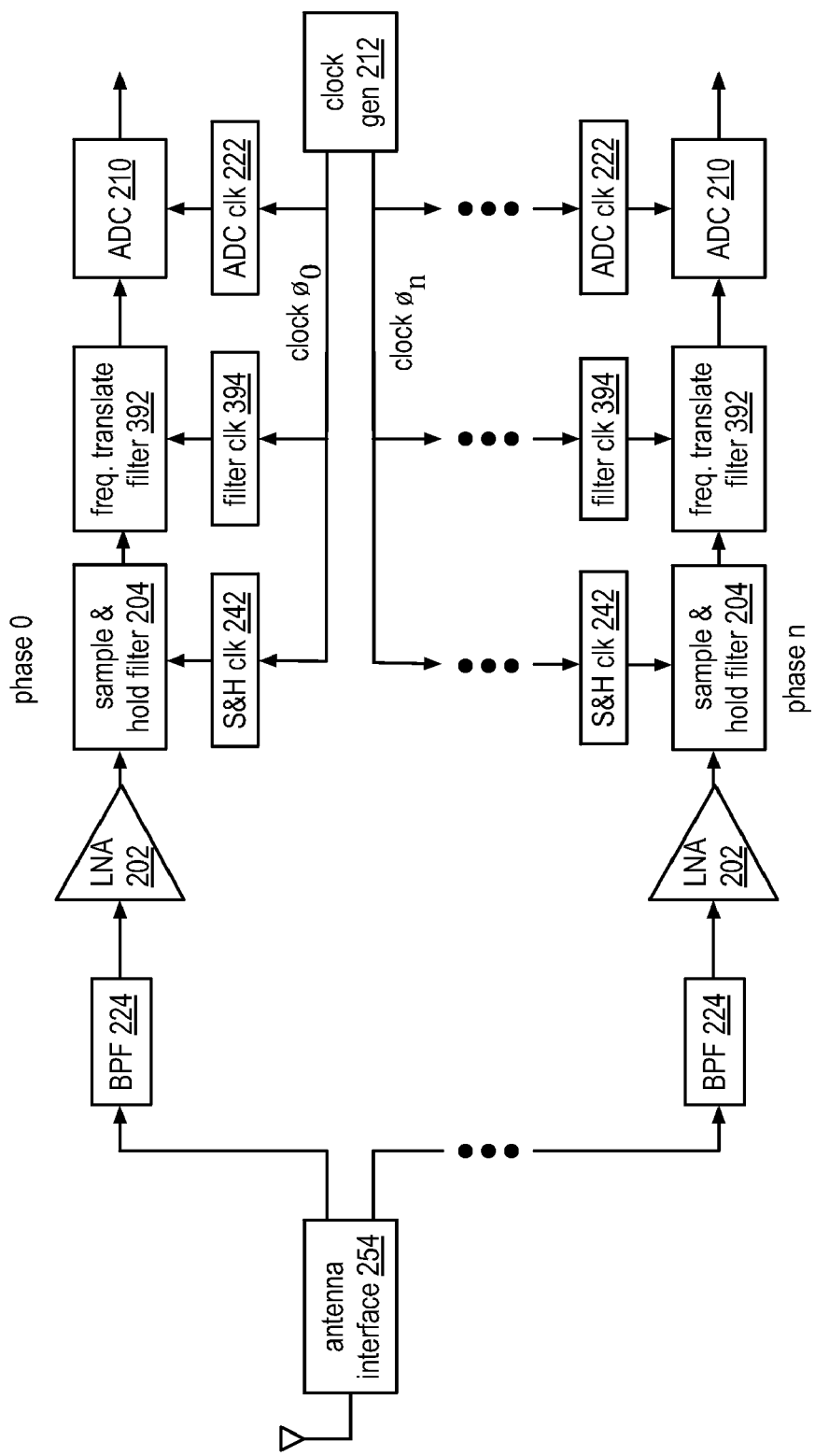
FIG. 91 is a schematic block diagram of another embodiment of a receiver of one or more of the transceivers of FIGS. 1-3 in accordance with the present invention.

FIG. 91 is a schematic block diagram of another embodiment of a receiver 390 of one or more of the transceivers of FIGS. 1-3 that includes a plurality of paths and a clock generation circuit. Each path includes a low noise amplifier 202, a sample and hold circuit 204, a discrete time filter 392, a down conversion module (not shown since it may omit if discrete time filter has a baseband BPF response), and an analog to digital converter 210. The clock generation circuit includes a clock generator 212, a plurality of sample and hold clock circuits 242, a plurality of filter clock circuits 394, and a plurality of analog to digital converter clock circuits 222. The clock generator 212 generates a plurality of phase shifted clock signals; each phase shifted clock signal clocks a corresponding one of the plurality of paths. As such, for a sampling period, the inbound RF signal is sampled a plurality of times (one time for each phase shifted clock). Accordingly, the inbound RF signal is oversampled, which provides options for optimizing the data recovery process. Note that the plurality of discrete time filter modules and the plurality of conversion modules (e.g., ADCs or ADCs and down conversion modules) may be included in a receiver circuit of the receiver.

In an example of operation of each path, the band pass filter 224 receives an inbound RF signal from the antenna interface 254. The band pass filter 224 attenuates out of band signal components and passes, substantially unattenuated, in-band signal components of the inbound RF signal. The low noise amplifier 202 amplifies the in-band signal components of the inbound RF signal to produce an amplified inbound RF signal.

The sample and hold filter 204 receives the amplified inbound RF signal and samples it in accordance with a sample frequency that corresponds to the respective phase shifted clock signal. In this example, the sampling frequency is greater than or equal to two times the bandwidth of the amplified inbound RF signal. The discrete time filter 392 (which may be a finite impulse response filter, an infinite impulse response filter, a frequency translation bandpass filter, and/or other type of discrete filter) receives the output of the sample and hold filter circuit 204 and filters it to baseband. The analog to digital converter 210 converts the baseband signal into a digital signal (e.g., an inbound symbol stream) to produce a plurality of inbound symbol streams.

Each of the plurality of inbound symbol streams may be converted into inbound data, wherein one of the converted inbound data is used as the output. Alternatively, portions of the plurality of inbound symbol streams are selected and the selected portions are converted into the inbound data. The portions may be selected based on decoding factors such as signal strength, accuracy of mapping symbols to bit patterns, etc. As another example, the plurality of inbound symbol streams may be compared with one another to determine accuracy of the receiving process (e.g., conversion of the inbound RF signal into inbound data) and to make corrections thereof.

FIGS. 92-94 are diagrams of an example of sampling and holding an inbound signal, in the time domain, at a given sampling period ($T_s$) and a holding period ($T_h$) that are derived from a corresponding phase-shifted clock signal. The inbound signal g(t) is sampled at a given sampling interval (Ts) at phase 0 (FIG. 92), at phase 1 (FIG. 93), and at phase n (FIG. 94), where n is an integer greater than or equal to 2. The respective holding periods (Th) are shown to be less than the phase offset between phase shifted clock signals, however, the holding periods could be equal to or greater than the phase offset.

Figure 95:
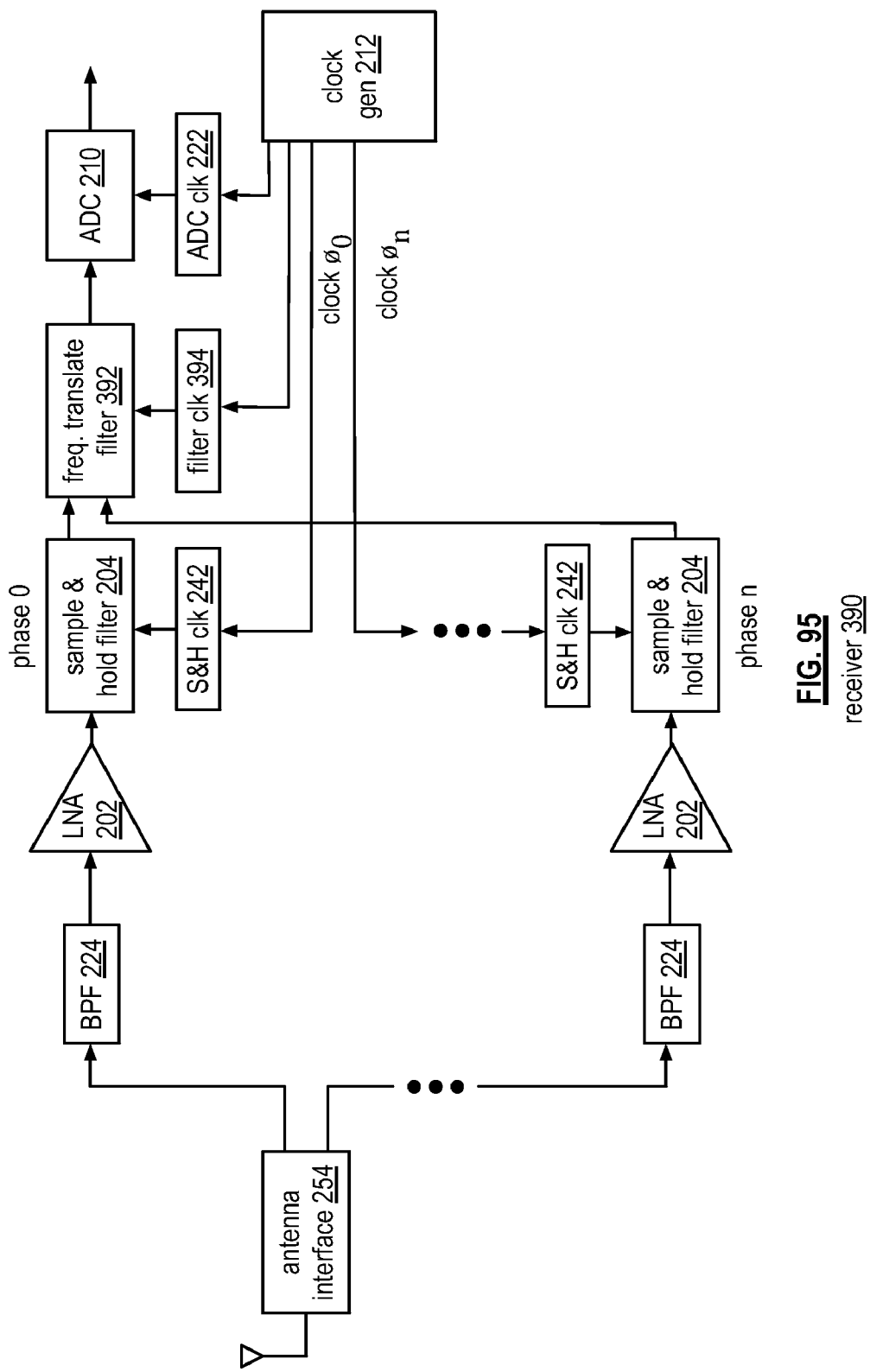
FIG. 95 is a schematic block diagram of another embodiment of a receiver of one or more of the transceivers of FIGS. 1-3 in accordance with the present invention.

FIG. 95 is a schematic block diagram of another embodiment of a receiver 390 of one or more of the transceivers of FIGS. 1-3 that includes a plurality of bandpass filters (BPF) 224, a plurality of low noise amplifiers 202, a plurality of sample and hold filter circuits 204, and a receive circuit that may include one or more of a frequency translation filter 392 and an analog to digital conversion module 210. The receiver may further include a clock generation circuit, which includes a clock generator 212, a plurality of sample and hold clock circuits 242, a filter clock circuit 394, and an analog to digital converter clock circuit 222. The clock generator 212 generates a plurality of phase shifted clock signals; each phase shifted clock signal clocks a corresponding one of the plurality of S&H clock circuits 242. As such, for a sampling period, the inbound RF signal is sampled a plurality of times (one time for each phase shifted clock). Accordingly, the inbound RF signal is oversampled, which provides options for optimizing the data recovery process.

In an example of operation of each band pass filters 224 receive the inbound RF signal from the antenna interface 254. Each of the band pass filters 224 attenuates out of band signal components and passes, substantially unattenuated, in-band signal components of the inbound RF signal. Each of the low noise amplifiers 202 amplifies the in-band signal components of the inbound RF signal to produce an amplified inbound RF signal.

Each of the sample and hold filter 204 receives the corresponding amplified inbound RF signal and samples it in accordance with a sample frequency that corresponds to the respective phase shifted clock signal. In this example, the sampling frequency is greater than or equal to two times the bandwidth of the amplified inbound RF signal. In this manner, the plurality of sample and hold filter circuits 204 generates a plurality of samples for each sampling period.

The frequency translation filter 392 (which may be a finite impulse response filter, an infinite impulse response filter, a frequency translation bandpass filter, and/or other type of discrete filter) receives the plurality of samples filters them to baseband. The plurality of samples may be provided to the filter in a sequential manner, in a serial manner, or in a combination thereof. The analog to digital converter 210 converts the baseband signal into a digital signal (e.g., an inbound symbol stream) to produce a plurality of inbound symbol streams.

Figure 96:
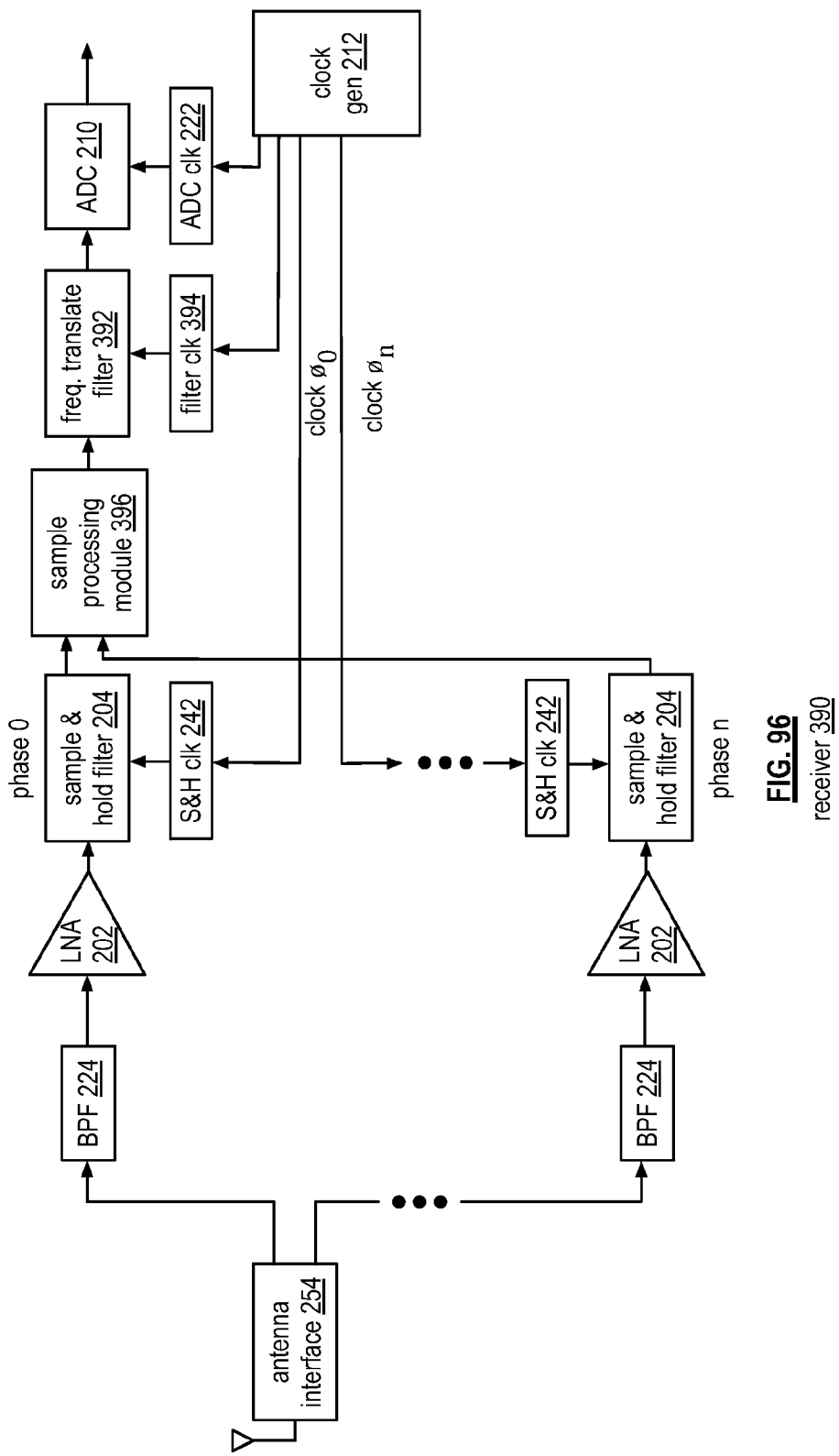
FIG. 96 is a schematic block diagram of another embodiment of a receiver of one or more of the transceivers of FIGS. 1-3 in accordance with the present invention.

FIG. 96 is a schematic block diagram of another embodiment of a receiver 390 of one or more of the transceivers of FIGS. 1-3 that includes a plurality of bandpass filters (BPF) 224, a plurality of low noise amplifiers 202, a plurality of sample and hold filter circuits 204, and a receive circuit that may include one or more of a sample processing module 396, a frequency translation filter 392, an analog to digital conversion module 210. The receiver may further include a clock generation circuit, which includes a clock generator 212, a plurality of sample and hold clock circuits 242, a filter clock circuit 394, and an analog to digital converter clock circuit 222. The clock generator 212 generates a plurality of phase shifted clock signals; each phase shifted clock signal clocks a corresponding one of the plurality of S&H clock circuits 204. As such, for a sampling period, the inbound RF signal is sampled a plurality of times (one time for each phase shifted clock). Accordingly, the inbound RF signal is oversampled, which provides options for optimizing the data recovery process.

In an example of operation of each band pass filter 224 receives the inbound RF signal from the antenna interface 254. Each of the band pass filters 224 attenuates out of band signal components and passes, substantially unattenuated, in-band signal components of the inbound RF signal. Each of the low noise amplifiers 202 amplifies the in-band signal components of the inbound RF signal to produce an amplified inbound RF signal.

Each of the sample and hold filter 204 receives the corresponding amplified inbound RF signal and samples it in accordance with a sample frequency that corresponds to the respective phase shifted clock signal. In this example, the sampling frequency is greater than or equal to two times the bandwidth of the amplified inbound RF signal. In this manner, the plurality of sample and hold filter circuits 204 generates a plurality of samples for each sampling period.

The sample processing module 396 receives, for a given sampling period, the plurality of samples and processes them to produce a processed sample. The processing may be to average the sample values, perform a root mean square on the sample values, to perform a weighted average on the sample values, or some other mathematical function on the sample values to produce a representative sample value. The sample processing module 396 provides the processed samples to the frequency translation filter.

The frequency translation filter 392 (which may be a finite impulse response filter, an infinite impulse response filter, a frequency translation bandpass filter, and/or other type of discrete filter) filters the processed samples to produce an analog baseband signal. The analog to digital converter 210 converts the baseband signal into a digital signal (e.g., an inbound symbol stream) to produce a plurality of inbound symbol streams.

Figure 97:
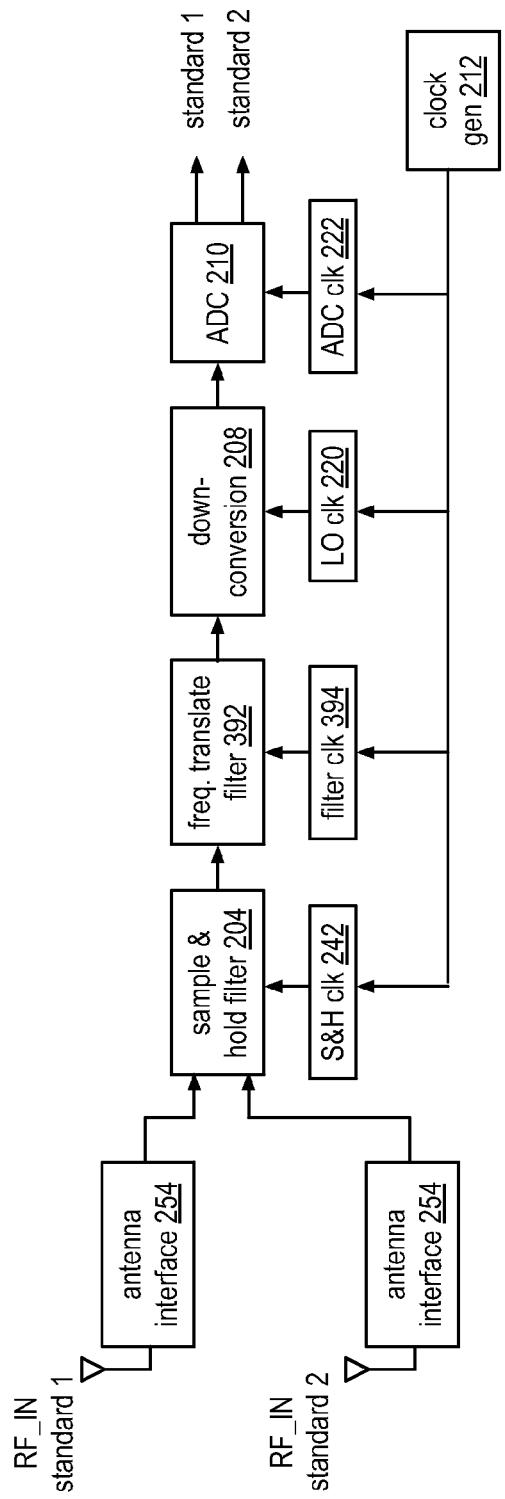
FIG. 97 is a schematic block diagram of another embodiment of a receiver of one or more of the transceivers of FIGS. 1-3 in accordance with the present invention.

FIG. 97 is a schematic block diagram of another embodiment of a receiver 398 of one or more of the transceivers of FIGS. 1-3 that is coupled to a plurality of antenna interfaces 254 (two shown) for multiple communications (e.g., different standards). The receiver 398 includes a sample and hold filter circuit 204, a discrete time filter 392, a down conversion module 208, an analog to digital conversion module (ADC) 210, and a clock circuit module. The clock circuit module includes a clock generator 212, a sample and hold (S&H) clock circuit 242, a filter clock circuit 394, a local oscillation (LO) clock circuit 220, and an analog to digital converter (ADC) clock circuit 222. Note that the receiver may further include a plurality of band pass filters (BPF) and/or a plurality of low noise amplifiers (LNA).

In an example of operation, if the receiver 398 includes band pass filters, they each receive an inbound RF signal from a corresponding one of the antenna interfaces 254. For example, a first BPF receives a first inbound RF signal that is in accordance with a first wireless communication standard and a second BPF receives a second inbound RF signal that is in accordance with a second wireless communication standard. As a further example, the first inbound RF signal may be in a first frequency band and the second inbound RF signal may be in a second frequency band. Each of the band pass filters attenuates out of band signal components and passes, substantially unattenuated, in-band signal components of the respective inbound RF signal. The low noise amplifier amplifies the in-band signal components of the inbound RF signal to produce an amplified inbound RF signal.

The sample and hold filter 204 receives the amplified inbound RF signals and samples them in accordance with a sample clock signal and a hold clock signal. With reference to FIG. 98, the sample and hold circuit 204 receives the amplified inbound RF signals (shown in the frequency domain) and samples them at a sampling frequency (fs). The sampling frequency may be equal to or greater than 2*RF2 (e.g., the higher carrier frequency of the two inbound RF signals); may be equal to or greater than 2*BW1&2 (e.g., a frequency region that spans both inbound RF signals); or the sampling frequency may be toggled between 2*BW1 and 2*BW2.

In this example, the sampling frequency is greater than or equal to two times RF2 (e.g., the higher carrier frequency of the two inbound RF signals). At this sampling rate, the sample and hold circuit 204 generates an output 404 as shown in FIG. 99. As shown, the S&H output includes a pair of pulses (one for the first inbound signal and the other for the second inbound signal) at the sampling frequency and multiples thereof. The bold pulses at RF1 and RF2 represent the original inbound RF signal 400.

Returning to the discussion of FIG. 97, the discrete time filter 392 (which may be one or more finite impulse response filters, one or more infinite impulse response filters, and/or one or more frequency translation bandpass filters) receives the output of the sample and hold filter circuit 204 and filters it. Depending on the filtering response of the discrete time filter 392, the discrete time filter 392 will output, in the frequency domain, a pair of pulses of the sample and hold output 400 at a particular frequency pair. For example and as shown in FIG. 100, if the filtering response 402 of the discrete time filter 392 corresponds to a bandpass filters centered at RF1 and RF2, the discrete time filter 392 will output the pulses at RF1 and RF2 and attenuate the pulses at the other frequencies. As another example, if the filter response of discrete time filter 392 corresponds to a bandpass filter centered at a pair of intermediate frequencies (e.g., n*fs), the discrete time filter 392 will output the pulses at the intermediate frequencies and attenuate the pulses at the other frequencies.

The down conversion module 208 may be implemented using one or more analog down conversion circuits (e.g., a mixer, a local oscillation, and one or more pass filters) and/or one or more discrete time digital down conversion circuits (e.g., a sample and hold circuit and a discrete time filter). Regardless of the implementation, the down conversion module 208 converts the output of the discrete time filter 392 to two baseband signals (e.g., two analog symbol streams). The analog to digital conversion module 210 (which includes one or more analog to digital converters) converts the baseband signals into digital signals (e.g., a first inbound symbol stream and a second inbound symbol stream), each of which may be process as previously described with reference to FIGS. 1-3.

Figure 101:
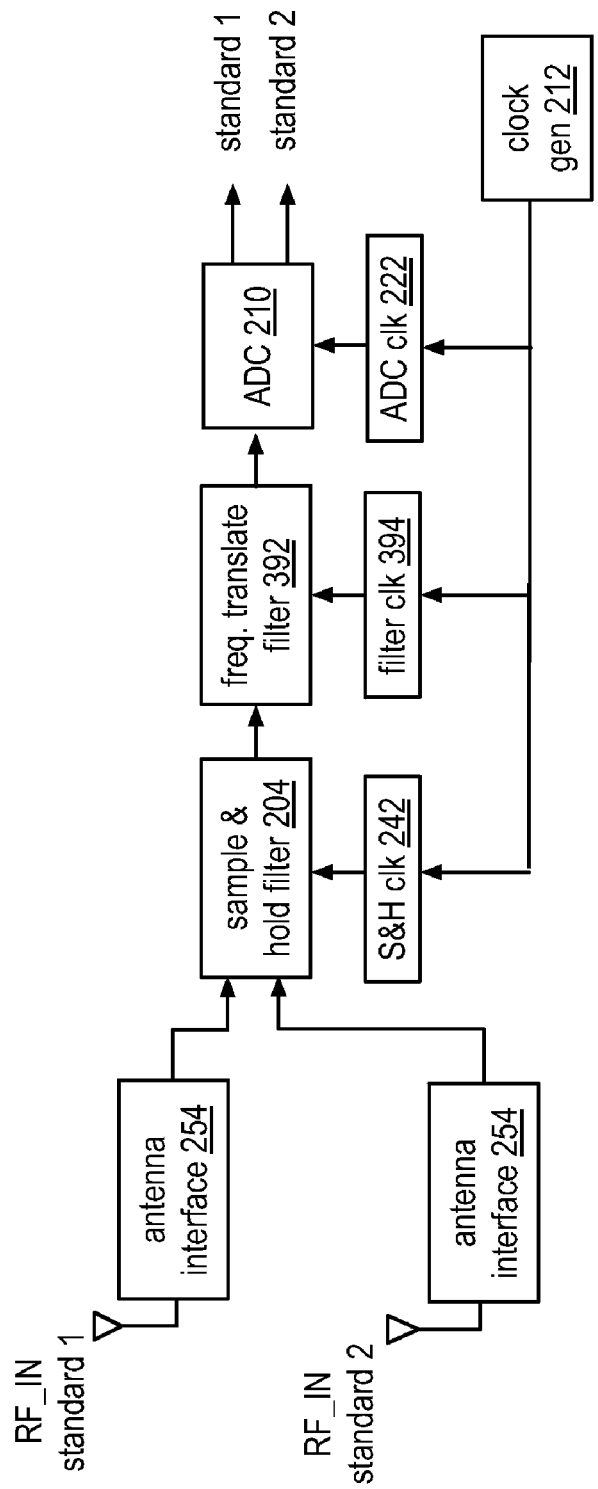
FIG. 101 is a schematic block diagram of another embodiment of a receiver of one or more of the transceivers of FIGS. 1-3 in accordance with the present invention.

FIG. 101 is a schematic block diagram of another embodiment of a receiver 398 of one or more of the transceivers of FIGS. 1-3 that is coupled to a plurality of antenna interfaces 254 (two shown) for multiple communications (e.g., different standards). The receiver 398 includes a sample and hold filter circuit 204, a frequency translation filter 392, an analog to digital conversion module (ADC) 210, and a clock circuit module. The clock circuit module includes a clock generator 212, a sample and hold (S&H) clock circuit 242, a filter clock circuit 394, and an analog to digital converter (ADC) clock circuit 222. Note that the receiver 398 may further include a plurality of band pass filters (BPF) and/or a plurality of low noise amplifiers (LNA).

In an example of operation, if the receiver 398 includes band pass filters, they each receive an inbound RF signal from a corresponding one of the antenna interfaces 254. For example, a first BPF receives a first inbound RF signal that is in accordance with a first wireless communication standard and a second BPF receives a second inbound RF signal that is in accordance with a second wireless communication standard. As a further example, the first inbound RF signal may be in a first frequency band and the second inbound RF signal may be in a second frequency band. Each of the band pass filters attenuates out of band signal components and passes, substantially unattenuated, in-band signal components of the respective inbound RF signal. The low noise amplifier amplifies the in-band signal components of the inbound RF signal to produce an amplified inbound RF signal.

The sample and hold filter 204 receives the amplified inbound RF signals and samples them in accordance with a sample clock signal and a hold clock signal. With reference to FIG. 102, the sample and hold circuit 202 receives the amplified inbound RF signals (shown in the frequency domain) and samples them at a sampling frequency (fs). In this example, the sampling frequency is equal to or greater than 2*BW1&2 (e.g., a frequency region that spans both inbound RF signals), where BW1&2 is approximately equal to $n*[(RF1+RF2)/RF1*RF2]$ and n is an integer equal to or greater than 2 (as shown, n=3). At this sampling rate, the sample and hold circuit 204 generates an output 402 as shown in FIG. 103. As shown, the S&H output 402 includes a pair of pulses (one for the first inbound signal and the other for the second inbound signal) at the sampling frequency and multiples thereof. The bold pulses at RF1 and RF2 represent the original inbound RF signal.

Returning to the discussion of FIG. 101, the frequency translation filter 392 (which may be one or more finite impulse response filters, one or more infinite impulse response filters, and/or one or more frequency translation bandpass filters) receives the output of the sample and hold filter circuit 204 and filters it. Depending on the filtering response of the frequency translation filter 392, the frequency translation filter 392 will output, in the frequency domain, a pair of pulses of the sample and hold output 402 at a particular frequency pair. For example and as shown in FIG. 104, if the filtering response 404 of the frequency translation filter 392 corresponds to a bandpass filters centered at RF1 and RF2, the discrete time filter will output the pulses at RF1 and RF2 and attenuate the pulses at the other frequencies. For this example, a down conversion module (as shown in FIG. 97) would be needed to convert the RF signals to baseband signals.

As another example, if the filter response of the frequency translation filter 392 corresponds to a bandpass filter at baseband, the frequency translation filter 392 will output the pulses at the baseband and attenuate the pulses at the other frequencies. FIG. 105 illustrates an example of the output 406 of the frequency translation filter 392 to include a first baseband signal and a second baseband signal.

The analog to digital conversion module 210 (which includes one or more analog to digital converters) converts the baseband signals into digital signals (e.g., a first inbound symbol stream and a second inbound symbol stream). Each of the inbound symbol streams may be process as previously described with reference to FIGS. 1-3.

Figure 106:
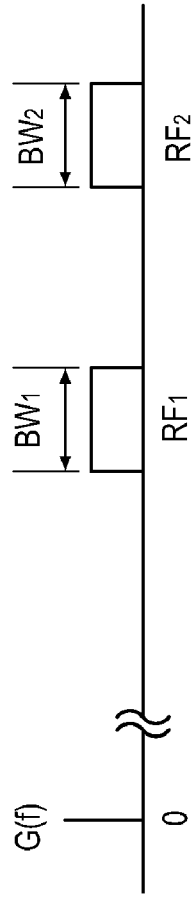
FIG. 106 is a diagram of another example of a frequency domain representation of an input of the sample and hold filter circuit of the receiver of FIG. 101 in accordance with the present invention.
Figure 107:
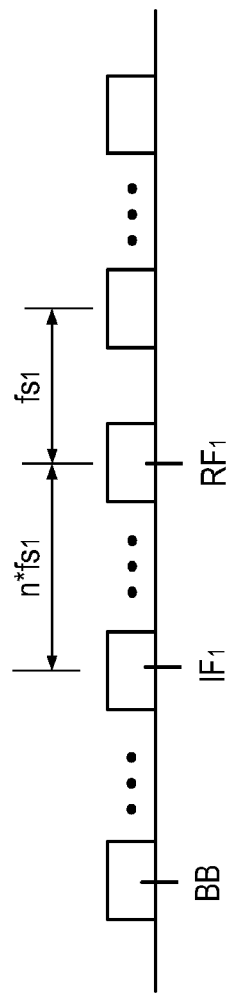
FIG. 107 is a diagram of another example of a frequency domain representation of a first output of the sample and hold filter circuit of the receiver of FIG. 101 in accordance with the present invention.
Figure 108:
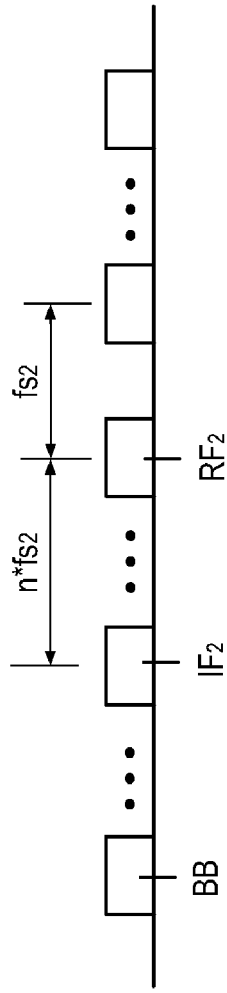
FIG. 108 is a diagram of another example of a frequency domain representation of a second output of the sample and hold filter circuit of the receiver of FIG. 101 in accordance with the present invention.

As another example of operation, the receiver of FIGS. 97 and/or 101 may use a sampling frequency that is toggled between 2*BW1 and 2*BW2. The front-end of the receiver functions as previously discussed to input two inbound RF signals to the sample and hold circuit 204. An example of the sample and hold input 408 is shown in FIG. 106. In this example, the sample and hold filter circuit 204 generates two outputs 410 and 412 as shown in FIGS. 107 and 108. For example, the sample and hold filter circuit 204 takes one or more samples of the first inbound RF signal at the sample frequency of 2*BW1, which are outputted via the first output 410. The sample and hold filter circuit 204 is then adjusted to take one or more samples of the second inbound RF signal at the sample frequency of 2*BW2, which are outputted via the second output 412. The sample and hold filter circuit 204 toggles in this manner as long as two inbound RF signals are being received or until it is reconfigured for another mode of operation.

Figure 109:
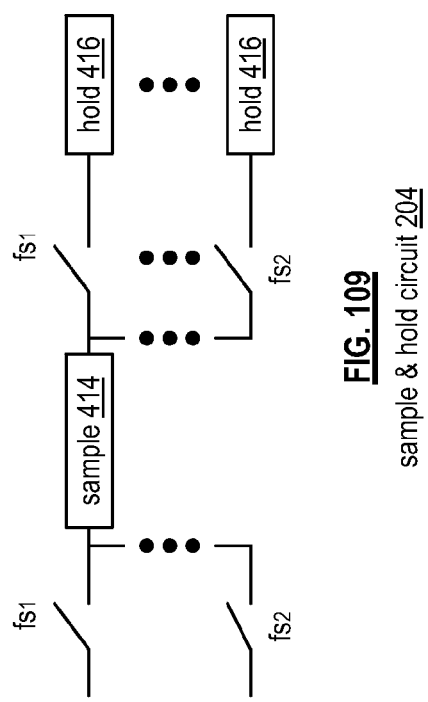
FIG. 109 is a schematic block diagram of another embodiment of a sample and hold circuit in accordance with the present invention.

FIG. 109 is a schematic block diagram of another embodiment of a sample and hold circuit 204 that includes a plurality of inputs and a plurality of outputs. The sample and hold circuit 204 includes a plurality of sample switching modules 414, a sample element, a plurality of hold switching modules 416, and a plurality of hold elements. The sample element and the hold elements may each be impedances as shown in FIGS. 19-22 and/or impedance circuits as shown in FIGS. 23-26. Each of the sample switching modules 414 and the hold switching modules 416 may include a switch and a driver.

In an example of operation, a first input signal is coupled to a first sample switching module 414 and a second input signal is coupled to a second sample switching module 414. The first sample switching module 414 is clocked in accordance with a first sampling period of a first sample frequency and the second sample switching module 414 is clocked in accordance with a second sampling period of a second sample frequency.

When the first sample switching module 414 is active, it drives the first input signal on to the sample element, which imposes the magnitude of the first input signal on the sample element for temporary storage thereon. After the first sample switching modules 414 opens and before it closes again for the next sample of the first input signal and before the second input signal is sampled, the first hold switching module 416 is closed. With the hold switching module 416 closed, it imposes the voltage on the sample element on to the first hold element. The voltage on the first hold element may be read at any time after the hold switching module 416 is closed and the voltage on the hold element is substantially stable.

When the second sample switching module 414 is active, it drives the second input signal on to the sample element, which imposes the magnitude of the second input signal on the sample element. After the second sample switching modules 414 opens and before it closes again for the next sample of the second input signal and before the first input signal is sampled, the second hold switching module 416 is closed. With the second hold switching module 416 closed, it imposes the voltage on the sample element on to the second hold element. The voltage on the second hold element may be read at any time after the second hold switching module 4116 is closed and the voltage on the hold element is substantially stable. Note that sample and hold module may have a first filter response that is based on a ratio between the first sampling clock signal and the first holding clock signal and a second filter response that is based on a ratio between the second sampling clock signal and the second holding clock signal.

Figure 109A:
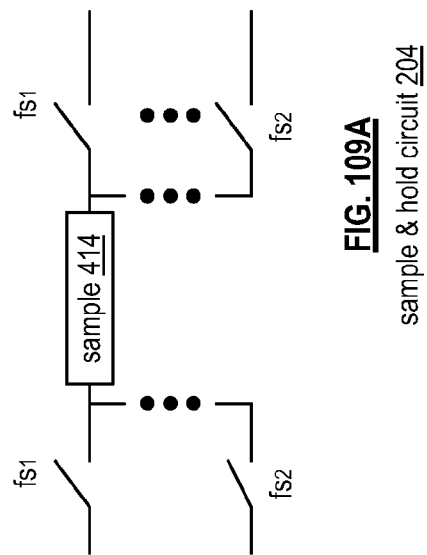
FIG. 109A is a schematic block diagram of another embodiment of a sample and hold circuit in accordance with the present invention.

FIG. 109A is a schematic block diagram of another embodiment of a sample and hold circuit 204 that includes a plurality of inputs and a plurality of outputs. The sample and hold circuit 204 includes a plurality of sample switching modules 414, a sample element, and a plurality of hold switching modules 416. The sample element may each be impedances as shown in FIGS. 19-22 and/or impedance circuits as shown in FIGS. 23-26. Each of the sample switching modules 414 and the hold switching modules 416 may include a switch and a driver.

In an example of operation, a first input signal is coupled to a first sample switching module 414 and a second input signal is coupled to a second sample switching module 414. The first sample switching module 414 is clocked in accordance with a first sampling period of a first sample frequency and the second sample switching module 414 is clocked in accordance with a second sampling period of a second sample frequency.

When the first sample switching module 414 is active, it drives the first input signal on to the sample element, which imposes the magnitude of the first input signal on the sample element. After the first sample switching modules 414 opens and before it closes again for the next sample of the first input signal and before the second input signal is sampled, the first hold switching module 416 is closed. With the hold switching module 416 closed, it outputs the voltage on the sample element.

When the second sample switching module 414 is active, it drives the second input signal on to the sample element, which imposes the magnitude of the second input signal on the sample element. After the second sample switching modules 414 opens and before it closes again for the next sample of the second input signal and before the first input signal is sampled, the second hold switching module is closed. With the second hold switching module 416 closed, it outputs the voltage on the sample element.

Figure 110:
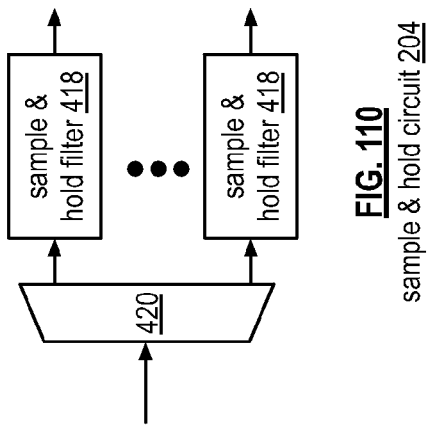
FIG. 110 is a schematic block diagram of another embodiment of a sample and hold circuit in accordance with the present invention.

FIG. 110 is a schematic block diagram of another embodiment of a sample and hold circuit 204 that includes an input and a plurality of outputs. The sample and hold circuit 204 includes a input module 420 (e.g., a multiplexer, a switching circuit, etc.) and a plurality of sample and hold filter circuits 418 (e.g., as shown in FIGS. 19-26). In an example of operation, one of the sample and hold filter circuits 204 samples a first inbound RF signal and another one of the sample and hold filter circuits 204 samples a second inbound RF signal. The input module 420 provides the correct inbound RF signal to the corresponding sample and hold filter circuit 418.

Figure 111:
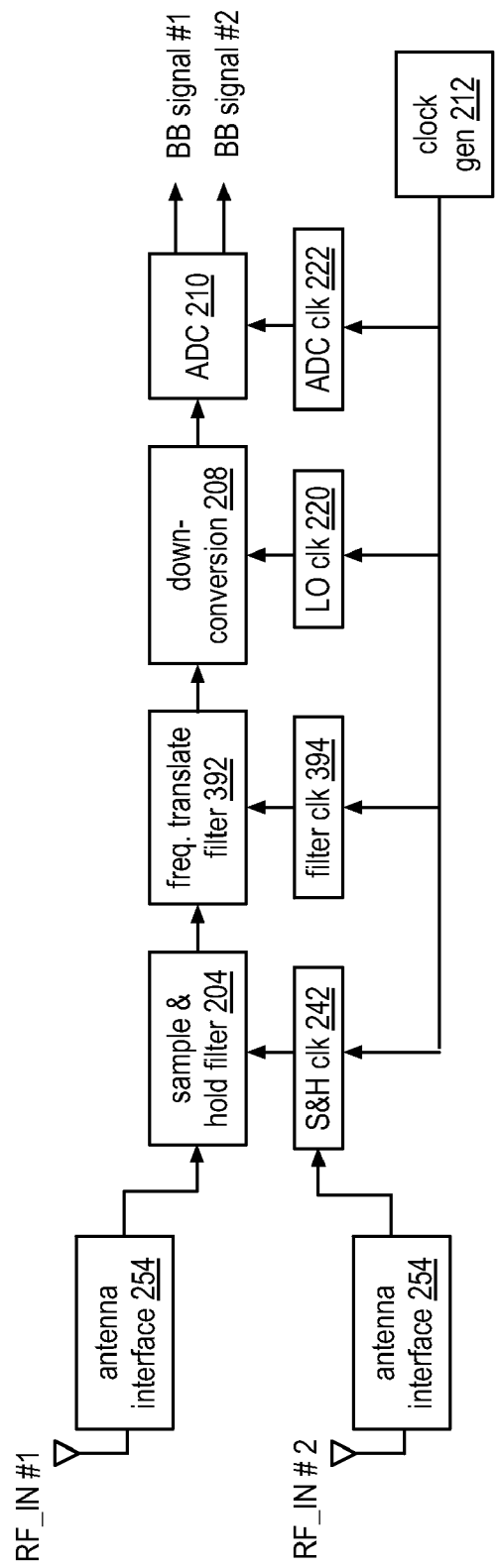
FIG. 111 is a schematic block diagram of another embodiment of a receiver of one or more of the transceivers of FIGS. 1-3 in accordance with the present invention.

FIG. 111 is a schematic block diagram of another embodiment of a receiver 422 of one or more of the transceivers of FIGS. 1-3 that is coupled to a plurality of antenna interfaces 254 (two shown) for MIMO communications. The receiver 422 includes a sample and hold filter circuit 204, a discrete time filter 392, a down conversion module 208, an analog to digital conversion module (ADC) 210, and a clock circuit module. The clock circuit module includes a clock generator 212, a sample and hold (S&H) clock circuit 242, a filter clock circuit 394, a local oscillation (LO) clock circuit 220, and an analog to digital converter (ADC) clock circuit 222. Note that the receiver 422 may further include a plurality of band pass filters (BPF) and/or a plurality of low noise amplifiers (LNA).

In an example of operation, if the receiver 422 includes band pass filters, they each receive an inbound RF signal from a corresponding one of the antenna interfaces 254. For example, a first BPF receives a first inbound RF signal of the MIMO communication and a second BPF receives a second inbound RF signal the MIMO communication, where the first and second inbound RF signals are in the same frequency band. Each of the band pass filters attenuates out of band signal components and passes, substantially unattenuated, in-band signal components of the respective inbound RF signal. The low noise amplifier amplifies the in-band signal components of the inbound RF signal to produce an amplified inbound RF signal.

Figure 112:
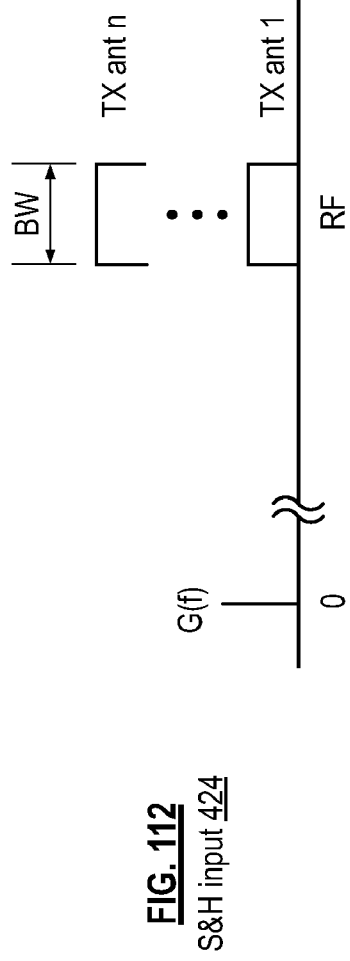
FIG. 112 is a diagram of another example of a frequency domain representation of an input of the sample and hold filter circuit of the receiver of FIG. 111 in accordance with the present invention.

The sample and hold filter 204 receives the amplified inbound RF signals and samples them in accordance with a sample clock signal and a hold clock signal. With reference to FIG. 112, the sample and hold circuit 204 receives the amplified inbound RF signals 424 (shown in the frequency domain) and samples them at a sampling frequency (fs). The sampling frequency may be equal to or greater than 2*RF or it may be toggled at 2*BW for each inbound RF signal.

Figure 113:
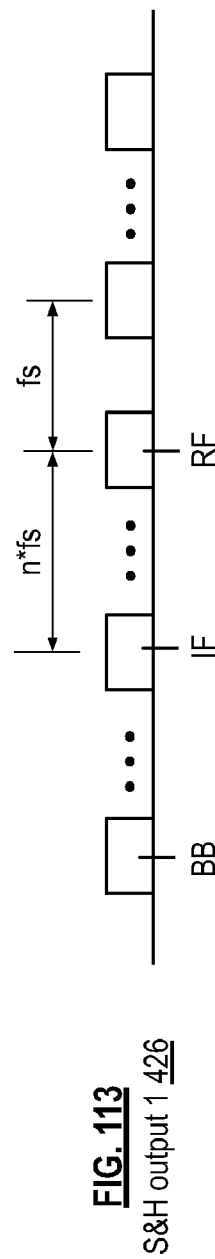
FIG. 113 is a diagram of another example of a frequency domain representation of a first output of the sample and hold filter circuit of the receiver of FIG. 111 in accordance with the present invention.
Figure 114:
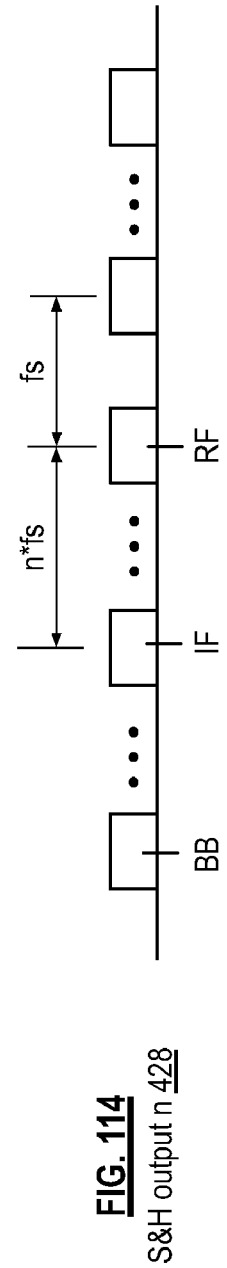
FIG. 114 is a diagram of another example of a frequency domain representation of a second output of the sample and hold filter circuit of the receiver of FIG. 111 in accordance with the present invention.

In this example, the sampling frequency is greater than or equal to two times BW and is toggled for each inbound RF signal. At this sampling rate, the sample and hold circuit 204 generates outputs 426-428 as shown in FIGS. 113 and 114. As shown, each S&H output 426-428 includes a pulse at the sampling frequency and multiples thereof. The pulse at RF represents the original inbound RF signal.

Returning to the discussion of FIG. 111, the discrete time filter 392 (which may be one or more finite impulse response filters, one or more infinite impulse response filters, and/or one or more frequency translation bandpass filters) receives the output of the sample and hold filter circuit 204 and filters it. Depending on the filtering response of the discrete time filter 392, the discrete time filter 392 will output, in the frequency domain, a pair of pulses of the sample and hold output at a particular frequency pair. For example, if the filtering response of the discrete time filter 392 corresponds to a bandpass filters centered at RF, the discrete time filter will output the pulse at RF and attenuate the pulses at the other frequencies for each inbound RF signal. As another example, if the filter response of discrete time filter 392 corresponds to a bandpass filter centered at an intermediate frequency (e.g., n*fs), the discrete time filter will output the pulse at the intermediate frequency and attenuate the pulses at the other frequencies for each inbound RF signal.

The down conversion module 208 may be implemented using one or more analog down conversion circuits 210 (e.g., a mixer, a local oscillation, and one or more pass filters) and/or one or more discrete time digital down conversion circuits 208 (e.g., a sample and hold circuit and a discrete time filter). Regardless of the implementation, the down conversion module 208 converts the output of the discrete time filter 392 to two baseband signals (e.g., two analog symbol streams). The analog to digital conversion module 210 (which includes one or more analog to digital converters) converts the baseband signals into digital signals (e.g., a first inbound symbol stream and a second inbound symbol stream), which are processed as previously discussed to retrieve inbound data.

Figure 115:
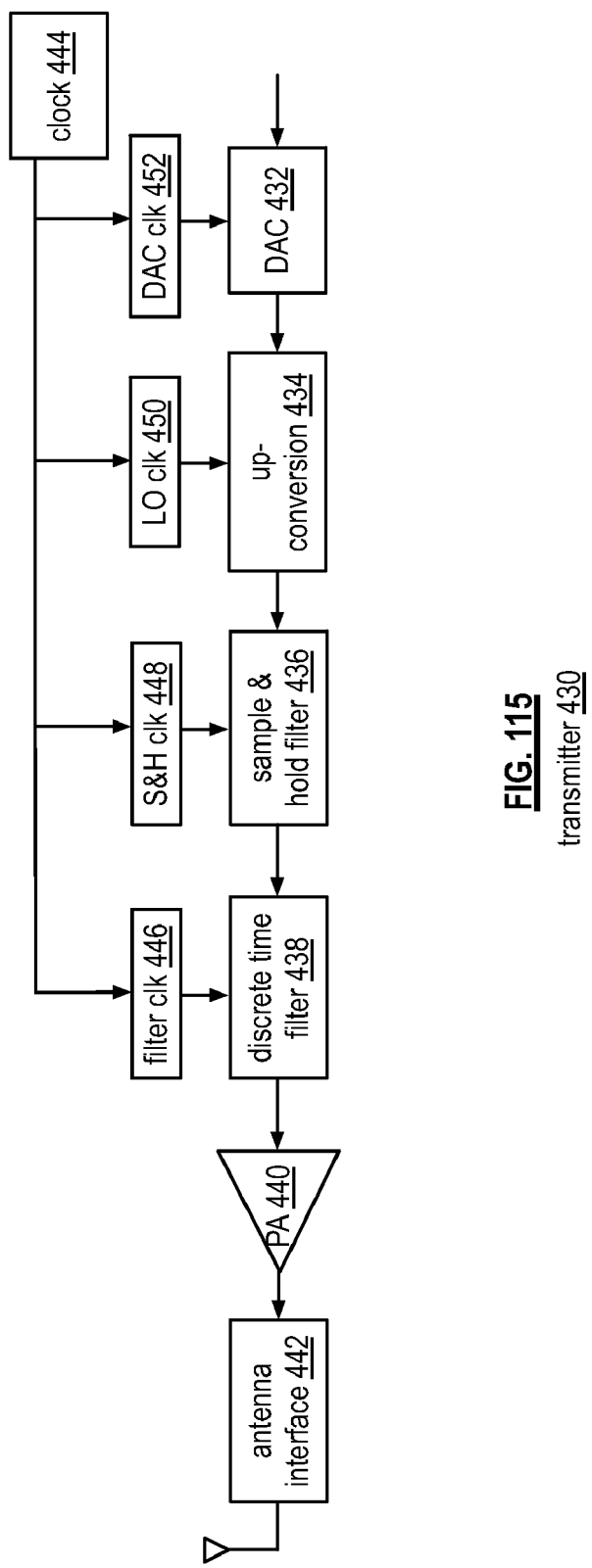
FIG. 115 is a schematic block diagram of an embodiment of a transmitter of one or more of the transceivers of FIGS. 1-3 in accordance with the present invention.

FIG. 115 is a schematic block diagram of another embodiment of a transmitter 430 of one or more of the transceivers of FIGS. 1-3 that includes a clock generation circuit 444, a conversion module (which may include a digital to analog conversion module 432 and/or an up-conversion module 434), a sample and hold filter circuit 436, a discrete time filter 438, and a power amplifier module 440. The clock circuit module includes a clock generator 444, a sample and hold (S&H) clock circuit 448, a filter clock circuit 446, a local oscillation (LO) clock circuit 450, and a digital to analog converter (DAC) clock circuit 452.

In an example of operation, the DAC 432 receives an outbound symbol stream from the baseband processing module and converts it into an analog signal. The up-conversion module 434 may be implemented using analog circuitry (e.g., a mixer, a local oscillation, and one or more pass filters) or it may be implemented as discrete time digital circuitry (e.g., a sample and hold circuit and a discrete time filter). Regardless of the implementation, the up-conversion module 434 converts the analog signal into an up-converted RF signal.

Figure 116:
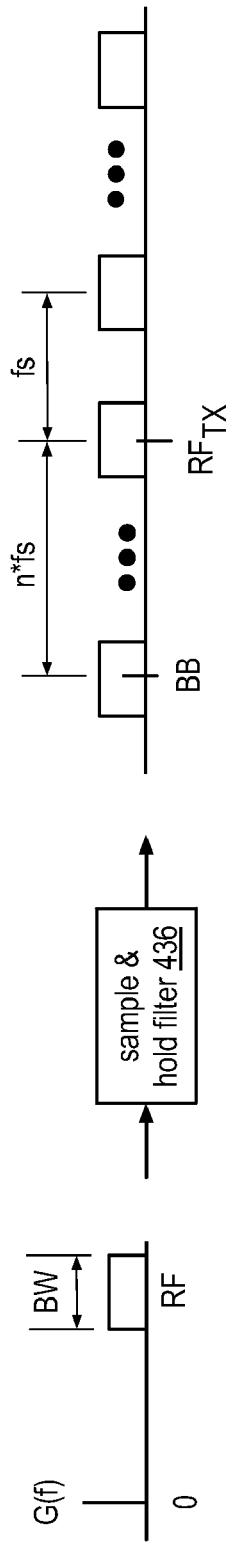
FIG. 116 is a diagram of an example of a frequency domain representation of an input and an output of the sample and hold filter circuit of the transmitter of FIG. 115 in accordance with the present invention.

The sample and hold filter circuit 436 receives the up-converted RF signal and samples it in accordance with a sample clock signal and a hold clock signal. With reference to FIG. 116, the sample and hold circuit 436 receives the up-converted RF signal (G(f), which is shown in the frequency domain) and samples it at a sampling frequency (fs). In this example, the sampling frequency is greater than or equal to two times the bandwidth of the up-converted RF signal. The sample and hold filter 436 outputs, in the frequency domain, a plurality of pulses spaced in frequency by the sampling frequency. The sample and hold output includes a pulse at RF, which corresponds to the original up-converted RF signal.

Figure 117:
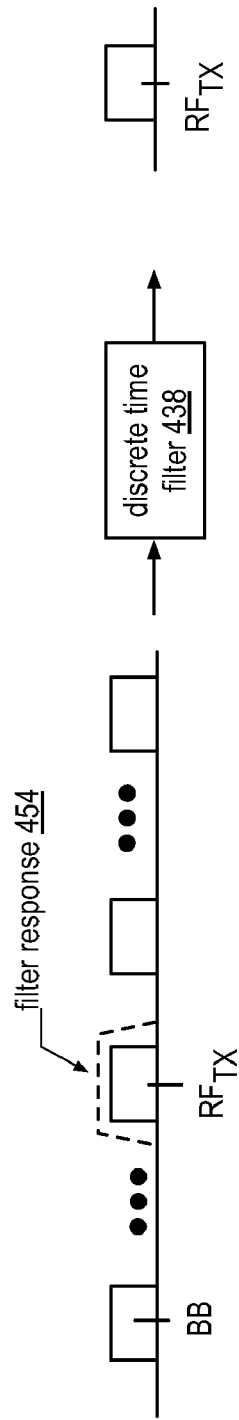
FIG. 117 is a diagram of an example of a frequency domain representation of an input and an output of a discrete time filter of the transmitter of FIG. 116 in accordance with the present invention.

Returning to the discussion of FIG. 115, the discrete time filter 438 (which may be a finite impulse response filter, an infinite impulse response filter, a frequency translation bandpass filter, and/or other type of discrete filter) receives the output of the sample and hold filter circuit 436 and filters it at RF. For example and as shown in FIG. 117, the filtering response 454 of the discrete time filter 438 corresponds to a bandpass filter centered at RF such that it outputs the pulse at RF and attenuates the pulses at the other frequencies to produce an outbound RF signal.

The power amplifier 440, which includes one or more power amplifiers coupled in series and/or in parallel, outputs the outbound RF signal(s) to the antenna interface 442. Note that parameters (e.g., gain, linearity, bandwidth, efficiency, noise, output dynamic range, slew rate, rise rate, settling time, overshoot, stability factor, etc.) of the PA 440 may be adjusted based on control signals received from the baseband processing module. For instance, as transmission conditions change (e.g., channel response changes, distance between TX unit and RX unit changes, antenna properties change, etc.), the baseband processing module monitors the transmission condition changes and adjusts the properties of the PA 440 to optimize performance.

Figure 118:
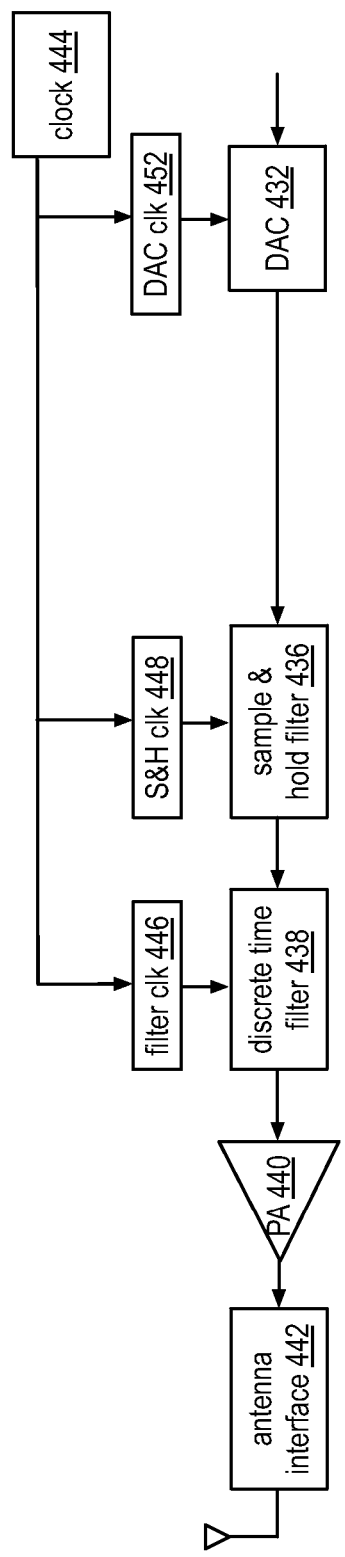
FIG. 118 is a schematic block diagram of another embodiment of a transmitter of one or more of the transceivers of FIGS. 1-3 in accordance with the present invention.

FIG. 118 is a schematic block diagram of another embodiment of a transmitter of one or more of the transceivers of FIGS. 1-3 that includes a clock generation circuit 444, a digital to analog conversion module 432, a sample and hold filter circuit 436, a discrete time filter 438, and a power amplifier module 440. The clock circuit module includes a clock generator 444, a sample and hold (S&H) clock circuit 448, a filter clock circuit 446, and a digital to analog converter (DAC) clock circuit 452.

Figure 119:
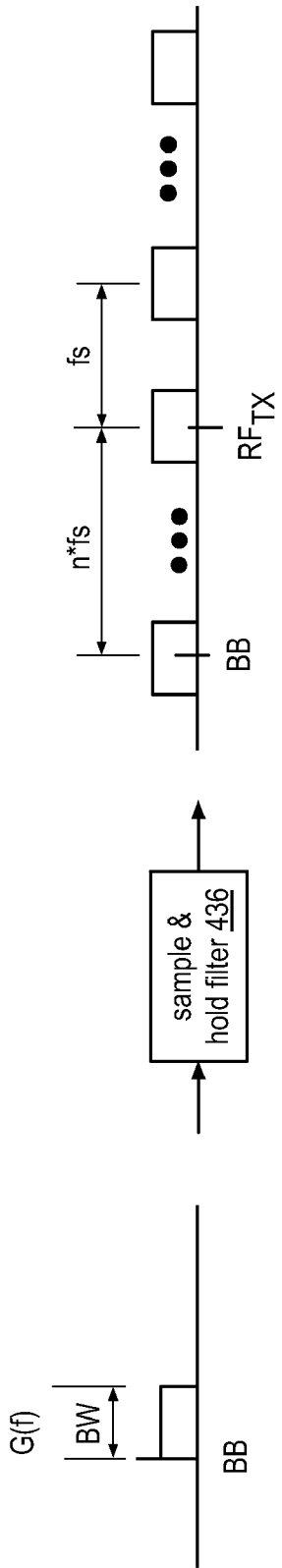
FIG. 119 is a diagram of an example of a frequency domain representation of an input and an output of the sample and hold filter circuit of the transmitter of FIG. 118 in accordance with the present invention.

In an example of operation, the DAC 432 receives an outbound symbol stream from the baseband processing module and converts it into an analog signal. The sample and hold filter circuit 448 receives the analog signal and samples it in accordance with a sample clock signal and a hold clock signal. With reference to FIG. 119, the sample and hold circuit 436 receives the baseband analog signal G(f), which is shown in the frequency domain and samples it at a sampling frequency (fs). In this example, the sampling frequency is greater than or equal to two times the bandwidth of the baseband signal and is an integer fraction of the desired RF (e.g., fs=RF/n, where n is an integer that is equal to or greater than 2). The sample and hold filter 436 outputs, in the frequency domain, a plurality of pulses spaced in frequency by the sampling frequency. The sample and hold output includes a pulse at baseband, which corresponds to the original baseband signal, and includes a pulse at RF.

Figure 120:
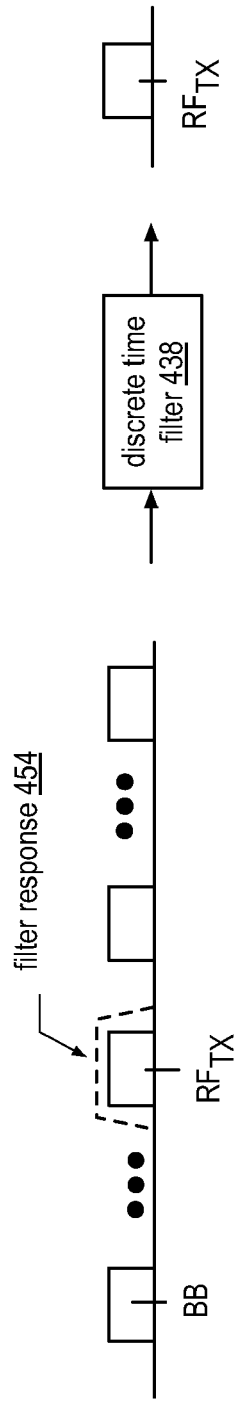
FIG. 120 is a diagram of an example of a frequency domain representation of an input and an output of a discrete time filter of the transmitter of FIG. 118 in accordance with the present invention.

Returning to the discussion of FIG. 118, the discrete time filter 438 (which may be a finite impulse response filter, an infinite impulse response filter, a frequency translation bandpass filter, and/or other type of discrete filter) receives the output of the sample and hold filter circuit 436 and filters it at RF. For example and as shown in FIG. 120, the filtering response of the discrete time filter 438 corresponds to a bandpass filter centered at RF such that it outputs the pulse at RF and attenuates the pulses at the other frequencies to produce an outbound RF signal.

The power amplifier 440, which includes one or more power amplifiers coupled in series and/or in parallel, outputs the outbound RF signal(s) to the antenna interface 442. Note that parameters (e.g., gain, linearity, bandwidth, efficiency, noise, output dynamic range, slew rate, rise rate, settling time, overshoot, stability factor, etc.) of the PA 440 may be adjusted based on control signals received from the baseband processing module.

Figure 121:
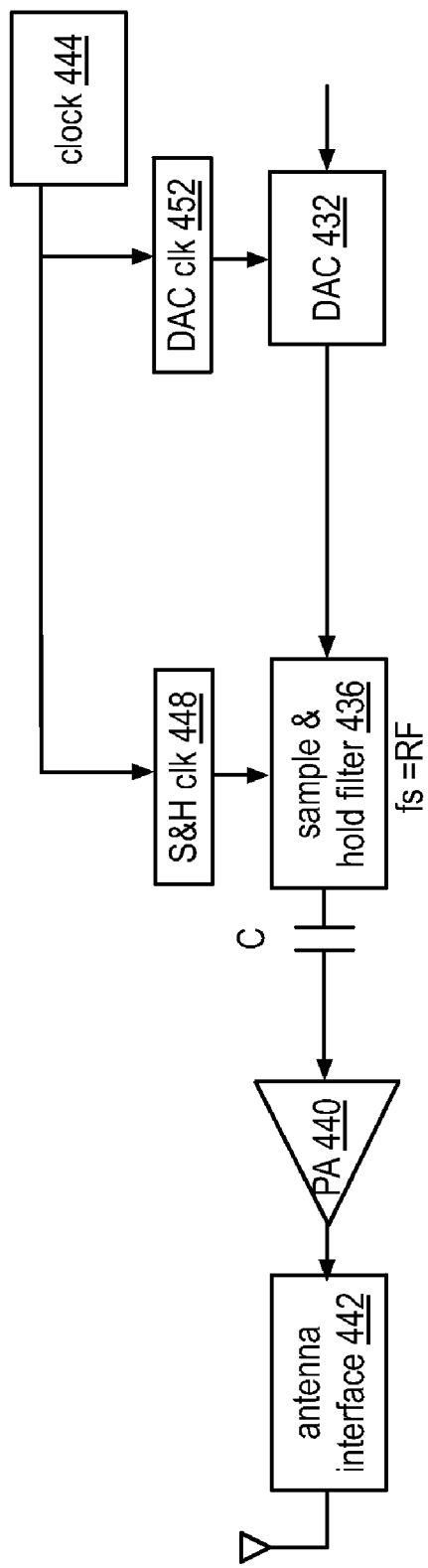
FIG. 121 is a schematic block diagram of another embodiment of a transmitter of one or more of the transceivers of FIGS. 1-3 in accordance with the present invention.

FIG. 121 is a schematic block diagram of another embodiment of a transmitter of one or more of the transceivers of FIGS. 1-3 that includes a clock generation circuit 444, a digital to analog conversion module 432, a sample and hold filter circuit 436, an AC coupling capacitor (C), and a power amplifier module 440. The clock circuit module includes a clock generator 444, a sample and hold (S&H) clock circuit 448, and a digital to analog converter (DAC) clock circuit 452.

Figure 122:
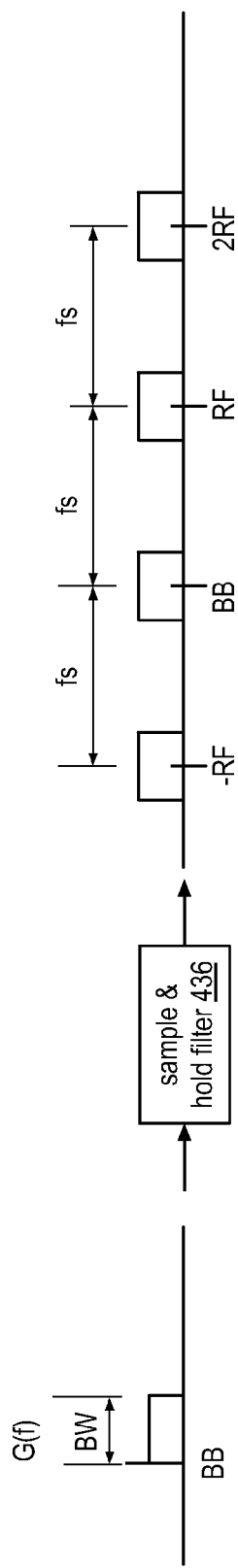
FIG. 122 is a diagram of an example of a frequency domain representation of an input and an output of the sample and hold filter circuit of the transmitter of FIG. 121 in accordance with the present invention.

In an example of operation, the DAC 432 receives an outbound symbol stream from the baseband processing module and converts it into an analog signal. The sample and hold filter circuit 436 receives the analog signal and samples it in accordance with a sample clock signal and a hold clock signal. With reference to FIG. 122, the sample and hold circuit 436 receives the baseband analog signal (G(f), which is shown in the frequency domain) and samples it at a sampling frequency (fs). In this example, the sampling frequency is equal to desired RF (e.g., fs=RF). The sample and hold filter 436 outputs, in the frequency domain, a plurality of pulses spaced in frequency by the sampling frequency. The sample and hold output includes a pulse at baseband, which corresponds to the original baseband signal, and includes a pulse at RF.

Figure 123:
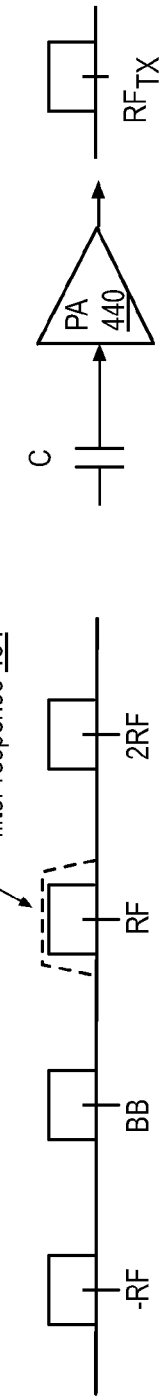
FIG. 123 is a diagram of an example of a frequency domain representation of an input and an output of the transmitter of FIG. 121 in accordance with the present invention.

Returning to the discussion of FIG. 121, the AC coupling capacitor blocks the baseband pulse and passes the other pulses, including the pulse at RF. The power amplifier 440, which includes one or more power amplifiers coupled in series and/or in parallel, has a bandwidth that is substantially less than 2*RF. As such, as the PA 440 outputs the outbound RF signal (e.g., the pulse at RF) to the antenna interface 442, it attenuates the pulses at n*RF as shown in FIG. 123. Note that parameters (e.g., gain, linearity, bandwidth, efficiency, noise, output dynamic range, slew rate, rise rate, settling time, overshoot, stability factor, etc.) of the PA 440 may be adjusted based on control signals received from the baseband processing module.

Figure 124:
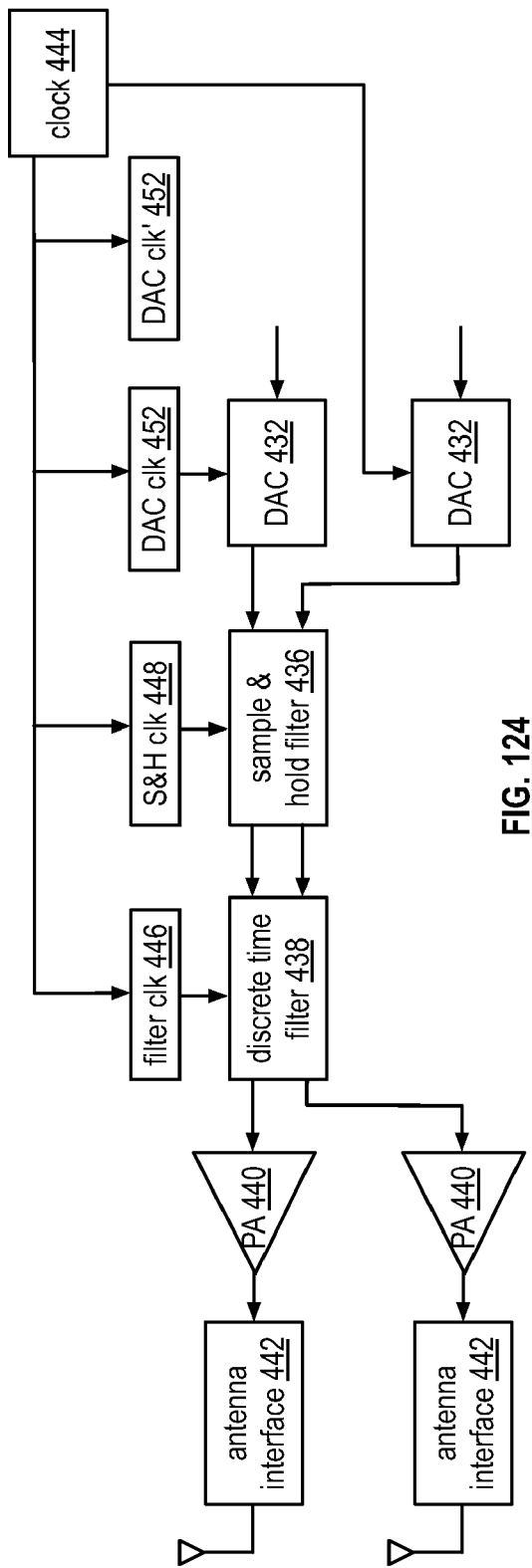
FIG. 124 is a schematic block diagram of another embodiment of a transmitter of one or more of the transceivers of FIGS. 1-3 in accordance with the present invention.

FIG. 124 is a schematic block diagram of an embodiment of a multiple output transmitter of one or more of the transceivers of FIGS. 1-3 that includes a clock generation circuit 444, a plurality of digital to analog conversion modules (two shown) 442, a sample and hold filter circuit 436, a discrete time filter 438, and a plurality of power amplifier modules 440. The clock circuit module includes a clock generator 444, a sample and hold (S&H) clock circuit 448, a filter clock circuit 446, a local oscillation (LO) clock circuit, and a plurality of digital to analog converter (DAC) clock circuits 452.

Figure 125:
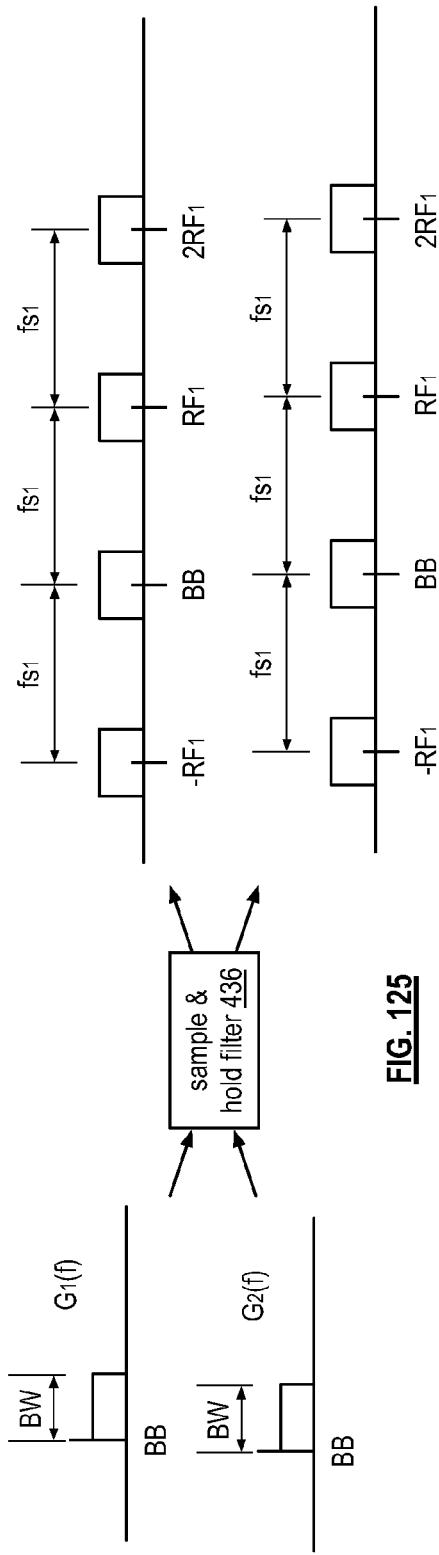
FIG. 125 is a diagram of an example of a frequency domain representation of an input and an output of the sample and hold filter circuit of the transmitter of FIG. 124 in accordance with the present invention.

In an example of MIMO operation, each of the DACs 432 receives an outbound symbol stream from the baseband processing module and converts it into an analog baseband signal. The sample and hold filter circuit 436 receives the analog baseband signals from the DACs 432 and samples them in accordance with a sampling frequency. With reference to FIG. 125, the sample and hold circuit 436 receives the analog baseband signals (G1(f) and G2(f)) and samples each of them at a sampling frequency (fs). In this example, the sampling frequency is at the desired RF. Alternatively, the sampling frequency may be 2*bandwidth of the outbound signals. The sample and hold filter 436 outputs, in the frequency domain for each analog baseband signal, a plurality of pulses spaced in frequency by the sampling frequency. The sample and hold output includes a pulse at RF, which corresponds to the original up-converted RF signal.

Figure 126:
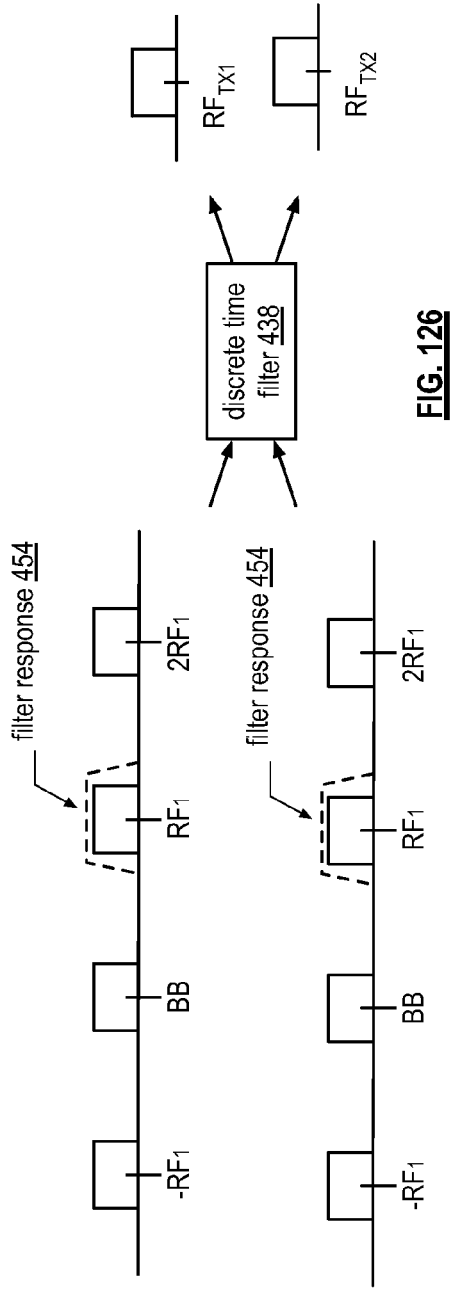
FIG. 126 is a diagram of an example of a frequency domain representation of an input and an output of a discrete time filter of the transmitter of FIG. 124 in accordance with the present invention.

Returning to the discussion of FIG. 124, the discrete time filter 438 (which may be one or more finite impulse response filters, one or more infinite impulse response filters, and/or one or more frequency translation bandpass filter) receives the first and second outputs of the sample and hold filter circuit 436 and filters them at RF. For example and as shown in FIG. 126, the filtering response 454 of the discrete time filter 438 corresponds to a bandpass filter centered at RF such that it outputs the pulse at RF and attenuates the pulses at the other frequencies for each signal to produce a first outbound RF signal and second outbound RF signal.

Each of the power amplifiers 440, which includes one or more power amplifiers coupled in series and/or in parallel, outputs a corresponding one of the outbound RF signals to a respective antenna interface 442. Note that parameters (e.g., gain, linearity, bandwidth, efficiency, noise, output dynamic range, slew rate, rise rate, settling time, overshoot, stability factor, etc.) of the PA 440 may be adjusted based on control signals received from the baseband processing module.

In an example of multiple frequency band operation, each of the DACs 432 receives an outbound symbol stream from the baseband processing module and converts it into an analog baseband signal. The sample and hold filter circuit 436 receives the analog baseband signals from the DACs and samples them in accordance with a sampling frequency. With reference to FIG. 127, the sample and hold circuit 448 receives the analog baseband signals (G1(f) and G2(f)) and samples each of them at a first sampling frequency (fs1) and a second sampling frequency (fs2), respectively. In this example, the first sampling frequency is at the first desired RF1 and the second sampling frequency is at the second desired RF2. Alternatively, the sampling frequency may be a function of a bandwidth that spans the bandwidth of both outbound signals. The sample and hold filter 436 outputs, in the frequency domain for each analog baseband signal, a plurality of pulses spaced in frequency by the respective sampling frequency. For each signal, the sample and hold output includes a pulse at RF (e.g., RF1 or RF2), which corresponds to the original up-converted RF signal.

Returning to the discussion of FIG. 124, the discrete time filter 438 (which may be one or more finite impulse response filters, one or more infinite impulse response filters, and/or one or more frequency translation bandpass filter) receives the first and second outputs of the sample and hold filter circuit 436 and filters them at RF. For example and as shown in FIG. 128, the filtering response 454 of the discrete time filter 438 corresponds to a bandpass filter centered at RF1 and another centered at RF2 such that it outputs the pulse at RF1 and attenuates the pulses at the other frequencies for the first signal to produce a first outbound RF signal and outputs the pulse at RF2 and attenuates the pulses at the other frequencies for the second signal to produce a second outbound RF signal.

Each of the power amplifiers 440, which includes one or more power amplifiers coupled in series and/or in parallel, outputs a corresponding one of the outbound RF signals to a respective antenna interface 442. Note that parameters (e.g., gain, linearity, bandwidth, efficiency, noise, output dynamic range, slew rate, rise rate, settling time, overshoot, stability factor, etc.) of the PA 440 may be adjusted based on control signals received from the baseband processing module.

Figure 129:
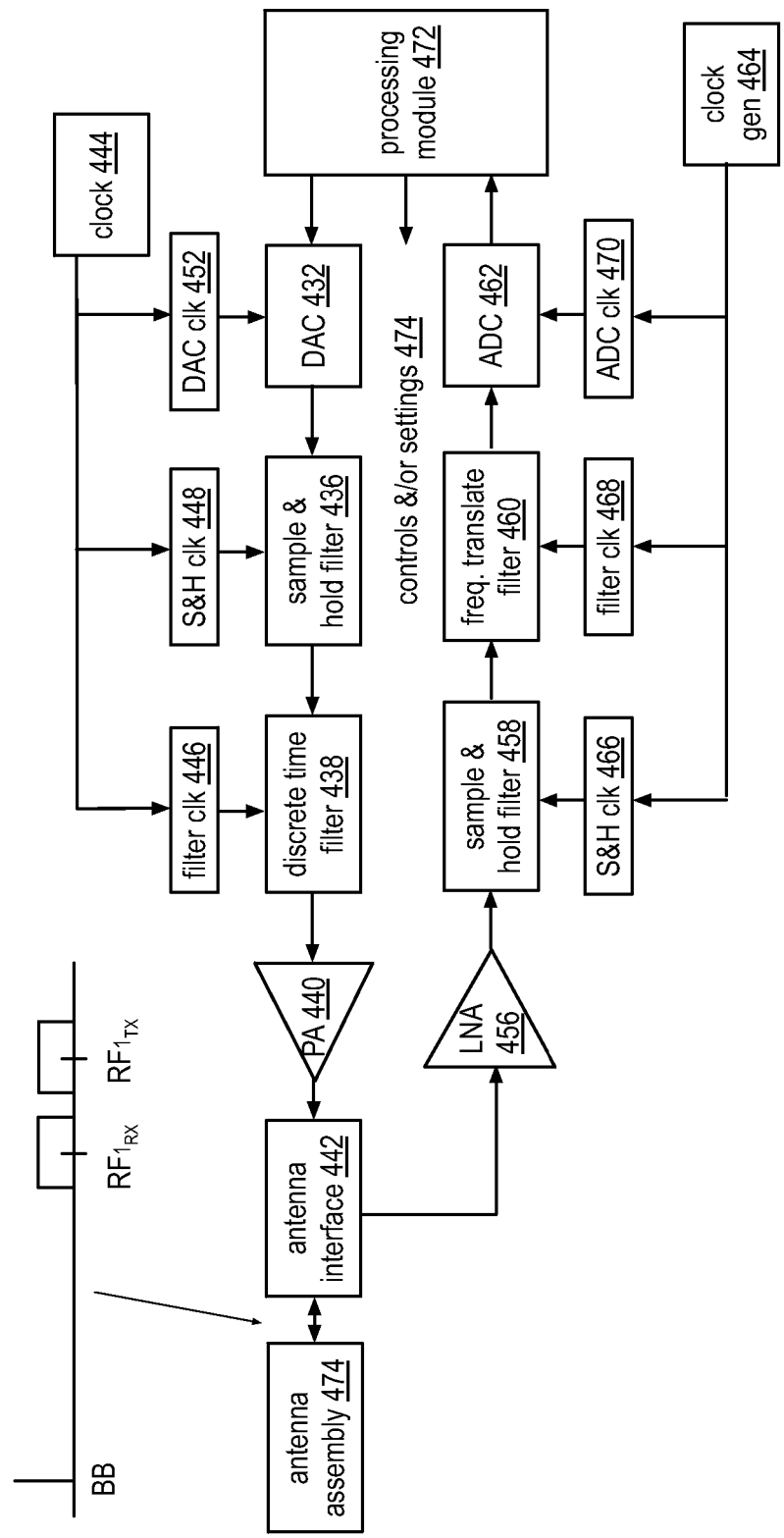
FIG. 129 is a schematic block diagram of another embodiment of a transceiver in accordance with the present invention.

FIG. 129 is a schematic block diagram of another embodiment of a transceiver that includes a receiver section and a transmitter section. The receiver section includes a band pass filter (BPF), a low noise amplifier (LNA) 456, a sample and hold filter circuit 458, a discrete time filter 460, an analog to digital converter (ADC) 462, and a receiver clock circuit module. The receiver clock circuit module includes a clock generator 464, a sample and hold (S&H) clock circuit 466, a filter clock circuit 468, and an analog to digital converter (ADC) clock circuit 470.

The transmitter section includes a transmit clock generation circuit 444, a digital to analog conversion module 432, a sample and hold filter circuit 436, a discrete time filter 438, and a power amplifier module 440. The transmit clock circuit module includes a clock generator 444, a sample and hold (S&H) clock circuit 448, a filter clock circuit 446, and a digital to analog converter (DAC) clock circuit 452. Note that any other embodiment of the receiver section may be incorporated into the transceiver with any other embodiment of the transmitter section.

In an example of operation, the processing module 472 generates control signals and/or settings 474 for the transmitter section and/or the receiver section to improve transceiver performance, reduce transmitter interference on the receiver side, etc. For example, the bandpass filtering of the S&H circuits 436 and 458 may be adjusted to place nulls at interfering frequencies. As another example, the filter response of the frequency translation filter 460 (or discrete time filter 438) may be tuned to provide a sharper attenuation, a different center frequency, etc. As yet another example, the clocking of the DAC 432 and ADC 462 may be coordinated to reduce interference therebetween, noise injections, etc.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may have an associated memory and/or an integrated memory element, which may be a single memory device, a plurality of memory devices, and/or embedded circuitry of the processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a functional block that is implemented via hardware to perform one or module functions such as the processing of one or more input signals to produce one or more output signals. The hardware that implements the module may itself operate in conjunction software, and/or firmware. As used herein, a module may contain one or more sub-modules that themselves are modules.

While particular combinations of various functions and features of the present invention have been expressly described herein, other combinations of these features and functions are likewise possible. The present invention is not limited by the particular examples disclosed herein and expressly incorporates these other combinations.

What is claimed is:
1. A receiver comprises:
a bandpass filter module configured to filter an inbound wireless signal to produce a filtered inbound wireless signal having a bandwidth, the bandpass filter module including a plurality of baseband impedance units that provide a baseband filter response and a switching network to operate at a rate corresponding to a frequency of the inbound wireless signal to frequency translate the baseband filter response to a wireless frequency bandpass filter response;

a sample and hold module configured to sample and hold, at a rate corresponding to a multiple of the bandwidth of the filtered inbound wireless signal, the filtered inbound wireless signal to produce a frequency domain sample pulse train;

a discrete time filter module configured to filter the frequency domain sample pulse train to produce a filtered sample pulse; and a conversion module configured to convert the filtered sample pulse into an inbound baseband signal.

2. The receiver of claim 1 wherein:

the discrete time filter module includes an intermediate frequency (IF) bandpass filter response configured to filter the frequency domain sample pulse train to produce an IF pulse as the filtered sample pulse; and the conversion module includes:
 an IF to baseband conversion module configured to convert the IF pulse to a baseband digital signal; and
 an analog to digital conversion module configured to convert the baseband digital signal into the inbound baseband signal.

3. The receiver of claim 1 wherein:

the discrete time filter module includes a baseband bandpass filter response configured to filter the frequency domain sample pulse train to produce a baseband pulse as the filtered sample pulse; and the conversion module includes:
 an analog to digital conversion module configured to convert the baseband pulse into the inbound baseband signal.

4. The receiver of claim 1 further comprises:

a clock generation circuit including:
 a clock generation module configured to generate a system clock signal;
 a sample and hold clock module configured to generate, from the system clock signal, a sample and hold clock signal for the sample and hold module at the rate corresponding to the multiple of the bandwidth of the filtered inbound wireless signal;
 a discrete time filter clock module configured to generate a filter clock from the system clock signal for the discrete time filter module; and
 a conversion clock module configured to generate a conversion clock signal from the system clock signal for the conversion module.

5. The receiver of claim 1 further comprises:

a low noise amplifier (LNA) module configured to amplify the filtered inbound wireless signal prior the sampling and holding by the sample and hold module.

6. A receiver comprises:

a bandpass filter module configured to filter an inbound wireless signal to produce a filtered inbound wireless signal having a bandwidth, the bandpass filter module including a plurality of baseband impedance units that provide a baseband filter response and a switching network to operate at a rate corresponding to a frequency of the inbound wireless signal to frequency translate the baseband filter response to a wireless frequency bandpass filter response;

a sample and hold module configured to sample and hold, at a rate corresponding to a multiple of the bandwidth of the filtered inbound wireless signal, the filtered inbound wireless signal to produce a frequency domain sample pulse train;

a discrete time filter module having a baseband bandpass filter response configured to filter the frequency domain sample pulse train to produce a filtered baseband sample pulse; and an analog to digital conversion module configured to convert the filtered baseband sample pulse into an inbound baseband signal.

7. The receiver of claim 6 further comprises:

a clock generation circuit including:
 a clock generation module configured to generate a system clock signal;
 a sample and hold clock module configured to generate, from the system clock signal, a sample and hold clock signal for the sample and hold module at the rate corresponding to the multiple of the bandwidth of the filtered inbound wireless signal;
 a discrete time filter clock module configured to generate a filter clock from the system clock signal for the discrete time filter module; and
 a conversion clock module configured to generate a conversion clock signal from the system clock signal for the analog to digital conversion module.

8. The receiver of claim 6 further comprises:

a low noise amplifier (LNA) module configured to amplify the filtered inbound wireless signal prior the sampling and holding by the sample and hold module.

9. The receiver of claim 6, wherein the bandpass filter module includes:

a buffer module configured to buffer the inbound wireless signal to produce a buffered inbound wireless signal; and a frequency translation bandpass filter operable to filter the buffered inbound wireless signal to produce the filtered inbound wireless signal.

10. The receiver of claim 9, wherein the buffer module includes at least one of:

a buffer; and
an inverter.

11. A transceiver comprises:

a receiver section of the transceiver for receiving that includes:
 a bandpass filter module configured to filter an inbound wireless signal to produce a filtered inbound wireless signal having a bandwidth;
 a receive sample and hold module configured to sample and hold, at a rate corresponding to a multiple of the bandwidth of the filtered inbound wireless signal, the filtered inbound wireless signal to produce a receive frequency domain sample pulse train;
 a receive discrete time filter module configured to filter the receive frequency domain sample pulse train to produce a filtered sample pulse; and
 a receive conversion module configured to convert the filtered sample pulse into an inbound baseband signal; and a transmitter section of the transceiver for transmitting that includes:
 a transmit conversion module configured to convert an outbound baseband signal into an outbound frequency domain pulse that has a bandwidth;
 a transmit sample and hold module configured to sample and hold, at a rate corresponding to a multiple of the bandwidth of the outbound frequency domain pulse, the outbound frequency domain pulse to produce a transmit frequency domain sample pulse train; and
 a transmit discrete time filter module having a wireless frequency bandpass filter response configured to filter the transmit frequency domain sample pulse train to produce an outbound wireless signal.

12. The transceiver of claim 11, wherein the bandpass filter module includes:
a plurality of baseband impedance units that provides a baseband filter response; and
a switching network operable at a rate corresponding to a frequency of the inbound wireless signal to frequency translate the baseband filter response to a wireless frequency bandpass filter response.

13. The transceiver of claim 11 wherein:
the receive discrete time filter module includes an intermediate frequency (IF) bandpass filter response configured to filter the receive frequency domain sample pulse train to produce an IF pulse as the filtered sample pulse; and
the receive conversion module includes:
an IF to baseband conversion module configured to convert the IF pulse to a baseband digital signal; and
an analog to digital conversion module configured to convert the baseband digital signal into the inbound baseband signal.

14. The transceiver of claim 11 wherein:
the receive discrete time filter module includes a baseband bandpass filter response configured to filter the receive frequency domain sample pulse train to produce a baseband pulse as the filtered sample pulse; and
the receive conversion module includes:
an analog to digital conversion module configured to convert the baseband pulse into the inbound baseband signal.

15. The transceiver of claim 11 further comprises:
a clock generation circuit including:
a clock generation module configured to generate a system clock signal;
a sample and hold clock module configured to generate, from the system clock signal, a receive sample and hold clock signal for the receive sample and hold module and a transmit sample and hold clock signal for the transmit sample and hold module;
a discrete time filter clock module configured to generate, from the system clock signal, a receive filter clock for the receive discrete time filter module and a transmit filter clock for the transmit discrete time filter module; and
a conversion clock module operable to generate, from the system clock signal, receive conversion clock signal for the receive conversion module and a transmit conversion clock signal for the transmit conversion module.

16. The transceiver of claim 11 further comprises:
a low noise amplifier (LNA) module configured to amplify the filtered inbound wireless signal prior the sampling and holding by the receive sample and hold module.

17. The transceiver of claim 11 further comprises an antenna interface coupled to the receiver section and the transmitter section.

18. The transceiver of claim 17 further comprises an antenna assembly coupled to the antenna interface.

* * * * *

UNITED STATES PATENT AND TRADEMARK OFFICE
CERTIFICATE OF CORRECTION

PATENT NO. : 8,325,865 B1
APPLICATION NO. : 13/240639
DATED : December 4, 2012
INVENTOR(S) : Ahmadreza Rofougaran et al.

It is certified that error appears in the above-identified patent and that said Letters Patent is hereby corrected as shown below:

In the Claims:

Col. 59, line 50, in claim 5: after "prior" insert --to--
Col. 60, line 25, in claim 8: after "prior" insert --to--
Col. 62, line 22, in claim 16: after "prior" insert --to--

Signed and Sealed this
Twenty-ninth Day of October, 2013

Teresa Stanek Rea
*Deputy Director of the United States Patent and Trademark Office*